(12) United States Patent
Sugasaki et al.

(10) Patent No.: US 7,122,293 B2
(45) Date of Patent: Oct. 17, 2006

(54) ALKALI-SOLUBLE POLYMER AND POLYMERIZABLE COMPOSITION THEREOF

(75) Inventors: Atsushi Sugasaki, Shizuoka (JP); Kazuto Kunita, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/900,309

(22) Filed: Jul. 28, 2004

(65) Prior Publication Data
US 2005/0095529 A1 May 5, 2005

(30) Foreign Application Priority Data
Jul. 29, 2003 (JP) .......................... P. 2003-202919

(51) Int. Cl.
*G03F 7/033* (2006.01)
*G03F 7/039* (2006.01)
*G03F 7/30* (2006.01)

(52) U.S. Cl. ............... 430/273.1; 430/281.1; 430/287.1; 430/302; 430/325; 430/910; 430/964

(58) Field of Classification Search ........... 430/910, 430/273.1, 281.1, 287.1, 302, 964, 325
See application file for complete search history.

(56) References Cited

U.S. PATENT DOCUMENTS

| 3,790,533 | A | * | 2/1974 | Samour ................. 428/355 AC |
| 5,861,232 | A | * | 1/1999 | Kanda et al. ............ 430/281.1 |
| 2004/0068026 | A1 | * | 4/2004 | Kunita et al. ............... 522/104 |
| 2004/0234893 | A9 | * | 11/2004 | Fujimaki ................. 430/283.1 |

FOREIGN PATENT DOCUMENTS

| EP | 1176467 | * | 1/2002 |
| JP | 54-92723 A | | 7/1979 |
| JP | 54-25957 B2 | | 8/1979 |
| JP | 54-34327 B2 | | 10/1979 |
| JP | 58-12577 B2 | | 3/1983 |
| JP | 58-134629 | * | 8/1983 |
| JP | 59-53836 A | | 3/1984 |
| JP | 59-71048 A | | 4/1984 |
| JP | 59-44615 B2 | | 10/1984 |
| JP | 2002-40652 A | | 2/2002 |

* cited by examiner

*Primary Examiner*—Richard L. Schilling
(74) *Attorney, Agent, or Firm*—Sughrue Mion, PLLC

(57) ABSTRACT

A polymer, which contains a structural unit having a carboxyl group represented by the following formula (1) at a side chain of the structural unit, wherein no deposition is formed, when the polymer is dissolved in an alkali aqueous solution having a pH of 10 or more and kept at 25° C. for 60 days:

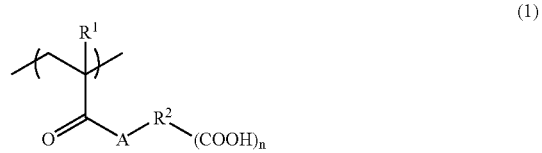

(1)

wherein $R^1$ represents a hydrogen atom or a methyl group; $R^2$ represents an (n+1)-valent organic linking group containing an ester group represented by —O(C=O)—; A represents an oxygen atom or $NR^3$—; $R^3$ represents a hydrogen atom, or an monovalent hydrocarbon group having from 1 to 10 carbon atoms; and n indicates an integer of from 1 to 5.

14 Claims, No Drawings

ALKALI-SOLUBLE POLYMER AND POLYMERIZABLE COMPOSITION THEREOF

TECHNICAL FIELD OF THE INVENTION

The present invention relates to a polymerizable composition and a novel alkali-soluble polymer to be used in the composition. Precisely, the invention relates to a polymerizable composition suitable for the image-recording layer of negative lithographic printing plate precursors, and to an alkali-soluble polymer which is well soluble in alkali aqueous solution and which is to be in the polymerizable composition.

BACKGROUND OF THE INVENTION

Heretofore, PS plates having an oleophilic photosensitive resin layer formed on a hydrophilic support have been widely used for lithographic printing plate precursors. For making printing plates from them, generally employed is a method of mask-exposing (surface-exposing) the precursor via a lith film followed by dissolving and removing the non-image area to obtain a desired printing plate. Recently, digital computing technologies have become much popularized for electronically processing image information, and accumulating and outputting the processed data by the use of computers. Various new-type image outputting systems that correspond to such digital technologies have now been put into practical use. As a result, a computer-to-plate (CTP) technique is desired that comprises scanning high-directivity light such as laser light in accordance with digitalized image information data for direct production of printing plates not via lith films, and it is now an important technical theme to obtain lithographic printing plate precursors suitable to it.

For such scanning-exposable lithographic printing plate precursors, a structure has been proposed, comprising an oleophilic photosensitive resin layer (hereinafter referred to as photosensitive layer or recording layer) that contains a photosensitive compound capable of generating an active species such as radical or Broensted acid through laser exposure, formed on a hydrophilic support, and its commercial products are now available on the market. The lithographic printing plate precursor of the type is laser-scanned on the basis of digital information to generate the active species, then the recording layer therein undergoes physical or chemical changes owing to the effect of the active species, thereby having an insoluble area, and then this is developed to give a negative lithographic printing plate. In particular, the lithographic printing plate precursor of a type having, formed on a hydrophilic support thereof, a photopolymerizable recording layer that contains a high-performance photopolymerization initiator, an addition-polymerizable ethylenic unsaturated compound and an alkali developer-soluble binder polymer, and optionally oxygen-blocking protective layer has various advantages in that its producibility is high, it may be developed in a simplified manner, its resolution is high and the ink acceptability of the printing plate from it is good, and therefore the precursor may give a printing plate having desired printing capabilities.

Heretofore, for the binder polymer to constitute the recording layer, used are organic polymers soluble in alkali developer, such as methacrylic acid copolymers, acrylic acid copolymers, itaconic acid copolymers, crotonic acid copolymers, maleic acid copolymers, partially-esterified maleic acid copolymers (for example, see JP-B 59-44615, JP-B 54-34327, JP-B 58-12577, JP-B 54-25957, JP-A 54-92723, JP-A 59-53836, JP-A 59-71048, and JP-A 2002-40652). In lithographic printing plate precursors having a recording layer that contains such an ordinary binder polymer, the solubility in alkali of the binder polymer in the non-image area tends to be insufficient. In particular, carboxyl group-having polymers of good alkali solubility are favorably used from the viewpoint of rapid developability. However, since the carboxyl group contains an ester bond in the linking group moiety to the terminal carboxyl group (—COOH) in the polymer, and since the ester bond moiety is hydrolyzed with time in developer, the polymer loses the terminal carboxyl group that is an alkali-soluble site. As a result, the binder polymer solubility in developer lowers, and the binder polymer once dissolved in developer during development therein may deposit to form development sediment, and it may impart a great deal of load to printing systems, or the deposited development sediment may adhere to printing plates to cause stains in prints. To that effect, the polymer binders have many problems.

SUMMARY OF THE INVENTION

The present invention has been made in consideration of the drawbacks in the related art mentioned above, and its object is to provide a polymerizable composition favorable for image-recording layers of negative lithographic printing plate precursors, not producing development sediment in developer during development therein, and to provide an alkali-soluble polymer to be contained in such a developable composition.

We, the present inventors have assiduously studied to attain the object as above, and, as a result, have found that, when an alkali-soluble polymer having specific physical properties is used, then the above-mentioned object can be attained. On the basis of this finding, we have completed the present invention.

Specifically, the alkali-soluble polymer of the invention is characterized in that it contains a structural unit having a carboxyl group represented by the following formula (1) at a side chain of the structural unit, wherein no deposition is formed, when the polymer is dissolved in an alkali aqueous solution having a pH of 10 or more and kept at room temperature for 60 days. The wording "no deposition is formed" as referred to herein means that, when the polymer is stored in an atmosphere at 25° C. for 60 days, no polymer deposition is seen in visual observation.

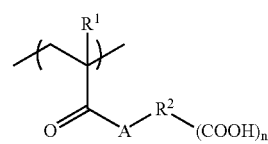

(1)

In formula (1), $R^1$ represents a hydrogen atom or a methyl group; $R^2$ represents an (n+1)-valent organic linking group containing an ester group of —O(C=O)—; A represents an oxygen atom or $NR^3$—; $R^3$ represents a hydrogen atom, or a monovalent hydrocarbon group having from 1 to 10 carbon atoms; and n indicates an integer of from 1 to 5.

One preferred embodiment of the alkali-soluble polymer contains a structural unit having a carboxyl group represented by the following formula (1) at a side chain of the structural unit; and which comprises a functional group represented by the following formula (2) at a side chain of the polymer, the functional group being capable of giving an acid group through hydrolysis with alkali:

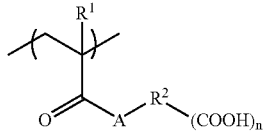
(1)

-Q-X¹ (2)

wherein in formula (1), $R^1$ represents a hydrogen atom or a methyl group; $R^2$ represents an (n+1)-valent organic linking group containing an ester group represented by —O(C=O)—; A represents an oxygen atom or $NR^3$—; $R^3$ represents a hydrogen atom, or an monovalent hydrocarbon group having from 1 to 10 carbon atoms; and n indicates an integer of from 1 to 5;

and in formula (2), Q represents a linking group that links $X^1$ to a main chain of the polymer; $X^1$ represents a protective group hydrolyzable with an alkali aqueous solution having a pH of 10 or more; and when the functional group represented by the formula (2) gives -Q-OH after hydrolysis, the -Q-OH is an acid group having a pKa of 10 or less.

More preferably, the functional group represented by the formula (2) is a functional group represented by the following formula (3):

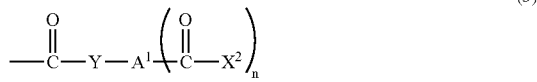
(3)

wherein $A^1$ represents an aromatic group or a cyclo group (cycloalkane, or cycloalkene group); n indicates an integer selected from 1 to 5; $X^2$ represents $—NR^1R^2$, $—SR^3$, or $—OR^4$; $R^1$ to $R^4$ each independently represents a substituent composed of at least one or more atoms selected from a group consisting of a hydrogen atom, a carbon atom, an oxygen atom, a nitrogen atom, a sulfur atom and a halogen atom; Y represents a single bond, —O—, or $—NR^5—$; $R^5$ represents a hydrogen atom or a hydrocarbon atom.

The invention also provides an alkali-soluble polymer, which contains a structural unit having a carboxyl group represented by the following formula (1) at a side chain of the structural unit, and which comprises an acid group represented by the following formula (4) having an acid dissociation constant (pKa) of from 0 to 11 at a side chain of the polymer:

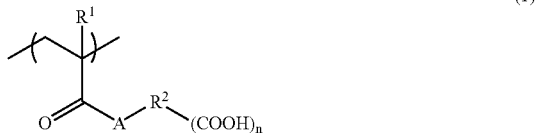
(1)

$P—X^3-(A^2-H)_m$ (4)

wherein in formula (1), $R^1$ represents a hydrogen atom or a methyl group; $R^2$ represents an (n+1)-valent organic linking group containing an ester group represented by —O(C=O)—; A represents an oxygen atom or $NR^3$—; $R^3$ represents a hydrogen atom, or an monovalent hydrocarbon group having from 1 to 10 carbon atoms; and n indicates an integer of from 1 to 5;

and in formula (4), $X^3$ represents a single bond that directly links to a main chain of the polymer, or a linking group selected from a group consisting of a carboxylic acid ester group (—COO—), an amido group (—CONH—), a hydrocarbon group and an ether group (—O— or —S—); $A^2$-H represents a partial structure that functions as an acid group having an acid dissociation constant (pKa) of from 0 to 11; and m indicates an integer of from 1 to 5.

The invention further provides an alkali-soluble polymer, which contains a structural unit having a carboxyl group represented by the following formula (1) at a side chain of the structural unit, and which comprises an assistant group for dissolution in an alkali aqueous solution at a side chain of the polymer, wherein no deposition is formed, when the polymer is dissolved in an alkali aqueous solution having a pH of 10 or more and kept at room temperature for 60 days:

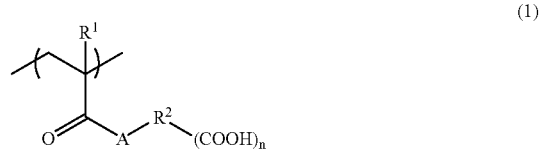
(1)

wherein $R^1$ represents a hydrogen atom or a methyl group; $R^2$ represents an (n+1)-valent organic linking group containing an ester group represented by —O(C=O)—; A represents an oxygen atom or $NR^3$—; $R^3$ represents a hydrogen atom, or an monovalent hydrocarbon group having from 1 to 10 carbon atoms; and n indicates an integer of from 1 to 5.

The polymerizable composition of the invention is characterized in that it contains (A) an alkali-soluble polymer of the invention mentioned above, (B) an ethylenic unsaturated bond-having compound and (C) a compound of generating a radical by light or heat.

Though not clear, the effect of the invention could be presumed as follows:

The alkali-soluble polymer of the invention has a terminal carboxyl group, and is characterized in that the ester bond therein is prevented from being hydrolyzed with time to cause polymer deposition with time. In the first embodiment thereof, the alkali-soluble polymer of the invention has a structural unit having a carboxyl group of formula (1) at a side chain of the structural unit and has, in a side chain of the polymer, a functional group of formula (2) capable of giving an acid group through hydrolysis with an aqueous alkali solution (developer) (the functional group may be hereinunder referred to as "specific functional group"). Therefore, it is believed that the polymer could still have good alkali-solubility because of the action of the acid group formed through hydrolysis of the side chain structure of formula (2), even after the terminal carboxyl group of the polymer has partly disappeared in an aqueous alkali solution such as alkali developer. Accordingly, it is believed that, when the polymerizable composition that contains the polymer of the type is used in the recording layer of lithographic printing plate precursors, then the alkali-solubility of the recording layer could improve, and, as a result, the binder polymer could be prevented from depositing (to form development sediment) in developer during development therein.

In the second embodiment of the alkali-soluble polymer of the invention, the side chain structure of formula (4) is an acid group having an acid dissociation constant (pKa) of from 0 to 11, and it does not have a hydrolyzable linking moiety like the carboxyl group in the structural units of formula (1) therein. Therefore, the polymer of the type may exhibit its alkali-solubility that is always stable even in aqueous alkali solution, and may keep its solubility in alkali. As a result, it is believed that the polymer may be prevented from depositing with time to form development sediment in alkali developer.

Accordingly, the lithographic printing plate precursor comprising the alkali-soluble polymer in the recording layer thereof is, even when continuously developed in an automatic developing machine, effectively prevented from having development sediment to be caused by polymer deposition in developer.

DETAILED DESCRIPTION OF THE INVENTION

The alkali-soluble polymer and the polymerizable composition comprising it of the invention are described in detail hereinunder.

[Alkali-Soluble Polymer]

The alkali-soluble polymer of the invention is characterized in that it contains a structural unit having a carboxyl group of formula (1) (it may be also called a carboxyl group-branched structural unit) and that, when dissolved in an aqueous alkali solution having a pH of at least 10 and left at room temperature (25° C.) for 60 days, it forms no deposition.

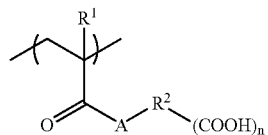
(1)

In formula (1), $R^1$ represents a hydrogen atom or a methyl group; $R^2$ represents an (n+1)-valent organic linking group containing an ester group of —O(C=O)—; A represents an oxygen atom or $NR^3$—; $R^3$ represents a hydrogen atom, or an monovalent hydrocarbon group having from 1 to 10 carbon atoms; and n indicates an integer of from 1 to 5.

The means of preventing the deposition with time of the alkali-soluble polymer having a structure of formula (1) in aqueous alkali solution is not specifically defined, so far as it may effectively prevent the reduction in the solubility of the polymer owing to the disappearance with tire of the alkali-soluble group, carboxyl group from the polymer. For example, it includes introduction of an additional functional group capable of changing in aqueous alkali solution to exhibit alkali-solubility therein, into the polymer; introduction thereinto of an additional functional group having high alkali-solubility and capable of increasing the solubility of the polymer as a whole; or introduction thereinto of a structure not functioning as an alkali-solubilizing group by itself but capable of increasing the solubility of the polymer, for example, a structure having high affinity for aqueous alkali solution.

Preferred embodiments are, for example, (I) an embodiment of having, in the polymer side chains, a functional group of formula (2) capable of forming an acid group through hydrolysis with alkali; (II) an embodiment of having, in the polymer side chains, an acid group of formula (4) having an acid dissociation constant (pKa) of from 0 to 11; and (III) an embodiment of having, in the polymer side chains, an assistant group for dissolution in aqueous alkali solution. These preferred embodiments are described in detail hereinunder.

The functional group capable of forming an acid group through hydrolysis with aqueous alkali solution (developer) having pH of at least 10 is described. Preferably, the functional group is represented by formula (2), and it is desirable that the polymer has the functional group in its side chains,

(2)

In formula (2), Q represents a linking group that links $X^1$ to the polymer backbone chain; $X^1$ represents a protective group hydrolyzable with an aqueous alkali solution having a pH of at least 10; and when the functional group of formula (2) gives -Q-OH after hydrolysis, the -Q-OH is an acid group having a pKa of at most 10.

Q may also be a trivalent or more multivalent linking group. In this case, formula (2) may be represented by the following formula (2'). n indicates an integer selected from 1 to 5.

(2')

The linking group Q is especially such that, when the specific functional group has changed into -Q-OH after hydrolysis, the pKa of -Q-OH could be at most 10, more preferably from 3 to 10. Preferably, Q is a hydrocarbon-type linking group, and the hydrocarbon group for it includes a straight chain, branched or cyclic alkyl group, and an aromatic group. From these, Q is selected so that the pKa of the specific functional group after hydrolysis could fall within the range as above. In general, an electron-attractive substituent may be introduced into such a divalent or more multivalent hydrocarbon group to thereby make the pKa of the specific functional group after hydrolysis fall within the range as above.

Preferred examples of the hydrocarbon group for Q are an aromatic group and a cyclo group (cycloalkane group or cycloalkene group).

Not specifically defined, $X^1$ may be any functional group capable of functioning as a protective group until it is removed through hydrolysis with aqueous alkali solution having pH of at least 10.

Preferred examples of $X^1$ are a substituted oxy group, substituted thio group, and a substituted amino group.

More preferably, the specific functional group in the invention is represented by the following formula (3):

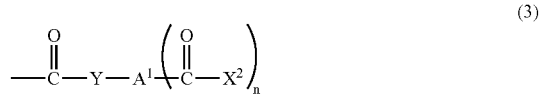
(3)

In formula (3), $A^1$ represents an aromatic group or a cyclo group (cycloalkane or cycloalkene group). Concretely, it includes an aromatic group, a heterocyclic group, a condensed polycyclic group or an aliphatic cyclic structure having from about 4 to 50 carbon atoms.

n indicates an integer selected from 1 to 5. In view of the balance between the solubility in alkali of the unexposed part of the polymer and the resistance to alkali development of the exposed part thereof, n is preferably from 1 to 3.

$X^2$ represents —$NR^1R^2$, —$SR^3$, or —$OR^4$. $R^1$ to $R^4$ each independently represent a substituent composed of at least one or more atoms selected from a group consisting of a carbon atom, a hydrogen atom, an oxygen atom, a nitrogen atom, a sulfur atom and a halogen atom. For example, it includes an optionally-substituted alkyl group, and an optionally-substituted aryl group.

The alkyl group includes a straight chain, branched or cyclic alkyl group having from 1 to 20 carbon atoms. Specific examples thereof include methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, sec-butyl, tert-butyl, isopentyl, neopentyl, 1-methylbutyl, isohexyl, 2-ethylhexyl, 2-methylhexyl, cyclohexyl, cyclopentyl and 2-norbornyl groups. Of the alkyl groups, a straight chain alkyl group having from 1 to 12 carbon atoms, a branched alkyl group having from 3 to 12 carbon atoms and a cyclic alkyl group having from 5 to 10 carbon atoms are preferred.

The substituent that may be introduced into the alkyl group may be a monovalent non-metallic atomic group exclusive of a hydrogen atom. It includes a halogen atom (e.g., fluorine, bromine, chlorine or iodine), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, an ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxy group and a conjugate base group thereof, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and a conjugate base group thereof, an alkoxysulfonyl group, an aryloxysulfonyl group, a sulfinamoyl group, an N-alkylsulfinamoyl group, an N,N-dialkylsulfinamoyl group, an 14-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N-acylsulfamoyl group and a conjugate base group thereof, an n-alkylsulfonylsulfamoyl group (—$SO_2NHSO_2(alkyl)$) and a conjugate base group thereof, an N-arylsulfonylsulfamoyl group (—$SO_2NHSO_2(aryl)$) and a conjugate base group thereof, an N-alkylsulfonylcarbamoyl group (—$CONHSO_2(alkyl)$) and a conjugate base group thereof, an N-arylsulfonylcarbamoyl group (—$CONHSO_2(aryl)$) and a conjugate base group thereof, an alkoxysilyl group (—$Si(O-alkyl)_3$), an aryloxysilyl group (—$Si(O-aryl)_3$), a hydroxysilyl group (—$Si(OH)_3$) and a conjugate base group thereof, a phosphono group (—$PO_3H_2$) and a conjugate base group thereof, a dialkylphosphono group (—$PO_3(alkyl)_2$), a diarylphosphono group (—$PO_3(aryl)_2$), an alkylarylphosphono group (—$PO_3(alkyl)(aryl)$), a monoalkylphosphono group (—$PO_3H(alkyl)$) and a conjugate base group thereof, a monoarylphosphono group (—$PO_3H(aryl)$) and a conjugate base group thereof, a phosphonoxy group (—$OPO_3H_2$) and a conjugate base group thereof, a dialkylphosphonoxy group (—$OPO_3(alkyl)_2$), a diarylphosphonoxy group (—$OPO_3(aryl)_2$), an alkylarylphosphonoxy group (—$OPO_3(alkyl)(aryl)$), a monoalkylphosphonoxy group (—$OPO_3H(alkyl)$) and a conjugate base group thereof, a monoarylphosphonoxy group (—$OPO_3H(aryl)$) and a conjugate base group thereof, a cyano group, a nitro group, a dialkylboryl group (—$B(alkyl)_2$), a diarylboryl group (—$B(aryl)_2$), an alkylarylboryl group (—$B(alkyl)(aryl)$), a dihydroxyboryl group (—$B(OH)_2$) and a conjugate base group thereof, an alkylhydroxyboryl group (—$B(alkyl)(OH)$) and a conjugate base group thereof, an arylhydroxyboryl group (—$B(aryl)(OH)$) and a conjugate base group thereof, an aryl group, an alkenyl group and an alkynyl group.

The aryl group includes a benzene ring, a condensed ring that comprises 2 or 3 benzene rings, and a condensed ring that comprises a benzene ring and a 5-membered unsaturated ring. Its specific examples include phenyl, naphthyl, anthryl, phenanthryl, indenyl, acenaphthenyl and fluorenyl groups. Of those, preferred are phenyl and naphthyl groups.

The substituent that maybe introduced into the aryl group includes the above-mentioned alkyl group and those mentioned hereinabove for the substituent capable of being introduced into the alkyl group.

Of those for $X^2$, preferred examples of the substituted amino group of —$NR^1R^2$ include an acylamino group, an N-alkylacylamino group, an N-arylacylamino group, an ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group and an N-aryl-N-aryloxycarbonylamino group. The alkyl group and the aryl group in these include those described for the alkyl group, substituted alkyl group, aryl group and substituted aryl group above. In an acyl group ($R^8CO$—) in the acylamino group, N-alkylacylamino group or N-arylacylamino group described above, $R^8$ has the same meaning as that described hereinabove for the alkyl, substituted alkyl, aryl, substituted aryl group. Of those, more preferred are an N-alkylamino group, an N,N-dialkylamino group, an N-arylamino group and an acylamino group are more preferred. Specific preferred examples of the preferred substituted amino group include methylamino, ethylamino, diethylamino, morpholino, piperidino, pyrrolidino, phenylamino, benzoylamino and acetylamino groups.

Y represents a single bond, or —O— or —NR$^5$—. R$^5$ represents a hydrogen atom or a hydrocarbon atom. The hydrocarbon group for R$^5$ includes an alkyl group, an aryl group, an alkenyl group, and an alkynyl group.

Specific examples of the alkyl group include a straight chain, branched or cyclic alkyl group having from 1 to 10 carbon atoms, such as methyl, ethyl, propyl, butyl, pentyl, hexyl, heptyl, octyl, nonyl, decyl, isopropyl, isobutyl, sec-butyl, tert-butyl, isopentyl, neopentyl, 1-methylbutyl, isohexyl, 2-ethylhexyl, 2-methylhexyl, cyclohexyl, cyclopentyl, 1-adamantyl and 2-norbornyl groups.

Specific examples of the aryl group include an aryl group having from 1 to 10 carbon atoms, such as phenyl, naphthyl and indenyl groups; and a heteroaryl group having one hetero atom selected from nitrogen, oxygen and sulfur atoms and having from 1 to 10 carbon atoms, such as furyl, thienyl, pyrrolyl, pyridyl and quinolyl groups.

Specific examples of the alkenyl group include a straight chain, branched or cyclic alkenyl group having from 1 to 10 carbon atoms, such as vinyl, 1-propenyl, 1-butenyl, 1-methyl-1-propenyl, 1-cyclopentenyl and 1-cyclohexenyl groups.

Specific examples of the alkynyl group include those having from 1 to 10 carbon atoms, such as ethynyl, 1-propynyl, 1-butynyl and 1-octynyl groups.

R$^5$ may be substituted. For the substituent for it, referred to are those mentioned hereinabove for the substituent for the alkyl group for R$^1$ to R$^4$. However, the number of the carbon atoms constituting R$^5$ is from 1 to 10 including the number of the carbon atoms of the substituent for it.

Preferably, Y is an oxygen atom or —NH— since the polymer production is easy.

For introducing the specific functional group into polymer compounds, for example, employable is a method of copolymerizing a monomer having the specific functional group and an unsaturated bond capable of copolymerizing with any other comonomer in the molecule in any known mode of polymerization. If desired, any other monomer not having the specific functional group may be copolymerized with it. In the invention, the structural units of such monomer in the polymer compound obtained through such copolymerization may be referred to as "units".

Preferred examples of the units having the specific functional group are mentioned below, to which, however, the invention should not be limited.

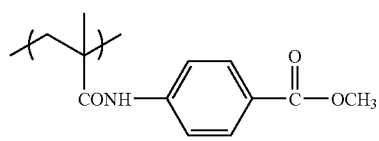

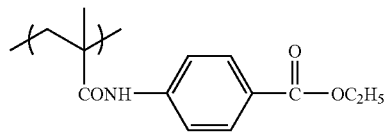

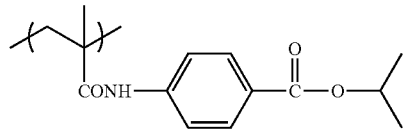

-continued

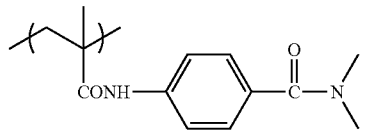

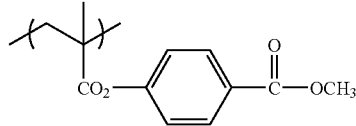

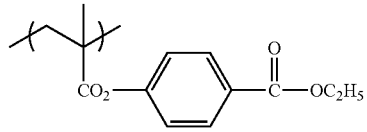

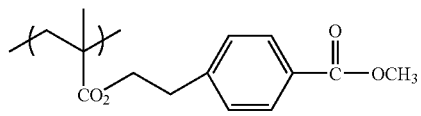

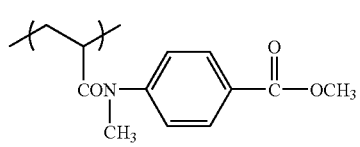

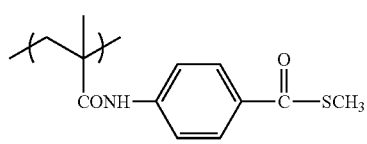

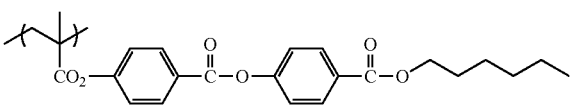

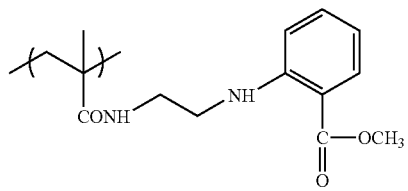

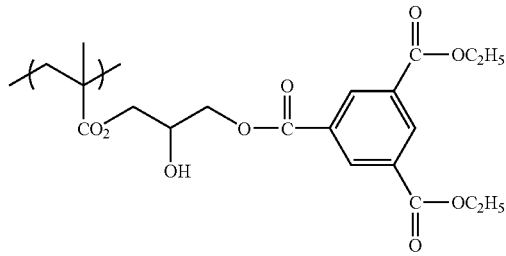

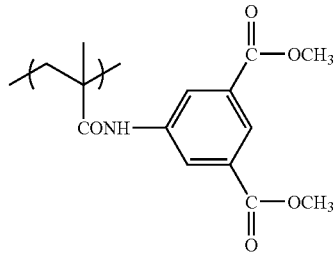

-continued

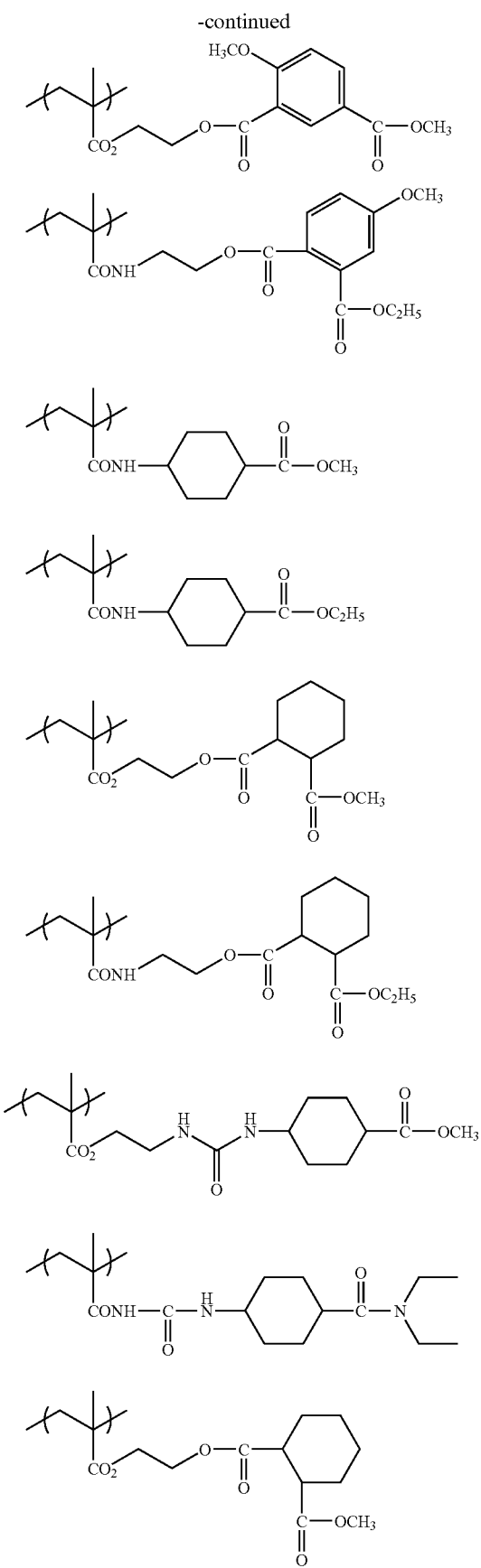

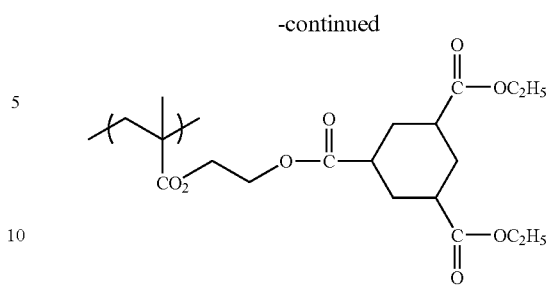

The alkali-soluble polymer of the invention may contain one or more different types of units having the specific functional group.

The alkali-soluble polymer may be a polymer comprising only the units of formula (1) and the units having the specific functional group, but in general, it is combined with units of any other comonomer mentioned hereinunder. The total content of the specific functional group-having units in the copolymer may be suitably determined depending on the structure of the copolymer and on the design of image-recording layers that contain the copolymer. Preferably, it may be from 1 to 99 mol %, more preferably from 5 to 90 mol %, even more preferably from 10 to 70 molt of the total molar amount of the polymer component.

In the alkali-soluble polymer of the invention, the content of the specific functional group, which is indispensable in the first embodiment of the invention, is preferably from 0.05 to 10.0 mmols, more preferably from 0.10 to 5.0 mmols, per gram of the alkali-soluble polymer.

The second embodiment of the invention is described. In the second embodiment, an acid group of formula (4) having an acid dissociation constant (pKa) of from 0 to 11 is introduced into the side chains of the polymer.

$$P-X^3-(A^2-H)_m \qquad (4)$$

In formula (4), $X^3$ represents a single bond, or a linking group selected from a carboxylate group (—COO—), an amido group (—CONH—), a hydrocarbon group and an ether group (—O— or —S—); $A^2$-H represents a partial structure that functions as an acid group having an acid dissociation constant (pKa) of from 0 to 11; and m indicates an integer of from 1 to 5.

The acid group having an acid dissociation constant (pKa) of from 0 to 11 is described.

1. Acid group having an acid dissociation constant (pKa) of from 0 to less than 5.5;

The acid group having an acid dissociation constant (pKa) of from 0 to less than 5.5 includes a sulfonic acid group, a phosphoric acid group, and a carboxyl group. Especially preferred is a carboxyl group. Concretely, for example, the carboxyl group-having structure includes acrylic acid, methacrylic acid, itaconic acid, crotonic acid, isocrotonic acid, maleic acid and p-carboxystyrene. More preferred are acrylic acid, methacrylic acid and p-carboxystyrene. One or more of these may be employed herein.

2. Acid group having an acid dissociation constant (pKa) of from 5.5 to 11:

The acid group having an acid dissociation constant (pKa) of from 5.5 to 11 that may be in the alkali-soluble polymer of the invention is described. Its pKa is preferably from 7 to 11, more preferably from 8 to 11.

Concretely, for example, the acid group includes a phenol group (pKa=9.99), a 2-methoxyphenol group (pKa=9.99), a 2-chlorophenol group (pKa=8.55), a methyl 2-hydroxybenzoate group (pKa=9.87), a 4-methylphenol group (pKa=10.28), a 1,3-benzenediol group (pKa=9.20), a 1-naphthol group (pKa=9.30), a 1,2-benzenediol group (pKa=9.45), a benzenesulfonamido group (pKa=10.00), an N-acetylphenylbenzenesulfonamido group (pKa=6.94), a 4-aminobenzenesulfonamido group (pKa=10.58), an N-phenyl-4-aminobenzenesulfonamido group (pKa=6.30), an N-(4-acetylphenyl)-4-aminobenzenesulfonamido group (pKa=7.61), and an ethyl acetylacetate group (pKa=10.68). Of those, more preferred are phenol groups optionally substituted on the aromatic group thereof, and benzenesulfonamido groups optionally substituted on the aromatic group thereof.

The data of the acid dissociation constant pKa of the above-mentioned specific examples are those described in E. P. Serjeant et al., *Ionization Constants of Organic Acids in Aqueous Solution*, and in John A. Dean, *Lange's Handbook of Chemistry*.

The structural unit that has the specific acid group as above is preferably represented by the following formula (5):

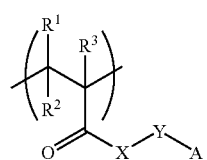

(5)

In formula (5), X represents O, S or —NR$^4$—; Y represents a divalent organic group; A represents a specific acid group; R$^1$, R$^2$, R$^3$ and R$^4$ each independently represent a hydrogen atom, a halogen atom, a monovalent organic group, a cyano group or a nitro group.

In formula (5), the monovalent organic group for R$^1$, R$^2$, R$^3$ and R$^4$ includes, for example, a straight chain, branched or cyclic alkyl group, an aromatic group, an alkoxy group, an acyl group, an aralkyl group, an alkoxycarbonyl group, and an aryloxy group.

The monovalent organic group may be further substituted. The substituent that may be introduced into it includes, for example, an alkyl group, an aryl group, an alkoxy group, an acyloxy group, a halogen atom, a hydroxyl group, an amino group, a cyano group, and a nitro group.

In formula (5), the divalent organic group for Y includes, for example, an alkylene group, a phenylene group, and a naphthylene group.

The divalent organic group may be further substituted. The substituent that may be introduced into it includes, for example, an alkyl group, an aryl group, an alkoxy group, an acyloxy group, a halogen atom, a hydroxyl group, an amino group, a cyano group, and a nitro group.

For the structural unit that has the specific acid group, also preferred are those of the following formulae (6) to (11):

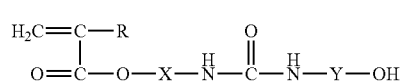

(6)

In formula (6), R represents a hydrogen atom or an alkyl group; X represents a divalent linking group; and Y represents an optionally-substituted divalent aromatic group.

In formula (6), the divalent linking group for X includes, for example, an optionally-substituted alkylene or phenylene group. The optionally-substituted divalent aromatic group for Y includes, for example, an optionally-substituted phenylene or naphthylene group.

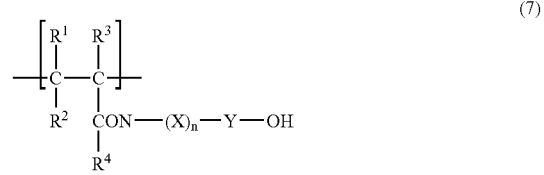

(7)

In formula (7), R$^1$ and R$^2$ each independently represent a hydrogen atom, an alkyl group, or a carboxyl group; R$^3$ represents a hydrogen atom, a halogen atom, or an alkyl group; R$^4$ represents a hydrogen atom, an alkyl group, a phenyl group, or an aralkyl group; X represents a divalent organic group that links the nitrogen atom to the carbon atom of the aromatic ring in the formula; n indicates 0 or 1; Y represents an optionally-substituted phenylene group, or an optionally-substituted naphthylene group.

Formula (7) is described in detail.

In the structural unit of formula (7), Y is an optionally-substituted phenylene group or an optionally-substituted naphthylene group. The type of the substituent for the group does not almost have any significant influence on the properties of the polymerizable composition of the invention. Therefore, the group may have any type of substituent. Specific examples of the substituent include an alkyl group, an alkoxy group, a halogen atoms an acyl group, a hydroxyl group, a carboxyl group, a sulfonic acid group, a cyano group, and a nitro group.

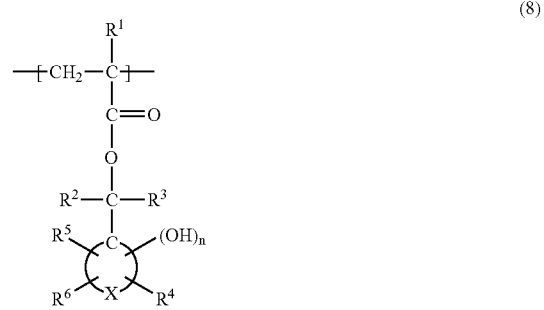

(8)

In formula (8), R$^1$ represents a hydrogen atom, a halogen atom, a cyano group, or an alkyl group; R$^2$ and R$^3$ each independently represent a hydrogen atom, a halogen atom, an alkyl group, an alkoxy group, or an aryl group; X represents an atomic group necessary for completing a monocyclic or polycyclic, carbon-cyclic aromatic ring system; n indicates 1, 2 or 3.

In the structural unit of formula (8), preferably, R$^1$ is a hydrogen atom, a halogen atom, a cyano group, or an alkyl group having from 1 to 6 carbon atoms; R$^2$ and R$^3$ are independently a hydrogen atom, or an alkyl group having from 1 to 4 carbon atoms; R$^4$, R$^5$ and R$^6$ are independently a hydrogen atom, an alkyl group having from 1 to 4 carbon atoms, or a halogen atom; X is carbon atoms necessary for completing a benzene ring or a naphthalene ring; and n is 1.

In the structural unit of formula (8), more preferably, $R^1$ is a hydrogen atom or a methyl group; $R^2$, $R^3$ and $R^4$ are hydrogen atoms; $R^5$ is a hydrogen atom, an alkyl group having from 1 to 4 carbon atoms, or a halogen atom; $R^6$ is a hydrogen atom, an alkyl group having from 1 to 4 carbon atoms, an aryl group, or a halogen atom; X is carbon atoms necessary for completing a benzene ring or a naphthalene ring; and n is 1.

When $R^1$ is an alkyl group in formula (8), it preferably has from 1 to 6 carbon atoms, more preferably 1 or 2 carbon atoms. Even more preferably, $R^1$ is a hydrogen atom or a methyl group.

In formula (8), at least one of $R^2$ and $R^3$ is preferably a hydrogen atom. When $R^2$ and $R^3$ are an alkyl group, the group preferably has from 1 to 6 carbon atoms, more preferably from 1 to 3 carbon atoms.

In formula (8), $R^4$ is preferably a hydrogen atom. $R^5$ is preferably an alkyl group having from 1 to 4 carbon atoms, more preferably a methyl group. $R^6$ is preferably an alkyl group having from 1 to 4 carbon atoms, or an aryl group.

In general, the alkyl group as referred to herein is meant to indicate a cyclic or open-chain, branched or unbranched, saturated or unsaturated group that may be substituted with a halogen atom or a hydroxyl group and may contain an ether group or a ketone group. Preferably, it is an unbranched alkyl group having from 1 to 4 carbon atoms. The aryl group may be a monocyclic or polycyclic, heterocyclic or carbon-cyclic aromatic ring system that may be substituted with an aryl group, an alkoxy group, a hydroxy group or a halogen atom.

The position of the substituents on the ring X is not specifically defined, and it depends on only the easiness in producing the compounds.

The carbon-cyclic aromatic ring system X may be monocyclic or polycyclic. The carbon-cyclic ring system is typically a benzene or naphthalene system.

The halogen atom in formula (8) is preferably a chlorine, bromine or iodine atom, more preferably a chlorine atom.

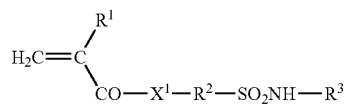

(9)

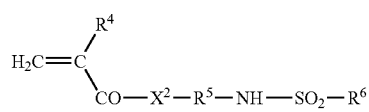

(10)

In formulae (9) and (10), $X^1$ and $X^2$ each independently represent —O— or —$NR^7$—; $R^1$ and $R^4$ each independently represent —H or —$CH_3$; $R^2$ and $R^5$ each independently represent an optionally-substituted alkylene, cycloalkylene, arylene or aralkylene group having from 1 to 12 carbon atoms; $R^3$ represents —H, or an optionally-substituted alkyl, cycloalkyl, aryl or aralkyl group having from 1 to 12 carbon atoms; $R^6$ represents an optionally-substituted alkyl, cycloalkyl, aryl or aralkyl group having from 1 to 12 carbon atoms; $R^7$ represents a hydrogen atom, or an optionally-substituted alkyl, cycloalkyl, aryl or aralkyl group having from 1 to 12 carbon atoms.

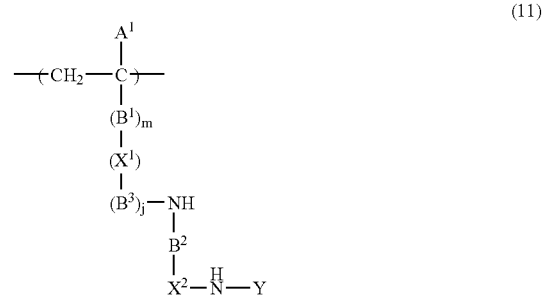

(11)

In formula (11), $A^1$ represents a hydrogen atom, a halogen atom, or an alkyl group having from 1 to 4 carbon atoms; $B^1$ represents a phenylene group, or a substituted phenylene group; $B^2$ represents an optionally substituted alkylene group having from 2 to 6 carbon atoms, or an optionally-substituted phenylene group; $B^3$ represents a divalent organic group; $X^1$ and $X^2$ each independently represent —CO—, or —$SO_2$—; Y represents —CO—$R^1$— or —$SO_2$—$R^1$; $R^1$ represents an alkyl group, a substituted alkyl group, an aromatic group, or a substituted aromatic group; and m and j are 0 or 1.

Specific examples (B-1 to B-6, C-1 to C-15, D-1 to D-6, E-1 to E-15, F-1 to F-13, G-1 to G-3, H-1 to H-2, J-1 to J-2) of the comonomers usable for the structural units of formulae (5) to (11) are mentioned below, to which, however, the invention should not be limited. These comonomers are produced according to the methods described in JP-A 7-333839, JP-A 8-339080, JP-B 52-28401, JP-A 4-212961, JP-A 2-866, and JP-A 8-286369.

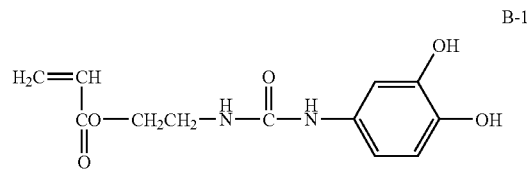

B-1

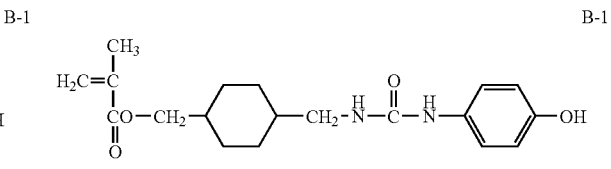

B-1

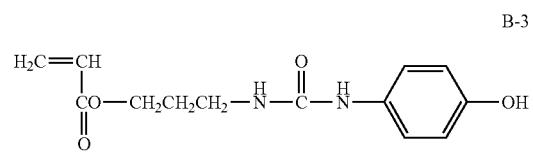

B-3

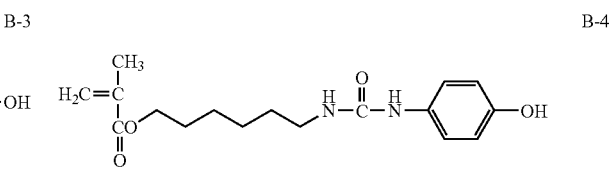

B-4

-continued
B-5 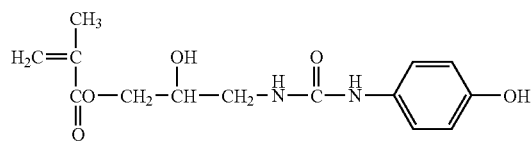 B-6 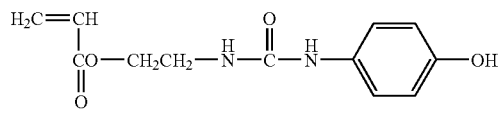
C-1 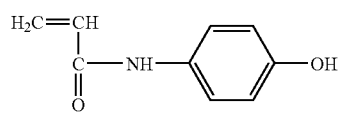 C-2 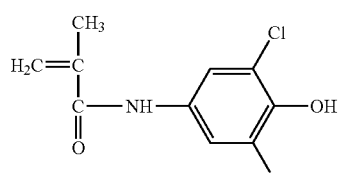
C-3 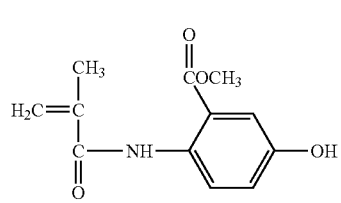 C-4 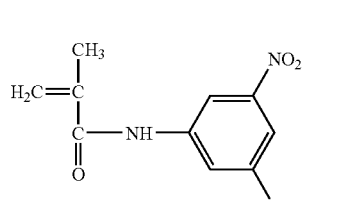
C-5 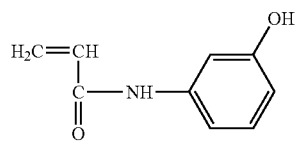 C-5 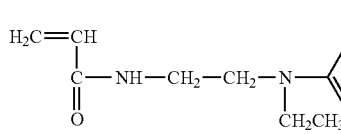
C-7 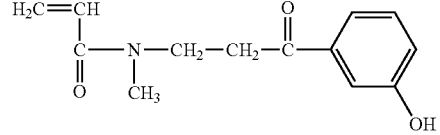 C-9 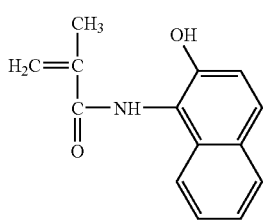
C-9 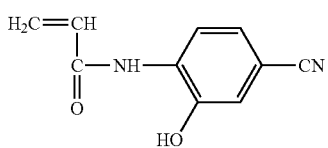
C-11 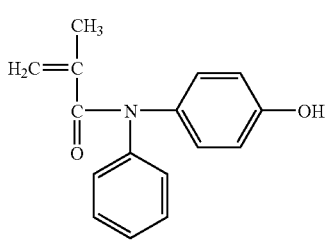 C-10 
C-12 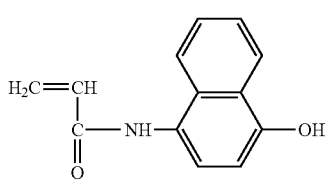
C-13 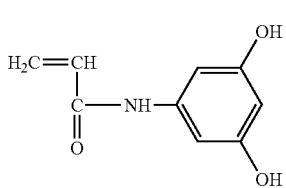 C-14

-continued
C-15 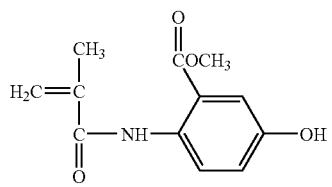
D-1 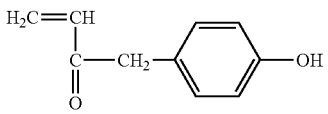
D-2 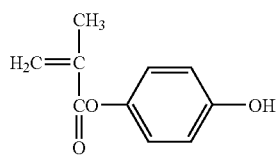
D-3 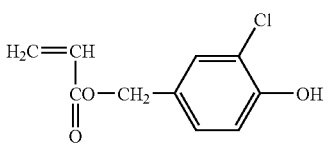
D-4 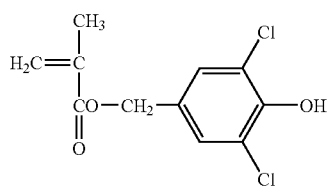
D-5 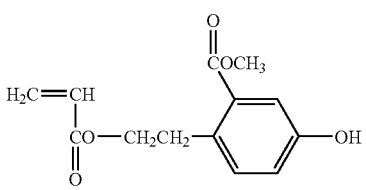
D-6 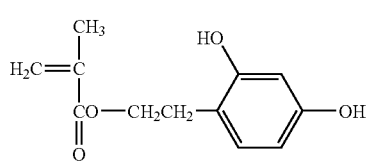
E-1 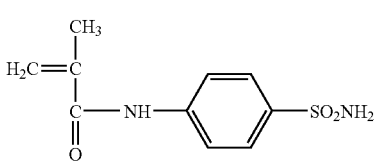
E-2 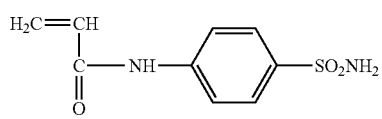
E-3 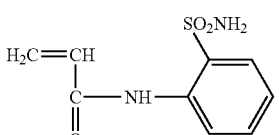
E-4 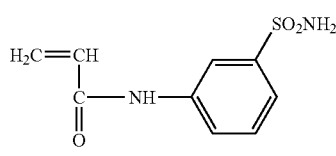
E-5 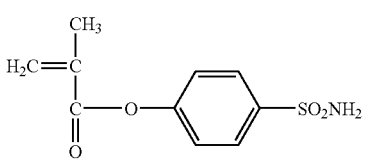
E-6 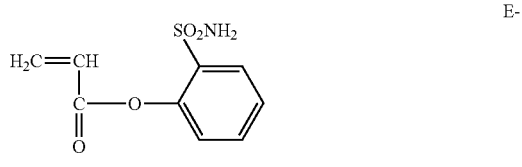
E-7 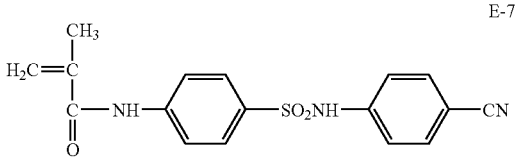
E-8 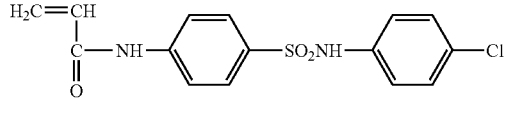
E-9 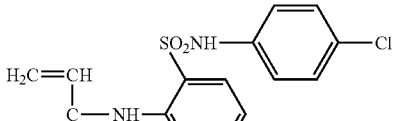
E-10 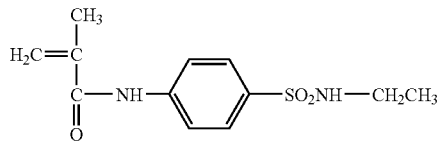
E-11

-continued

-continued

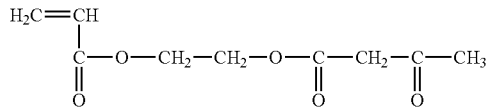
G-1

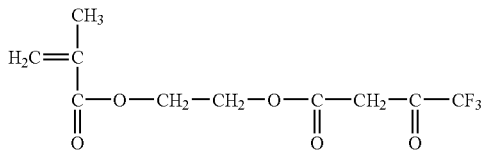
G-2

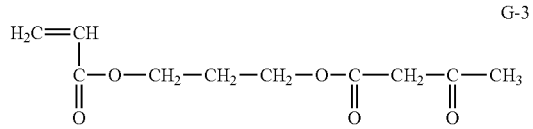
G-3

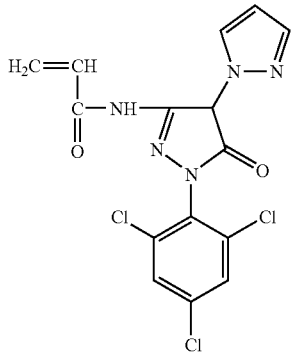
H-1

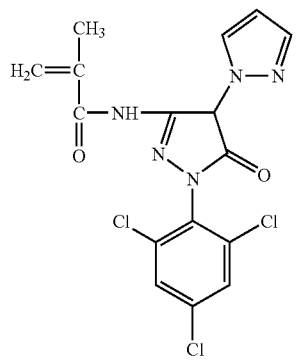
H-2

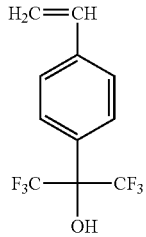
I-1

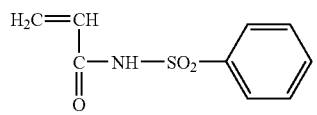
J-1

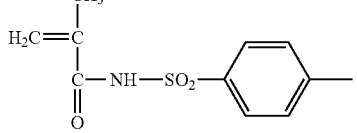
J-2

Either singly or as combined, one or more different types of the specific acid group-having structural units mentioned above may be in the specific binder polymer.

In the alkali-soluble polymer of the second embodiment of the invention, the content of the acid group having an acid dissociation constant (pKa) of from 0 to 11 is preferably from 0.01 to 10.0 mmols, more preferably from 0.05 to 7.0 mmols per gram of the alkali-soluble polymer.

The third embodiment of the invention is described. In the third embodiment, an assistant group for dissolution in aqueous alkali solution is introduced into the side chains of the polymer. The assistant group for dissolution in aqueous alkali solution is not an acid group (alkali-soluble group) by itself but substantially participates in improving the solubility in alkali of the polymer. For example, it has a partial structure having high affinity for aqueous alkali solution. Concretely, its preferred examples include alcohols, polyol derivatives, saccharide derivatives, amide derivatives, imide derivatives, and guanidine derivatives.

The alkali-soluble polymer of the invention must have, in the side chains thereof, a functional group that has a carboxyl group of —CO-A-$R^2$—(COOH)n. For introducing the functional group into the side chains of alkali-soluble polymer, for example, the units having the specific functional group as above may be combined with the units having the structure of formula (1) mentioned below. Apart from this, radical-polymerizable group-having units or any other comonomers may be combined with them, as in the preferred embodiments mentioned below.

The content of the carboxyl group of formula (1) in the alkali-soluble polymer is preferably from 0.1 to 10.0 mmols, more preferably from 0.3 to 5.0 mmols, most preferably from 0.5 to 4.0 mmols per gram of the alkali-soluble polymer. One or more different types of the units of formula (1) may be in the alkali-soluble polymer.

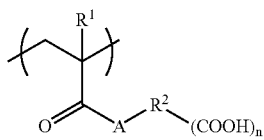

(1)

In formula (1), $R^1$ represents a hydrogen atom or a methyl group, and is preferably a methyl group.

$R^2$ represents an (n+1)-valent linking group. For example, this is an (n+1)-valent organic linking group that comprises one or more atoms selected from a group consisting of a hydrogen atom, an oxygen atom, a nitrogen atom, a sulfur atom and a halogen atom and contains an ester group of —O(C=O)—.

Preferably, the linking group for $R^2$ has from 5 to 20 carbon atoms and has a chain structure, and contains an ester bond in the structure.

The substituent that may be introduced into the linking group for $R^2$ may be a monovalent non-metallic atomic group exclusive of a hydrogen atom. It includes a halogen atom (e.g., fluorine, bromine, chlorine or iodine), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, an ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxy group and a conjugate base group thereof, an alkoxycarbonyl-group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and a conjugate base group thereof, an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-aryl-sulfamoyl group, an N-acylsulfamoyl group and a conjugate base group thereof, an N-alkylsulfonylsulfamoyl group (—SO$_2$NHSO$_2$(alkyl)) and a conjugate base group thereof, an N-arylsulfonylsulfamoyl group (—SO$_2$NHSO$_2$(aryl)) and a conjugate base group thereof, an N-alkylsulfonylcarbamoyl group (—CONHSO$_2$(alkyl)) and a conjugate base group thereof, an N-arylsulfonylcarbamoyl group (—CONHSO$_2$(aryl)) and a conjugate base group thereof, an alkoxysilyl group (—Si(O-alkyl)$_3$), an aryloxysilyl group (—Si(O-aryl)$_3$), a hydroxysilyl group (—Si(OH)$_3$) and a conjugate base group thereof, a phosphono group (—PO$_3$H$_2$) and a conjugate base group thereof, a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and a conjugate base group thereof, a monoarylphosphono group (—PO$_3$H(aryl)) and a conjugate base group thereof, a phosphonoxy group (—OPO$_3$H$_2$) and a conjugate base group thereof, a dialkylphosphonoxy group (—OPO$_3$(alkyl)$_2$), a diarylphosphonoxy group (—OPO$_3$(aryl)$_2$), an alkylarylphosphonoxy group (—OPO$_3$(alkyl)(aryl)), a monoalkylphosphonoxy group (—OPO$_3$H(alkyl)) and a conjugate base group thereof, a monoarylphosphonoxy group (—OPO$_3$H(aryl)) and a conjugate base group thereof, a cyano group, a nitro group, a dialkylboryl group (—B(alkyl)$_2$), a diarylboryl group (—B(aryl)$_2$), an alkylarylboryl group (—B(alkyl)(aryl), a dihydroxyboryl group (—B(OH)$_2$) and a conjugate base group thereof, an alkylhydroxyboryl group (—B(alkyl)(OH)) and a conjugate base group thereof, an arylhydroxyboryl group (—B(aryl)(OH)) and a conjugate base group thereof, an aryl group, an alkenyl group and an alkynyl group.

In particular, when the alkali-soluble polymer of the invention is used as a component of the recording layer of lithographic printing plate precursors, then substituents having a hydrogen-bondable hydrogen atom and especially acidic substituents having a smaller acid dissociation constant (pKa) than carboxylic acids are unfavorable, though depending on the design of the recording layer, since they tend to lower the printing durability of the printing plates produced. On the other hand, hydrophobic substituents such as a halogen atom, a hydrocarbon group (alkyl group, aryl group, alkenyl group, alkynyl group), an alkoxy group and an aryloxy group are more preferred as they tend to improve the printing durability of the printing plate produced. In particular, when the linking group is a monocyclic aliphatic hydrocarbon group having a 6-membered or smaller cyclic structure such as cyclopentane or cyclohexane, then the hydrocarbon group preferably has such hydrophobic substituent. If possible, these substituents may bond to each other or to the hydrocarbon group to form a ring. The substituents may be further substituted.

$R^3$ in NR$^3$— for A in formula (1) is a hydrogen atom, or a monovalent hydrocarbon group having from 1 to 10 carbon atoms. The monovalent hydrocarbon group having from 1 to 10 carbon atoms for $R^3$ includes an alkyl group, an aryl group, an alkenyl group, and an alkynyl group.

Specific examples of the alkyl group include a straight chain, branched or cyclic alkyl group having from 1 to 10 carbon atoms, such as methyl, ethyl, propyl, butyl, pentyl, hexyl, heptyl, octyl, nonyl, decyl, isopropyl, isobutyl, sec-butyl, tert-butyl, isopentyl, neopentyl, 1-methylbutyl, isohexyl, 2-ethylhexyl, 2-methylhexyl, cyclopentyl, cyclohexyl, 1-adamantyl and 2-norbornyl groups.

Specific examples of the aryl group include an aryl group having from 1 to 10 carbon atoms, such as phenyl, naphthyl and indenyl groups; and a heteroaryl group having one hetero atom selected from nitrogen, oxygen and sulfur atoms and having from 1 to 10 carbon atoms, such as furyl, thienyl, pyrrolyl, pyridyl and quinolyl groups.

Specific examples of the alkenyl group include a straight chain, branched or cyclic alkenyl group having from 1 to 10 carbon atoms, such as vinyl, 1-propenyl, 1-butenyl, 1-methyl-1-propenyl, 1-cyclopentenyl and 1-cyclohexenyl groups.

Specific examples of the alkynyl group include those having from 1 to 10 carbon atoms, such as ethynyl, 1-propynyl, 1-butynyl and 1-octynyl groups.

For the substituent which $R^3$ may have, referred to are those mentioned hereinabove for the substituent for $R^2$. However, the number of the carbon atoms constituting $R^3$ is from 1 to 10 including the number of the carbon atoms of the substituent for it.

Preferably, A in formula (1) is an oxygen atom or —NH— since the polymer production is easy.

In formula (1), n indicated an integer of from 1 to 5, and is preferably 1 in view of the printing durability of the printing plates produced.

Preferred examples of the units of formula (1) are mentioned below, to which, however, the invention should not be limited.

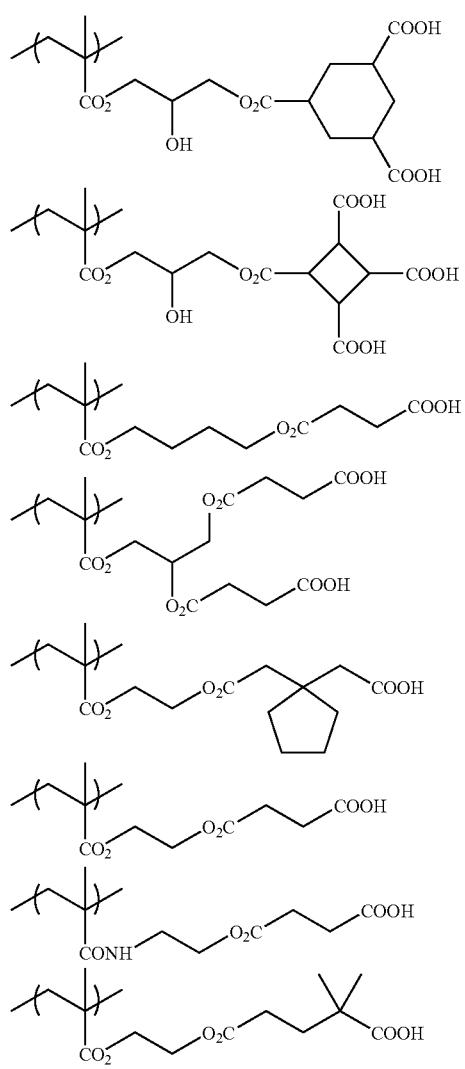

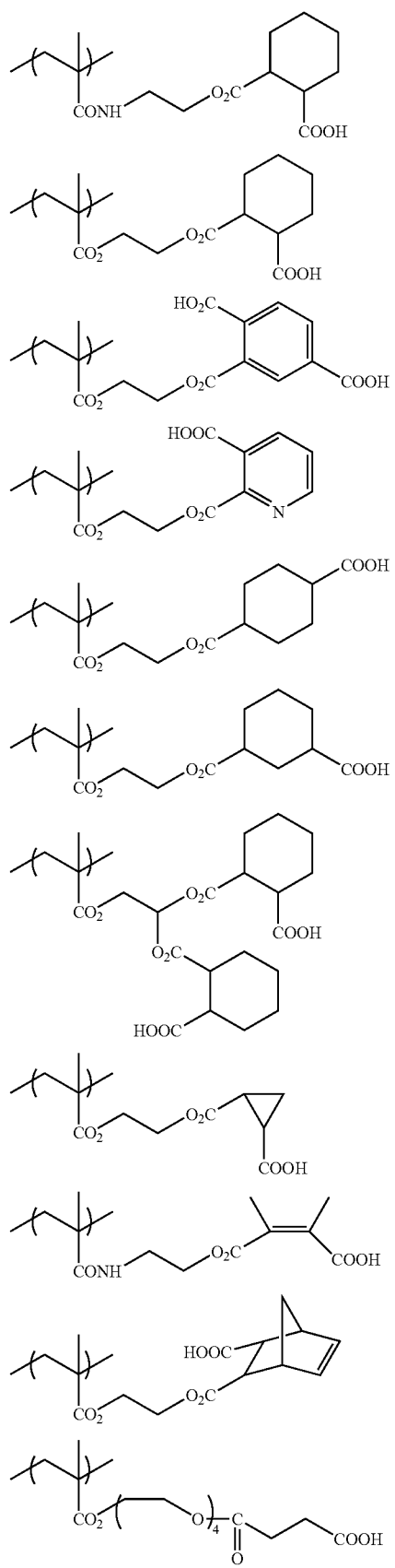

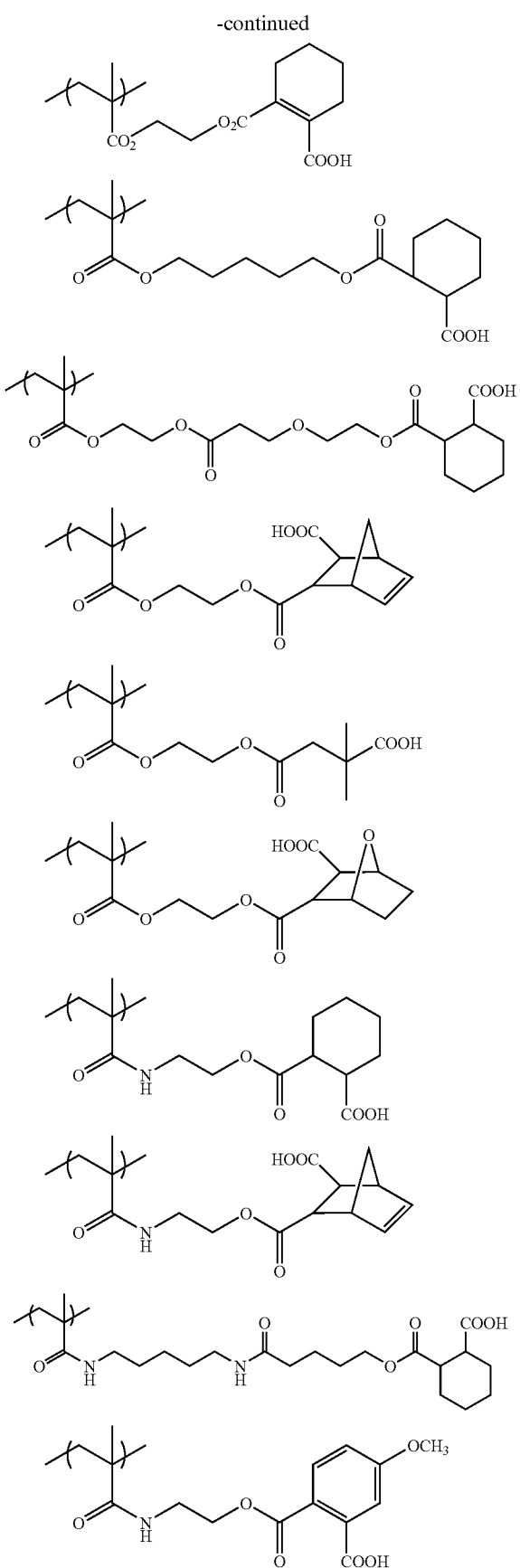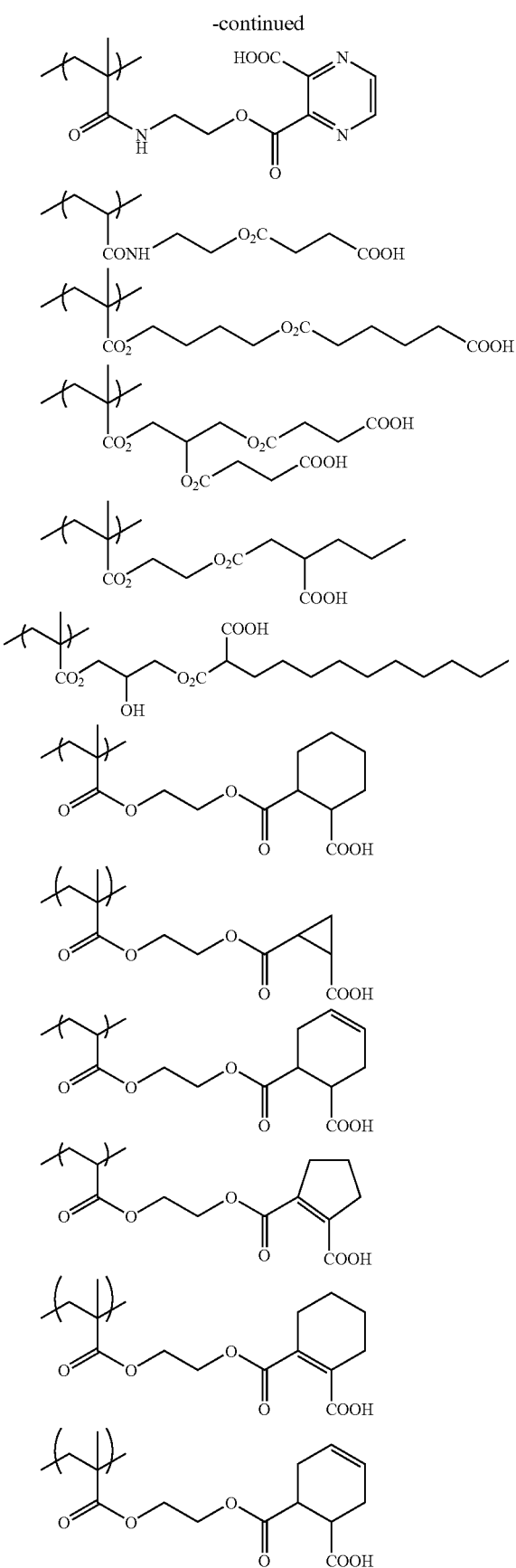

-continued
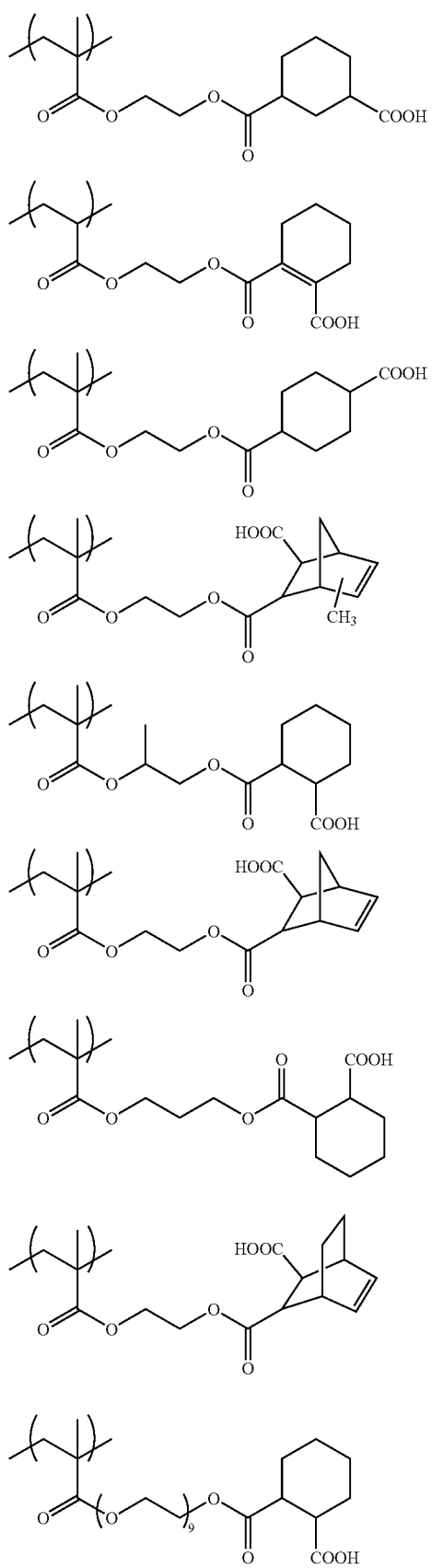
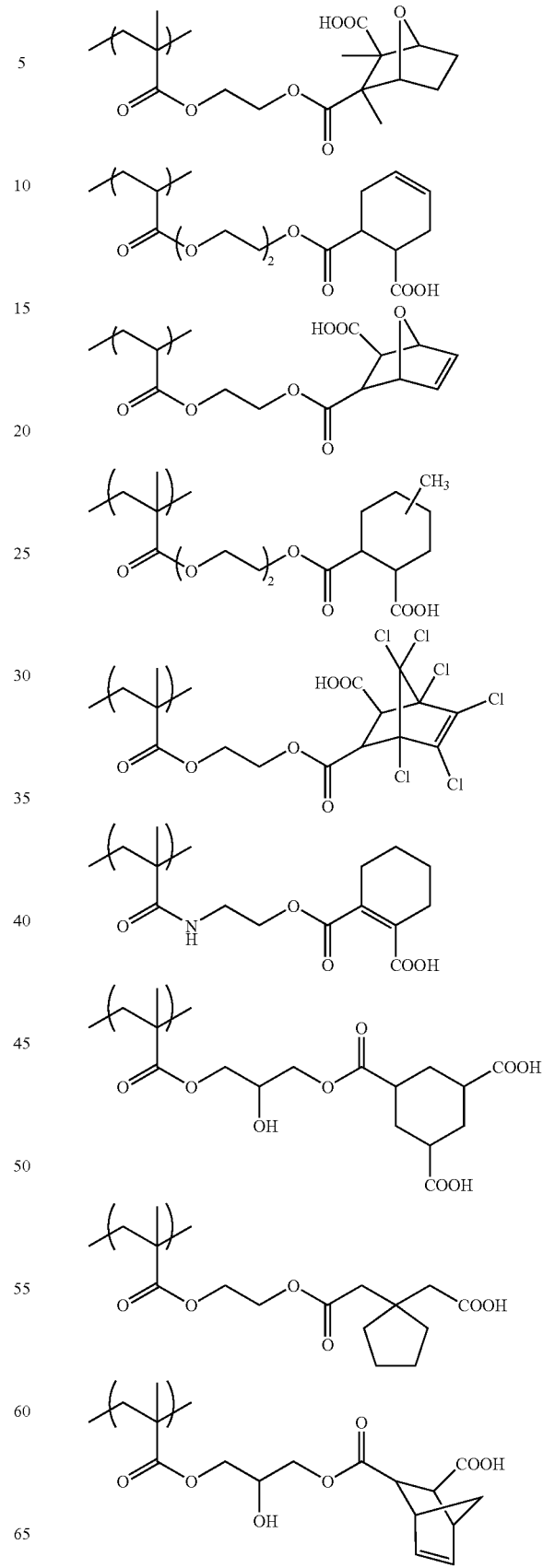

-continued

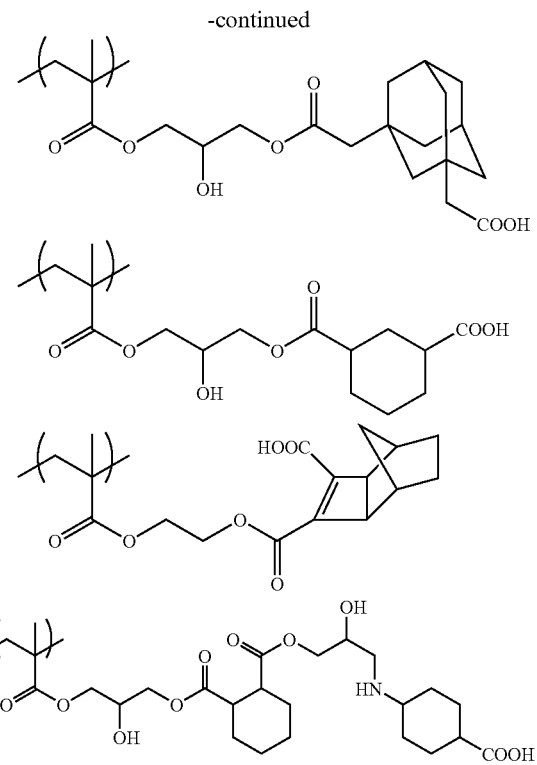

Preferably, the alkali-soluble polymer of the invention has, in the side chains thereof, an ethylenic unsaturated double bond (hereinafter referred to as "radical-polymerizable group"). For introducing such a radical-polymerizable group into the side chains of the alkali-soluble polymer of the invention, for example, employable is a method of combining units having a radical-polymerizable group of any of the following formulae (A) to (E) in addition to the specific functional group-having units mentioned above. The content of the radical-polymerizable group in the alkali-soluble polymer (radical-polymerizable unsaturated double bond content determined through iodine titration) is preferably from 0.1 to 10.0 mmols, more preferably from 1.0 to 8.0 mmols, most preferably from 1.5 to 7.0 mmols per gram of the alkali-soluble polymer. One or more different types of these units may be in the alkali-soluble polymer.

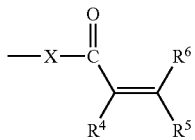
(A)

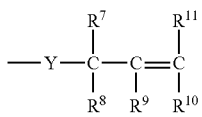
(B)

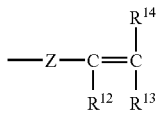
(C)

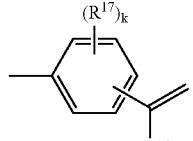
(D)

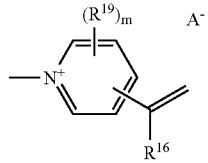
(E)

Formulae (A) to (E) are described. In formulae (A) to (C), $R^4$ to $R^{14}$ each independently represent a hydrogen atom, or a monovalent substituent; X and Y each independently represent an oxygen atom, a sulfur atom, or $N-R^{15}$; Z represents an oxygen atom, a sulfur atom, $-N-R^{15}$, or a phenylene group; $R^{15}$ represents a hydrogen atom, or a monovalent organic group.

In formula (A), $R^4$ to $R^6$ are independently a hydrogen atom, or a monovalent substituent. $R^4$ may be a hydrogen atom, or an organic group such as an optionally-substituted alkyl group. Concretely, $R^4$ is preferably a hydrogen atom, a methyl group, an ethyl group, an alkoxy group, or a methyl ester group. $R^5$ and $R^6$ are independently a hydrogen atom, a halogen atom, an amino group, a dialkylamino group, a carboxyl group, an alkoxycarbonyl group, a sulfo group, a nitro group, a cyano group, an optionally-substituted alkyl group, an optionally-substituted aryl group, an optionally-substituted alkoxy group, an optionally-substituted aryloxy group, an optionally-substituted alkylamino group, an optionally-substituted arylamino group, an optionally-substituted alkylsulfonyl group, or an optionally-substituted arylsulfonyl group. Preferably, $R^5$ and $R^6$ are independently a hydrogen atom, a carboxyl group, an alkoxycarbonyl group, an optionally-substituted alkyl group, or an optionally-substituted aryl group.

The substituent that may be introduced into these groups includes a methoxycarbonyl group, an ethoxycarbonyl group, an isopropoxycarbonyl group, a methyl group, an ethyl group, and a phenyl group.

X is an oxygen atom, a sulfur atom, or $-N-R^{15}$. $R^{15}$ is may be an optionally-substituted alkyl group.

In formula (B), $R^7$ to $R^{11}$ are independently a hydrogen atom, or a monovalent substituent. For example, $R^7$ to $R^{11}$ are independently a hydrogen atom, a halogen atom, an amino group, a dialkylamino group, a carboxyl group, an alkoxycarbonyl group, a sulfo group, a nitro group, a cyano group, an optionally-substituted alkyl group, an optionally-substituted aryl group, an optionally-substituted alkoxy group, an optionally-substituted aryloxy group, an optionally-substituted alkylamino group, an optionally-substituted arylamino group, an optionally-substituted alkylsulfonyl group, or an optionally-substituted arylsulfonyl group. Preferably, $R^7$ to $R^{11}$ are independently a hydrogen atom, a carboxyl group, an alkoxycarbonyl group, an optionally-substituted alkyl group, or an optionally-substituted aryl group.

For the substituent that may be introduced into these groups, referred to are those mentioned hereinabove for the groups in formula (A).

Y is an oxygen atom, a sulfur atom, or —N—$R^{15}$. $R^{15}$ may be the same as in formula (A).

In formula (C), $R^{12}$ to $R^{14}$ are independently a hydrogen atom, or a monovalent substituent. Concretely, for example, $R^{12}$ to $R^{14}$ are independently a hydrogen atom, a halogen atom, an amino group, a dialkylamino group, a carboxyl group, an alkoxycarbonyl group, a sulfo group, a nitro group, a cyano group, an optionally-substituted alkyl group, an optionally-substituted aryl group, an optionally-substituted alkoxy group, an optionally-substituted aryloxy group, an optionally-substituted alkylamino group, an optionally-substituted arylamino group, an optionally-substituted alkylsulfonyl group, or an optionally-substituted arylsulfonyl group. Preferably, $R^{12}$ to $R^{14}$ are independently a hydrogen atom, a carboxyl group, an alkoxycarbonyl group, an optionally-substituted alkyl group, or an optionally-substituted aryl group.

For the substituent that may be introduced into these groups, referred to are those mentioned hereinabove for the groups in formula (A).

Z is an oxygen atom, a sulfur atom, —N—$R^{15}$, or a phenylene group. $R^{15}$ may be the same as in formula (A).

Preferred examples of the units having such a radical-polymerizable group of formulae (A) to (C) are mentioned below, to which, however, the invention should not be limited.

1)
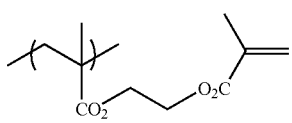

2)
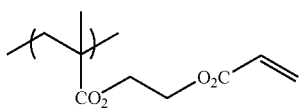

3)
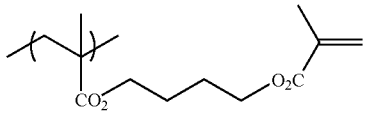

4)
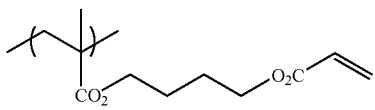

5)
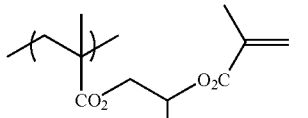

6)
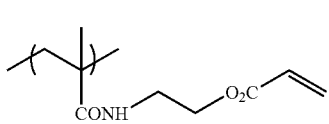

-continued

7)
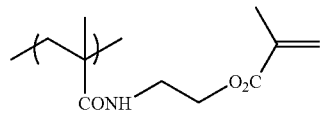

8)
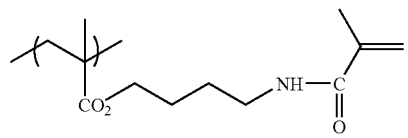

9)
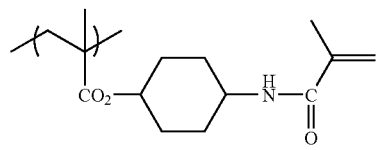

10)
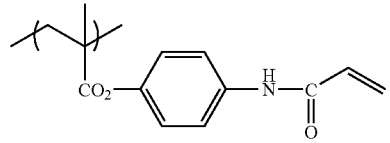

11)
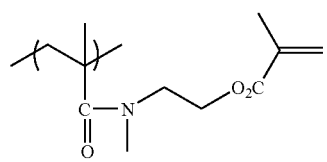

12)
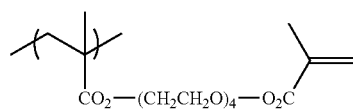

13)
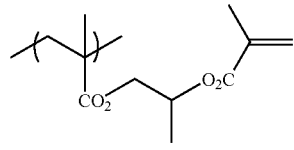

14)
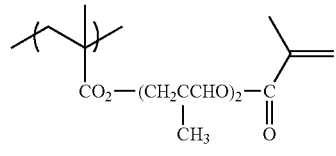

15)
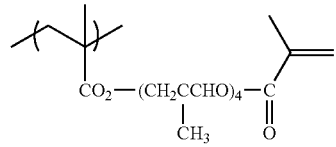

16)
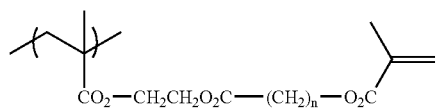
n indicates 4 or 5
17)
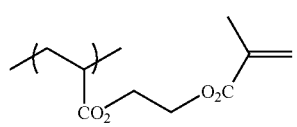
18)
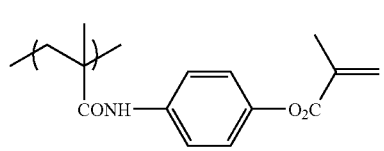
19)
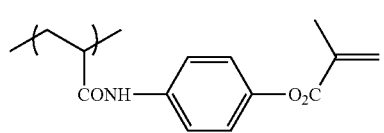
20)
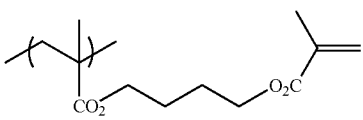
21)
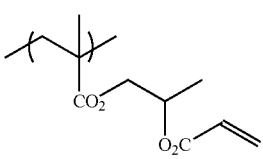
22)
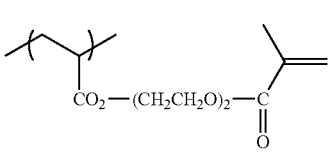
23)
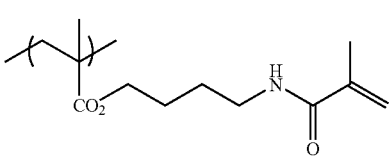
24)
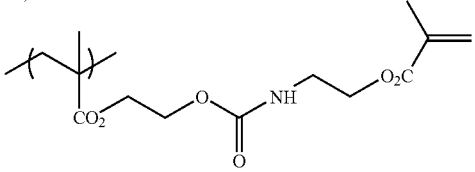
25)
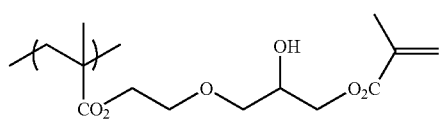
26)
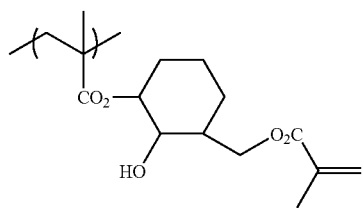
27)
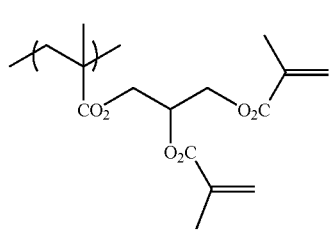
28)
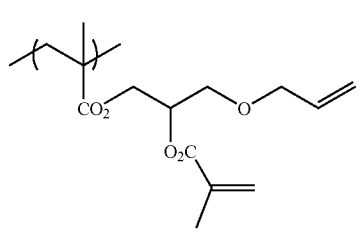
29)
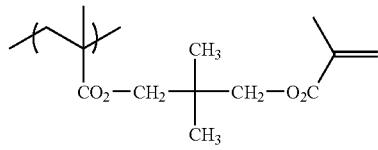
30)
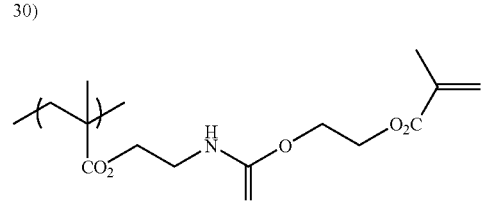
31)
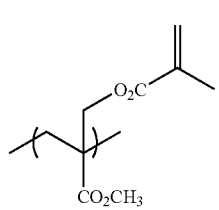

32)
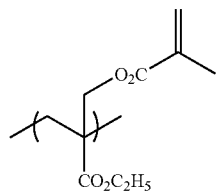
33)
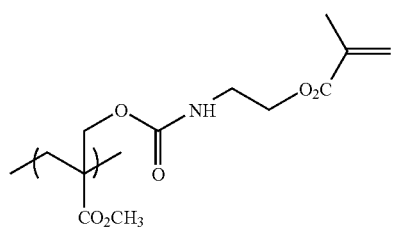
34)
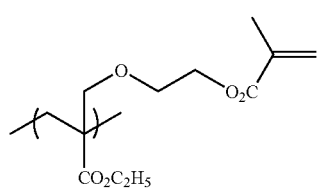
35)
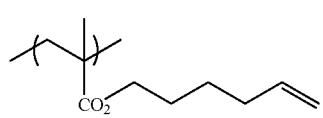
36)
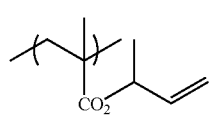
37)
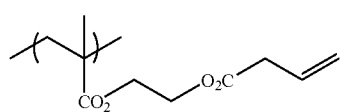
38)
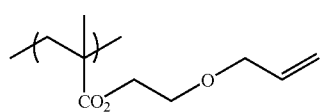
39)
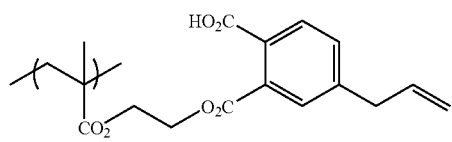
40)
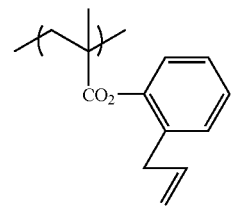
41)
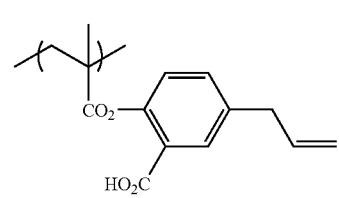
42)
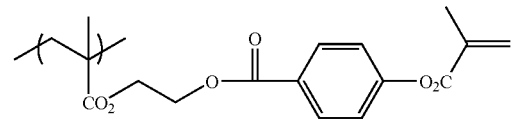
43)
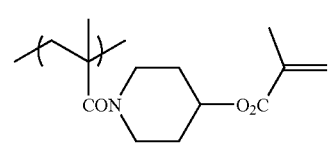
44)
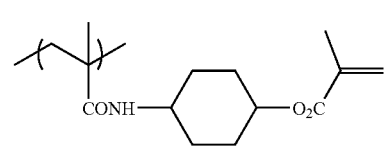
45)
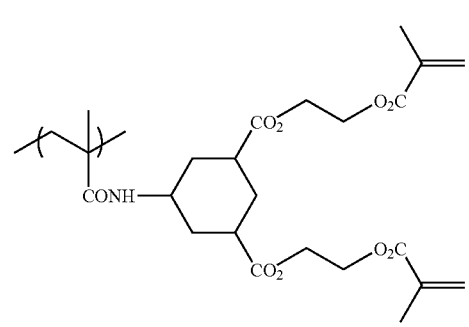
46)
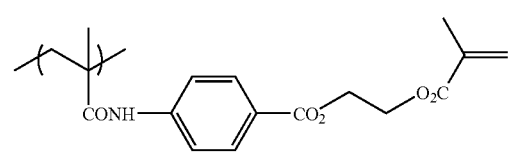

47)

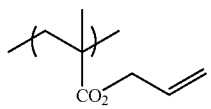

The polymer for the invention that has a radical-polymerizable group of formula (A) may be produced according to at least any one of the following production methods <1> and <2>.

Production Method <1>:

At least one radical-polymerizable compound of the following formula (a) is polymerized to give a polymer compound, and this is deprotonated with a base to thereby remove $Z^1$ to give the intended polymer compound.

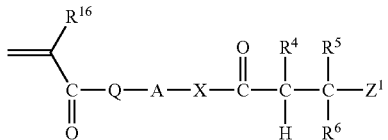
(a)

In formula (a), $R^4$ to $R^6$ have the same meanings as $R^4$ to $R^6$ in formula (A); Z1 represents an anionic removable group; Q represents an oxygen atom, —NH—, or —NR$^{17}$—; $R^{17}$ represents an optionally-substituted alkyl group; $R^{16}$ represents a hydrogen atom, or an optionally-substituted alkyl group, preferably a hydrogen atom, a methyl group, a methylalkoxy group, or a methyl ester group; A represents a divalent organic linking group.

Examples of the radical-polymerizable compound of formula (a) are mentioned below, to which, however, the invention should not be limited.

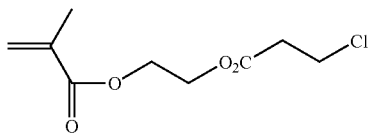
(M-1)

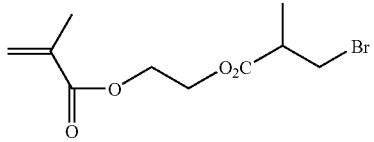
(M-2)

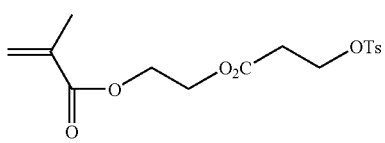
(M-3)

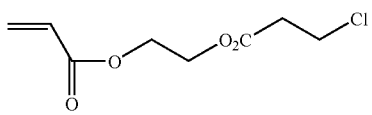
(M-4)

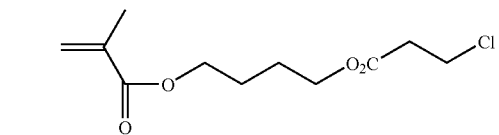
(M-5)

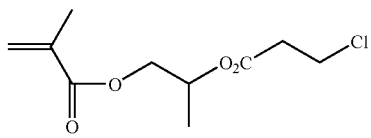
(M-6)

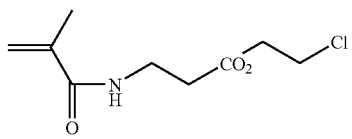
(M-7)

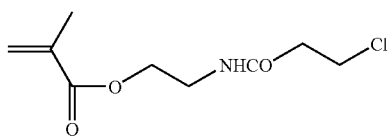
(M-8)

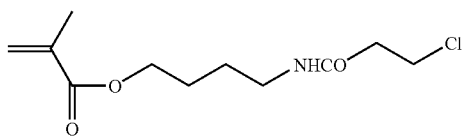
(M-9)

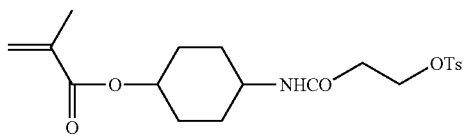
(M-10)

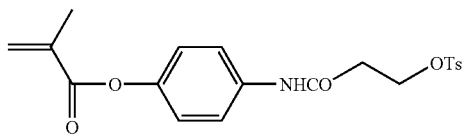
(M-11)

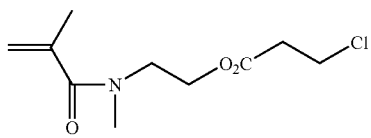
(M-12)

These radical-polymerizable compounds of formula (a) are available as commercial products, or can be readily produced according to the production method shown in Production Examples mentioned below.

At least one radical-polymerizable compound of formula (a) is polymerized optionally along with any other radical-polymerizable compound in a mode of ordinary radical polymerization to give a polymer compound, then a predetermined amount of a base is dropwise added to and reacted with the polymer solution with cooling or heating, and if desired, this is neutralized with acid whereby a group of formula (A) can be introduced into the polymer. For producing the polymer compound, employable is any known suspension polymerization or solution polymerization method.

The base for use herein may be any of an inorganic compound (inorganic base) or an organic compound (organic base). Preferred examples of the inorganic base are sodium hydroxide, potassium hydroxide, sodium carbonate, sodium hydrogencarbonate, potassium carbonate, and potassium hydrogencarbonate. Preferred examples of the organic base are metal alkoxides such as sodium methoxide, sodium ethoxide, potassium t-butoxide; and organic amine compounds such as triethylamine, pyridine, diisopropylethylamine.

Production Method <2>:

At least one functional group-having radical-polymerizable compound is polymerized to give a stem polymer compound (polymer compound to form backbone chain), and this is reacted with a compound having a structure of the following formula (b) at the functional group in the side chains of the stem polymer compound to give the intended polymer compound.

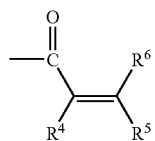

(b)

$R^4$ to $R^6$ in formula (b) have the same meanings as $R^4$ to $R^6$ in formula (A).

Examples of the functional group in the functional group-having radical-polymerizable compound to be used for producing the stem polymer compound according to the production method <2> include a hydroxyl group, a carboxyl group, a carboxylic acid halide group, a carboxylic acid anhydride group, an amino group, a halogenoalkyl group, an isocyanate group, and an epoxy group. Specific examples of the radical-polymerizable group having such a functional group include 2-hydroxyethyl acrylate, 2-hydroxyethyl methacrylate, 4-hydroxybutyl acrylate, 4-hydroxybutyl methacrylate, acrylic acid, methacrylic acid, acrylic acid chloride, methacrylic acid chloride, methacrylic anhydride, N,N-dimethyl-2-aminoethyl methacrylate, 2-chloroethyl methacrylate, 2-isocyanatoethyl methacrylate, glycidyl acrylate, and glycidyl methacrylate.

At least one radical-polymerizable compound having such a functional group is polymerized, and optionally copolymerized with any other radical-polymerizable compound to give a stem polymer compound, and then this may be reacted with a compound having the group of formula (b) to give the desired polymer compound.

Examples of the compounds having the group of formula (b) maybe the same as those mentioned hereinabove for the examples of the functional group-having radical-polymerizable group.

The polymer for the invention that has a radical-polymerizable group of formula (B) may be produced according to at least any one of the following production methods <3> and <4>.

Production Method <3>:

At least one radical-polymerizable compound having an unsaturated group of formula (B) and an ethylenic unsaturated group that is more addition-polymerizable than the unsaturated group is polymerized optionally along with any other radical-polymerizable to give a polymer compound. In this method, the compound used has multiple ethylenic unsaturated groups that differ in point of the addition-polymerizability thereof in one molecule, for example, allyl methacrylate is used.

Examples of the radical-polymerizable compound having an unsaturated group of formula (B) and an ethylenic unsaturated group that is more addition-polymerizable than the unsaturated group of formula (B) include allyl acrylate, allyl methacrylate, 2-allyloxyethyl acrylate, 2-allyloxyethyl methacrylate, propargyl acrylate, propargyl methacrylate, N-allyl acrylate, N-allyl methacrylate, N,N-diallyl acrylate, N,N-diallylmethacrylamide, allylacrylamide, and allylmethacrylamide.

Production Method <4>:

At least one functional group-having radical-polymerizable compound is polymerized to give a polymer compound, and this is reacted with a compound having a structure of the following formula (c) at the functional group in the side chains of the polymer compound to thereby introduce a group of formula (B) into the polymer compound.

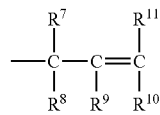

(c)

$R^7$ to $R^{11}$ in formula (c) have the same meanings as $R^7$ to $R^{11}$ in formula (B).

Examples of the functional group-having radical-polymerizable compound for use in the production method <4> may be the same as those of the functional group-having radical-polymerizable compound used in the production method <2>.

Examples of the compound having the structure of formula (c) include allyl alcohol, allylamine, diallylamine, 2-allyloxyethyl alcohol, 2-chloro-1-butene, and allyl isocyanate.

The polymer for the invention that has a radical-polymerizable group of formula (C) may be produced according to at least any one of the following production methods <5> and <6>.

Production Method <5>:

At least one radical-polymerizable compound having an unsaturated group of formula (C) and an ethylenic unsaturated group that is more addition-polymerizable than the unsaturated group is polymerized optionally along with any other radical-polymerizable to give a polymer compound.

Examples of the radical-polymerizable compound having an unsaturated group of formula (C) and an ethylenic unsaturated group that is more addition-polymerizable than the unsaturated group of formula (C) include vinyl acrylate, vinyl methacrylate, 2-phenylvinyl acrylate, 2-phenylvinyl methacrylate, 1-propenyl acrylate, 1-propenyl methacrylate, vinylacrylamide, and vinylmethacrylamide.

Production Method <6>:

At least one functional group-having radical-polymerizable compound is polymerized to give a polymer compound, and this is reacted with a compound having a structure of the following formula (d) at the functional group in the side chains of the polymer compound to thereby introduce a group of formula (C) into the polymer compound.

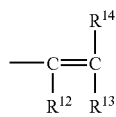
(d)

$R^{12}$ to $R^{14}$ in formula (d) have the same meanings as $R^{12}$ to $R^{14}$ in formula (C).

Examples of the functional group-having radical-polymerizable compound for use in the production method <6> may be the same as those of the functional group-having radical-polymerizable compound used in the production method <2>.

Examples of the compound having the structure of formula (d) include 2-hydroxyethyl monovinyl ether, 4-hydroxybutyl monovinyl ether, diethylene glycol monovinyl ether, and 4-chloromethylstyrene.

Production methods <1> to <6> for the polymer for the invention that has a radical-polymerizable group of formulae (A) to (C) are described above. When the specific binder polymer of the invention is produced according to these production methods <1> to <6>, the radical-polymerizable compound in these methods is copolymerized with units of formula (1) in a predetermined ratio.

Formulae (D) and (E) are described.

In formula (D), $R^{16}$ represents a hydrogen atom or a methyl group; $R^{17}$ represents a substitutable atom or atomic group; and k indicates an integer of from 0 to 4. The radical-polymerizable group of formula (D) bonds to the polymer backbone via a single bond or via a linking group of an atom or an atomic group, and its bonding mode is not specifically defined.

In formula (E), $R^{18}$ represents a hydrogen atom or a methyl group; $R^{19}$ represents a substitutable atom or atomic group; m indicates an integer of from 0 to 4; and $A^-$ represents an anion. The pyridinium ring of the type may be in the form of benzopyridinium having a benzene ring condensed as a substituent thereto. This includes a quinolinium group and an isoquinolinium group. The radical-polymerizable group of formula (E) bonds to the polymer backbone via a single bond or via a linking group of an atom or an atomic group, and its bonding mode is not specifically defined.

Preferred examples of the units (repetitive units) having the radical-polymerizable group of formulae (D) or (E) are mentioned below, to which, however, the invention should not be limited.

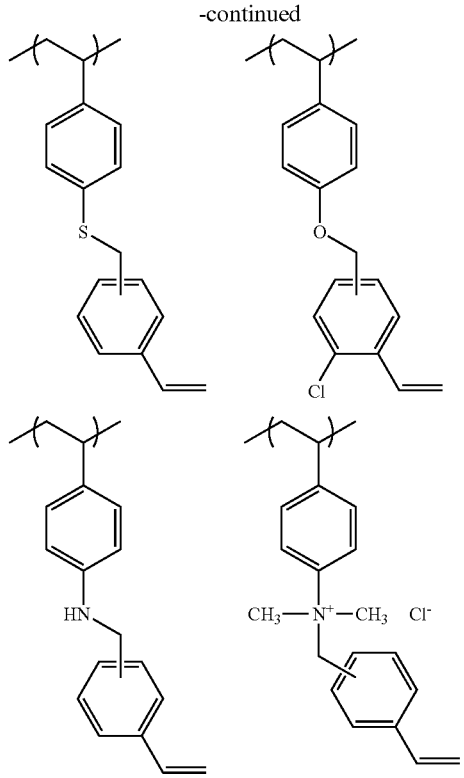

-continued

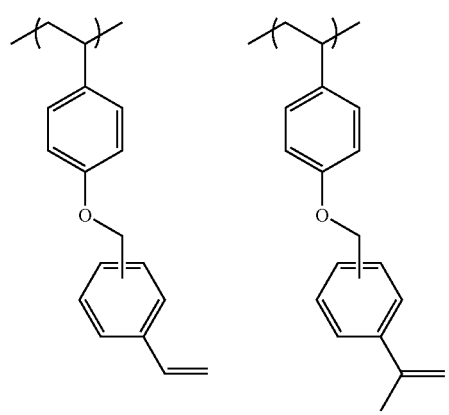

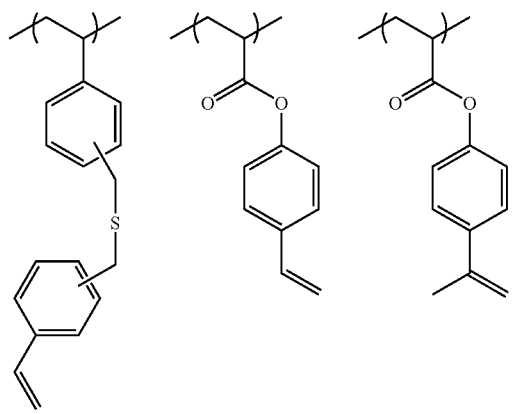

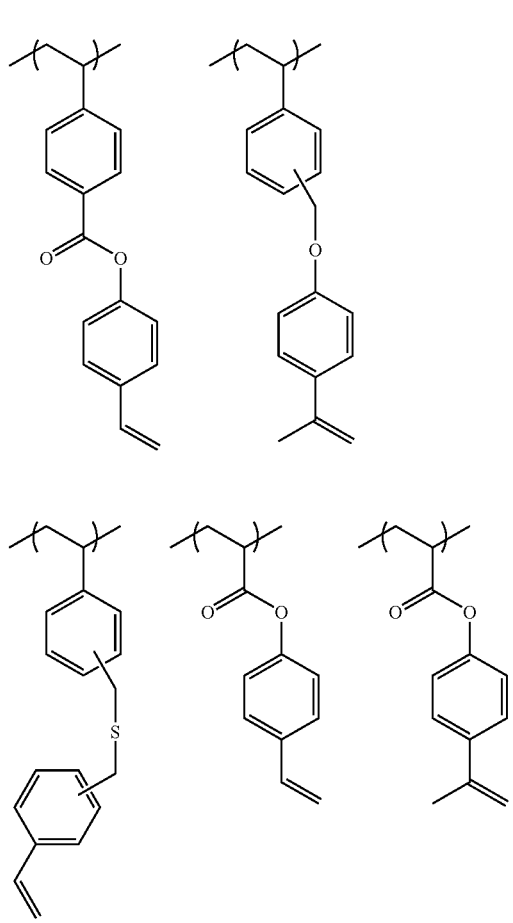

-continued
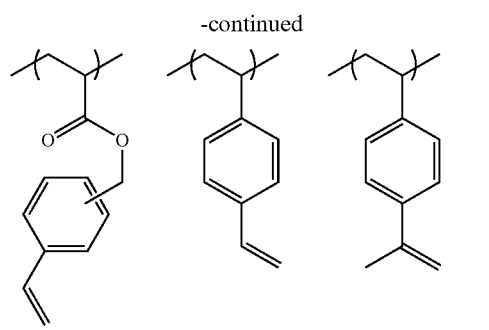
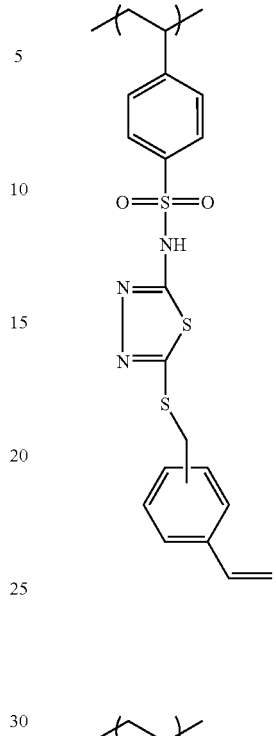
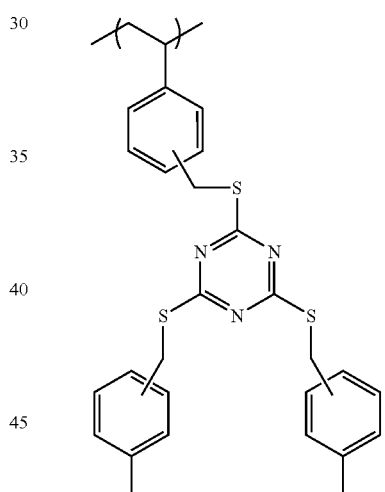
-continued
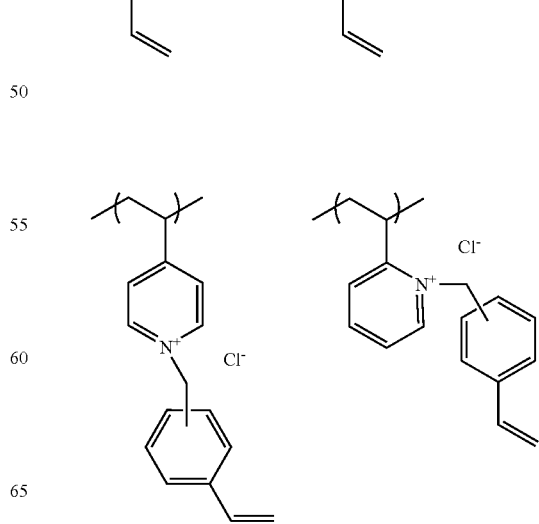

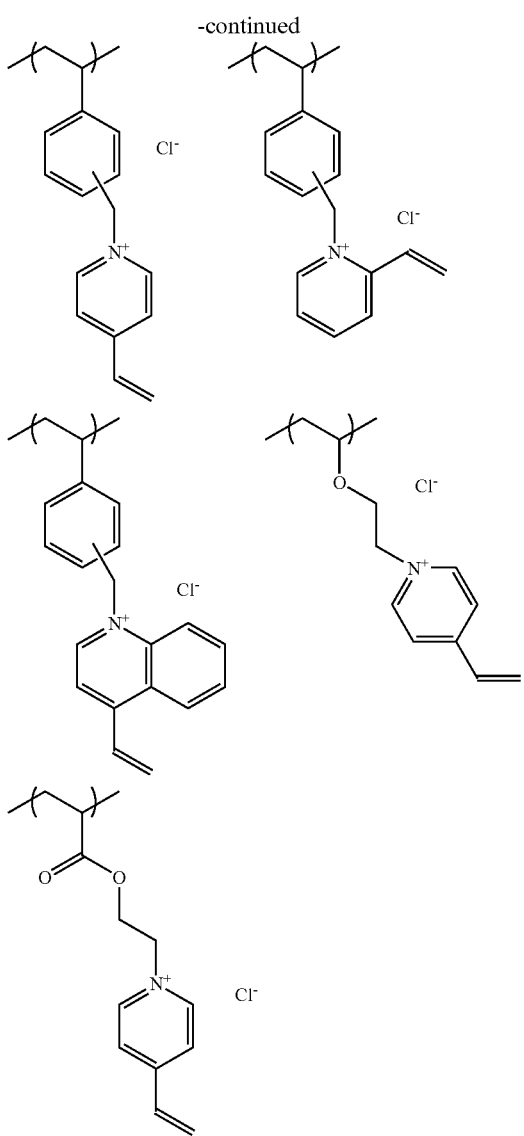

Of the radical-polymerizable groups of formulae (A) to (E) mentioned above, preferred are those of formulae (A) and (B). More preferred are the radical-polymerizable groups of formula (4); and most preferred are those where $R^4$ is a hydrogen atom or a methyl group, and X is an oxygen atom or a nitrogen atom.

Apart from the indispensable component thereof, the carboxyl group-having units, and the preferred radical-polymerizable group-having units thereof mentioned above, the alkali-soluble polymer of the invention may be further copolymerized with any other component such as those mentioned hereinunder. Not specifically defined, any known radical-polymerizable monomers may be used for the comonomer component. Concretely mentioned are monomers described in *Polymer Data Handbook—Primary Edition—* (edited by the Polymer Society of Japan, Baifukan, 1986). One or more such comonomers may be used herein either singly or as combined.

Above all, especially preferred comonomers are radical-polymerizable group-having monomers mentioned below.

For example, they are radical-polymerizable compounds selected from acrylates, methacrylates, N,N-disubstituted acrylamides, N,N-disubstituted methacrylamides, styrenes, acrylonitriles, and methacrylonitriles.

Concretely, they include acrylates such as alkyl acrylates (in which the alkyl group preferably has from 1 to 20 carbon atoms) (e.g., methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, tetrahydrofurfuryl acrylate), aryl acrylates (e.g., phenyl acrylate), alkyl methacrylates (in which the alkyl group preferably has from 1 to 20 carbon atoms) (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate), aryl methacrylates (e.g., phenyl methacrylate, cresyl methacrylate, naphthyl methacrylate), styrenes such as styrene, alkylstyrenes (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, acetoxymethylstyrene), alkoxystyrenes (e.g., methoxystyrene, 4-methoxy-3-methylstyrene, dimethoxystyrene), halogenostyrenes (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene), acrylonitrile, and methacrylonitrile.

Of those radical-polymerizable compounds, preferred are acrylates, methacrylates and styrenes.

One or more of these radical-polymerizable compounds may be used herein either singly or as combined.

Specific examples of the alkali-soluble polymer of the invention are described below. (i-1) to (i-46) have the above-mentioned radical-polymerizable group, and (ii-1) to (ii-5) do not have it. However, the invention should not be limited to these.

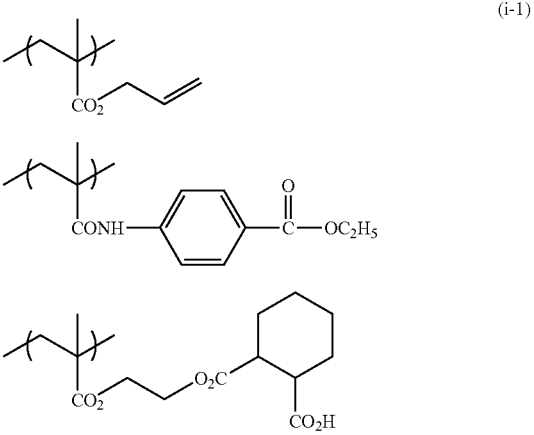

(i-1)

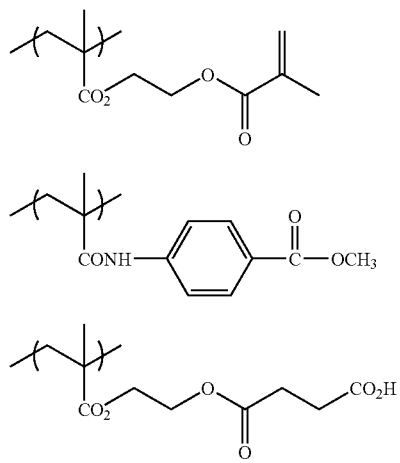
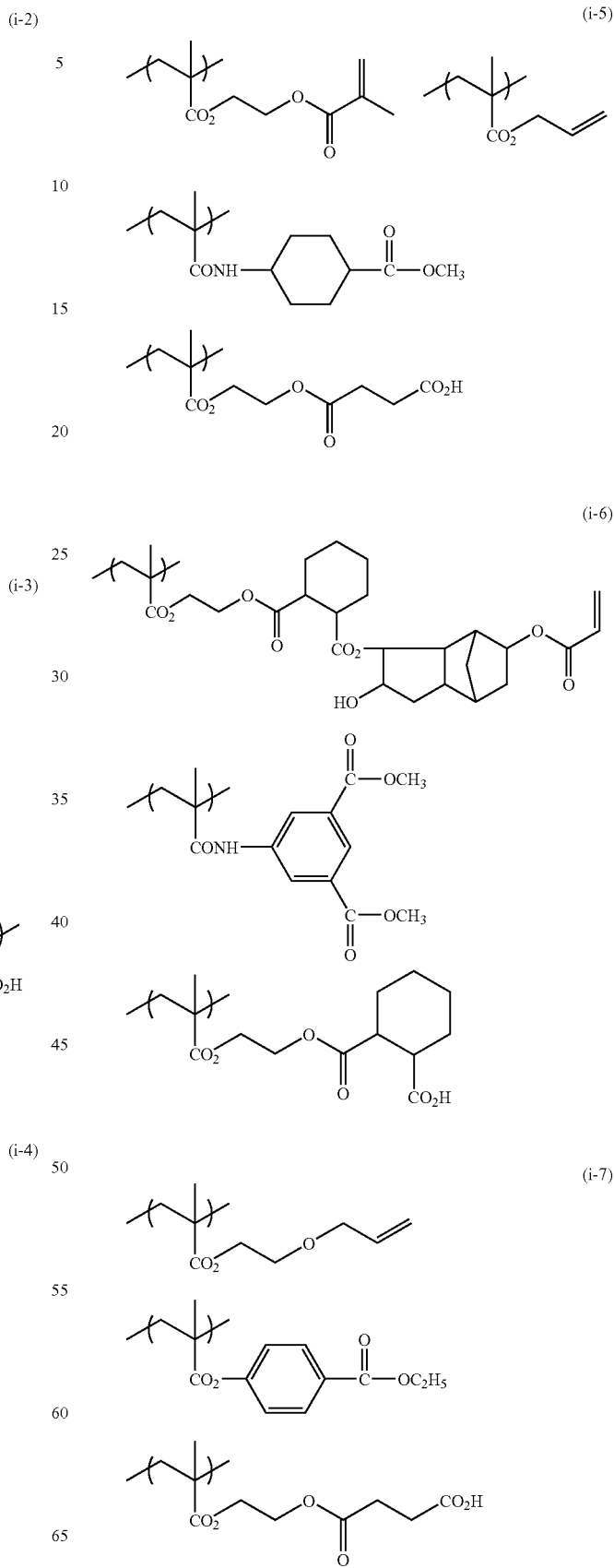

-continued
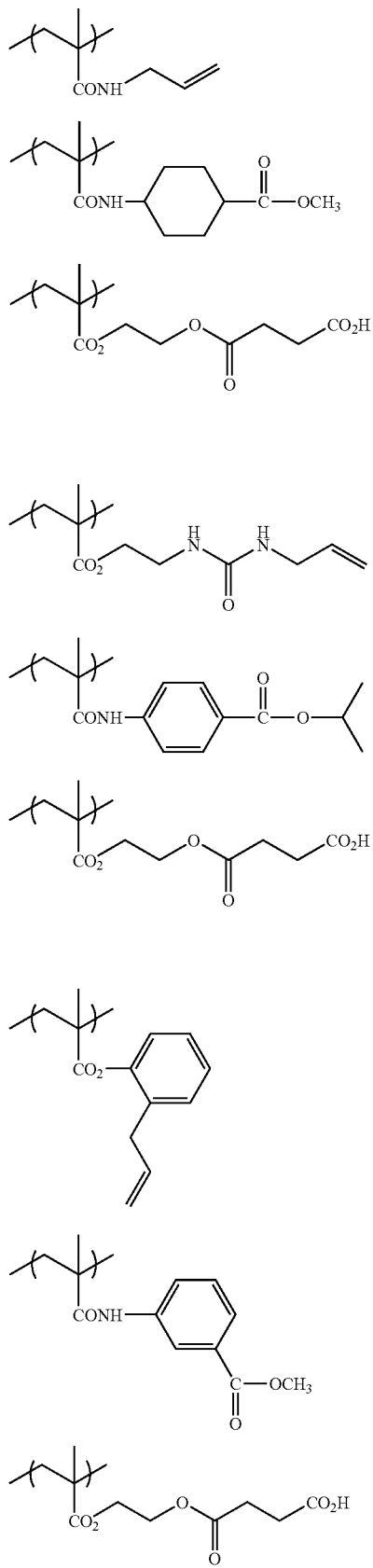
(i-8)
(i-9)
(i-10)
-continued
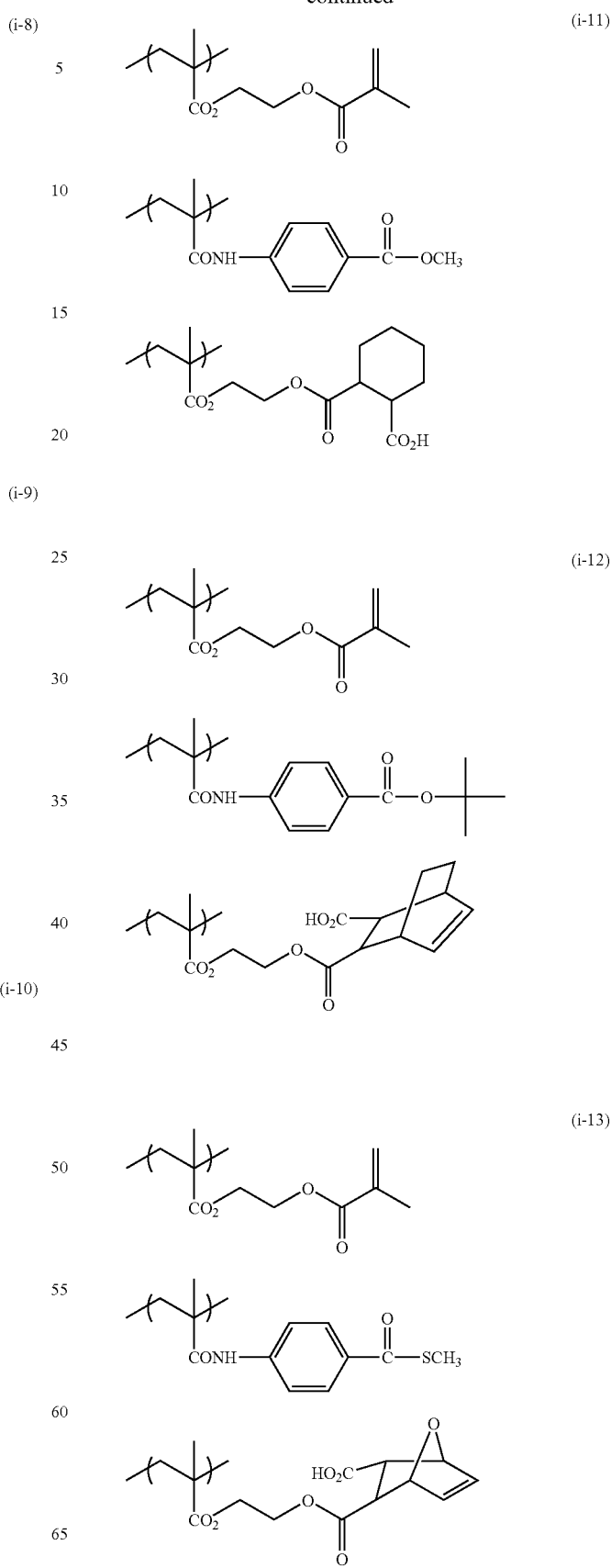
(i-11)
(i-12)
(i-13)

-continued
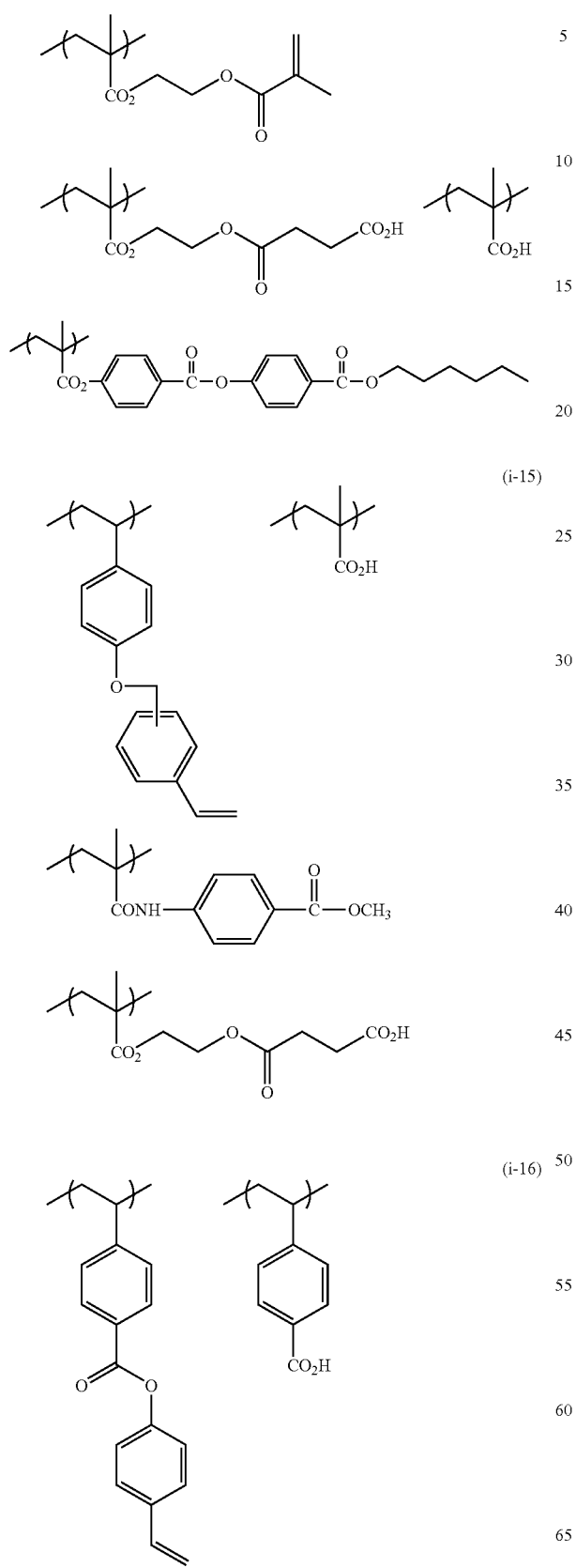
(i-14)
(i-15)
(i-16)
-continued
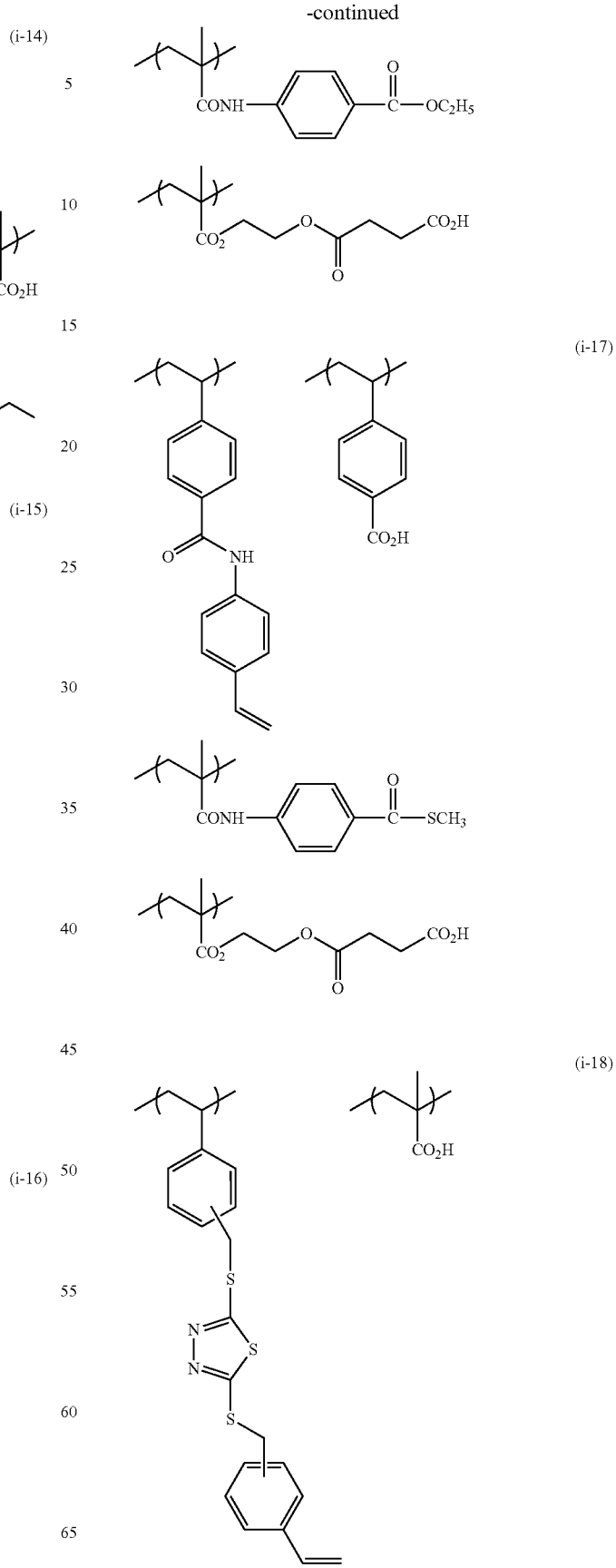
(i-17)
(i-18)

-continued
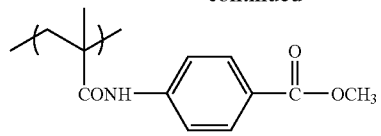
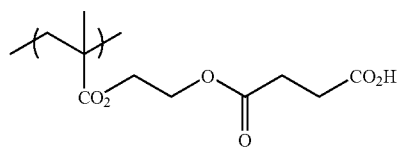
(i-19)
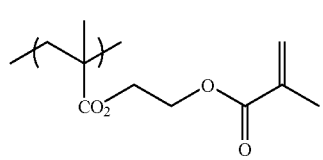
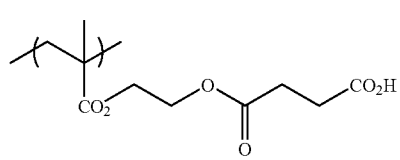
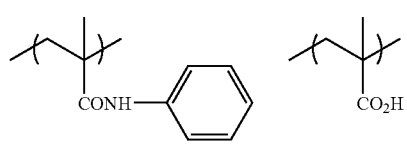
(i-20)
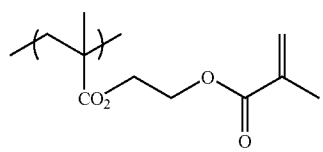
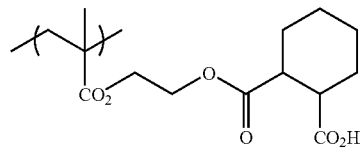
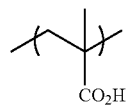
(i-21)
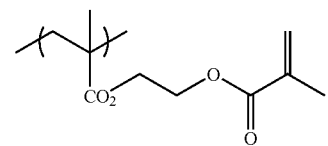
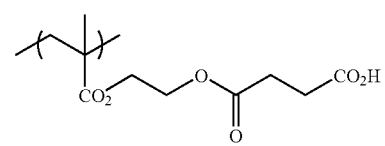
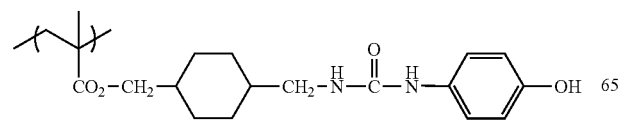
-continued
(i-22)
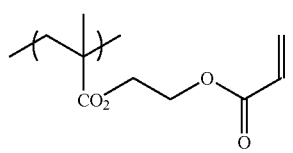
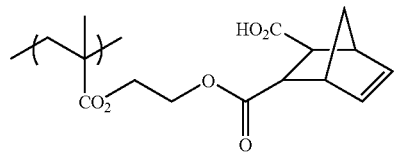
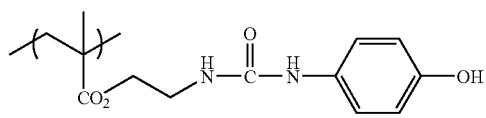
(i-23)
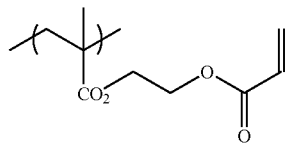
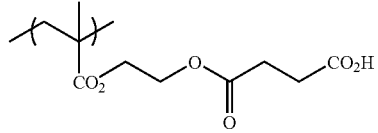
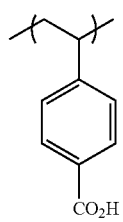
(i-24)
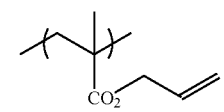
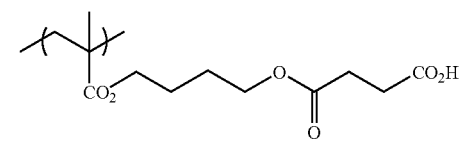
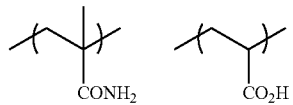

(i-25)
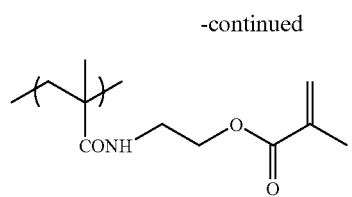
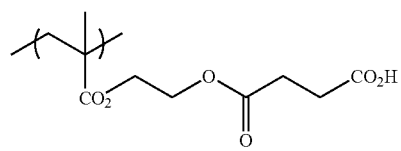
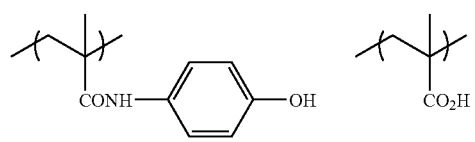
(i-26)
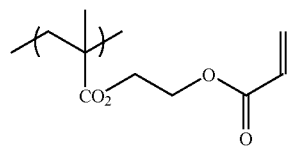
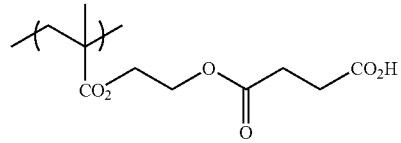
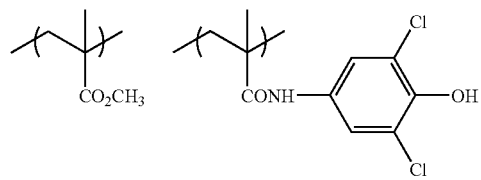
(i-27)
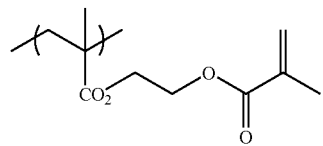
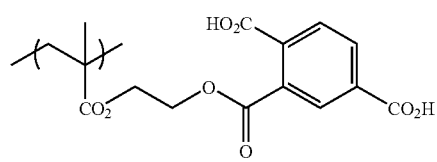
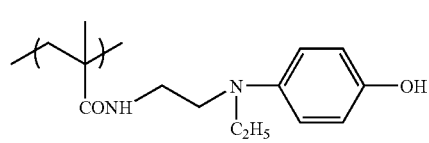
(i-28)
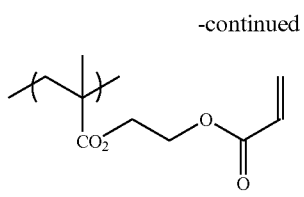
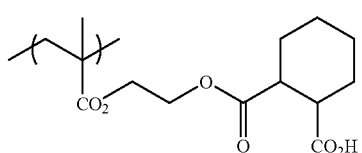
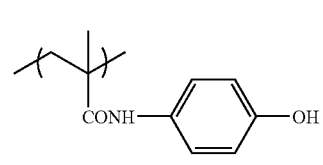
(i-29)
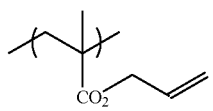
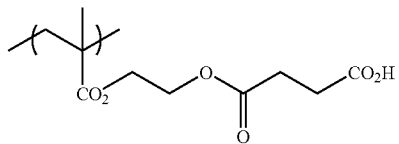
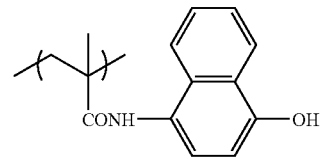
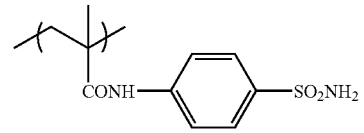
(i-30)
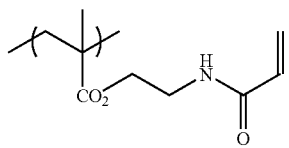
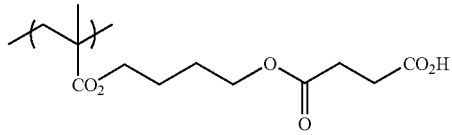
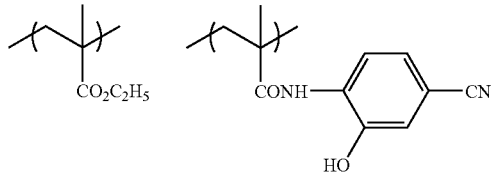

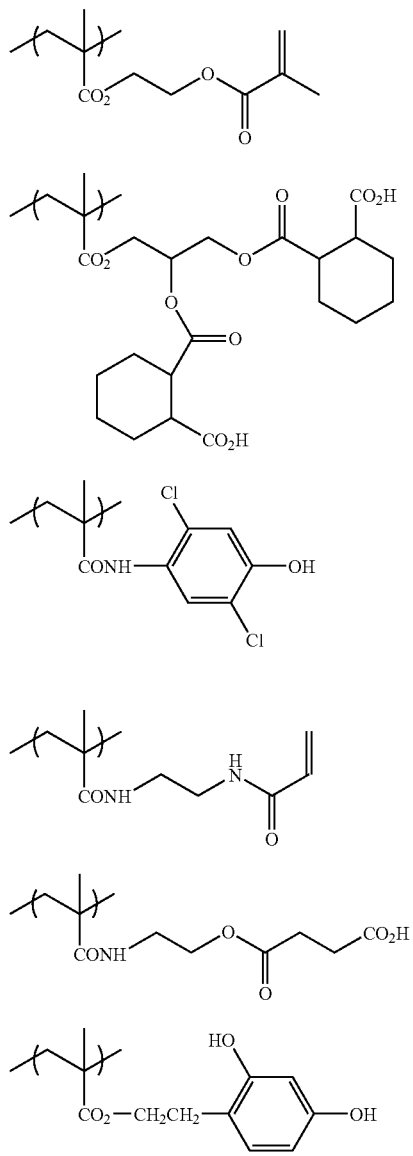

-continued (i-37)

(i-38)

(i-39)

(i-40)

-continued (i-41)

(i-42)

(i-43)

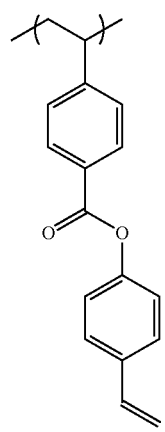
(i-44)
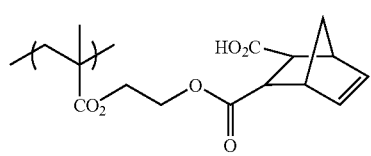
(i-45)
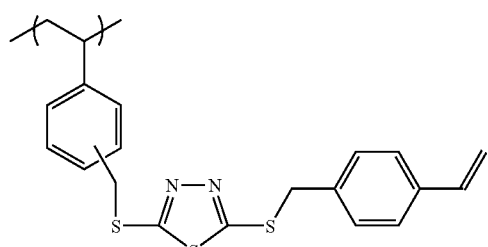
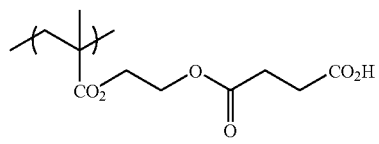
(i-46)
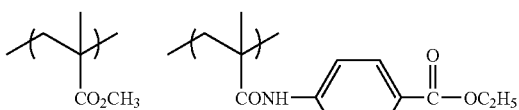
(ii-1)
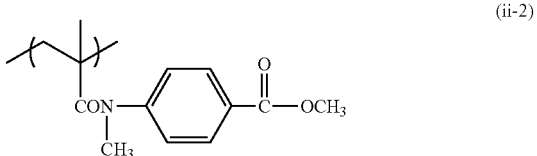
(ii-2)
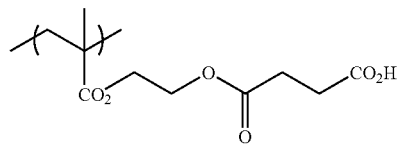
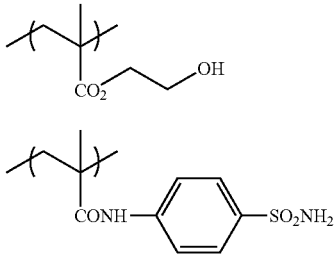
(ii-3)
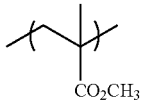
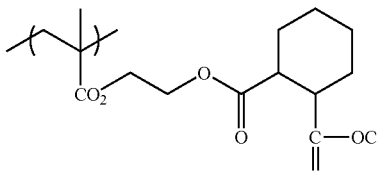
(ii-4)
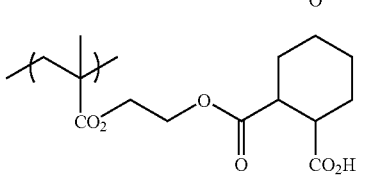

-continued

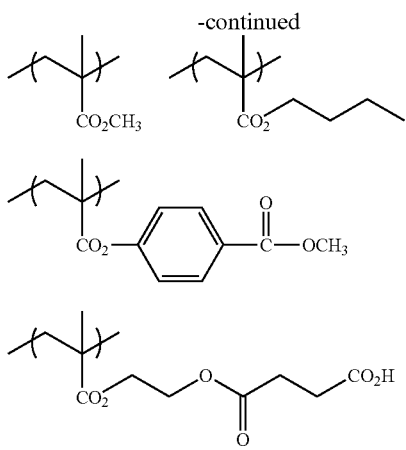

For example, when the alkali-soluble polymer of the invention is used in a component of a recording layer of lithographic printing plate precursors, the molecular weight of the polymer may be suitably determined from the viewpoint of the image-formability of the precursors and the printing durability of the printing plates from the precursors. In general, when the molecular weight of the polymer increases, then the printing durability will be good but the image-formability may be poor. On the contrary, when the molecular weight of the polymer is low, then the image-formability will be good but the printing durability may be poor. Preferably, the molecular weight of the alkali-soluble polymer is from 400 to 6,000,000, more preferably from 900 to 600,000 in terms of the weight-average molecular weight thereof.

[Polymerizable Composition]

The polymerizable composition of the invention comprises, as the indispensable components thereof, (A) the alkali-soluble polymer of the invention that has the specific structure and the specific physical properties as mentioned above, (B) an ethylenic unsaturated bond-having compound and (C) a compound of generating a radical by light or heat, preferably containing an optional component (D) sensitizing dye.

In the polymerizable composition, the compound (C) of generating a radical by light or heat is decomposed to form a radical, and triggered by the thus-formed radical, the ethylenic unsaturated bond-having compound (B) undergoes polymerization. The polymerizable composition of the invention is usable in various applications that utilize the mechanism thereof. For example, it is suitable to image-recording layers of negative image-recording materials (e.g., lithographic printing plate precursors) and to high-sensitivity holographic materials, for example, those of forming holograms on the basis of the refractivity change with polymerization thereof. In addition, it is usable in producing electronic materials such as photoresists. Of those, the polymerizable composition of the invention is, when further containing a sensitizing dye, especially favorable to image recording layers of negative lithographic printing plate precursors that accept direct image formation thereon through scanning exposure.

When the polymerizable composition of the invention is applied to negative image-forming materials, it is desirable that the image-recording layer contains, as the sensitizing dye (D), an IR-absorbent so that the materials could be especially favorable for plate-making in a mode of direct image formation thereon with laser light having a wavelength of from 300 to 1,200 nm.

The components of the polymerizable composition of the invention are described in detail hereinunder.

[(A) Alkali-Soluble Polymer Containing a Unit Structure Having a Carboxyl Group of Formula (1) at a Side Chain of the Unit Structure, and Forming No Deposition when Dissolved in an Aqueous Alkali Solution Having a pH of at Least 10 and Left at Room Temperature for 60 Days]

The component (A) of the polymerizable composition of the invention is at least one alkali-soluble polymer of the invention having the specific physical properties mentioned above (hereinafter referred to as "specific alkali-soluble polymer") and selected from the above-mentioned preferred embodiments of the alkali-soluble polymer.

Apart from the specific alkali-soluble polymer, the polymerizable composition of the invention may contain one or more other binder polymers. The amount of the additional binder polymer that may be combined with the specific alkali-soluble polymer in the polymerizable composition of the invention may be from 1 to 60% by weight, preferably from 1 to 40% by weight, more preferably from 1 to 20% by weight of the total weight of all the binder polymer component in the composition.

Any known ones may be used for the additional binder polymer with no limitation. Concretely for it, preferred are acrylic-based binders and urethane binders well used in the art.

In the polymerizable composition of the invention, the total amount of all the binder polymer (specific alkali-soluble polymer alone or mixture) may be suitably determined. For example, when the polymerizable composition is used in the recording layer of image-recording materials, then the total amount of all the binder polymer in the composition may be generally from 10 to 90% by weight, preferably from 20 to 80% by weight, more preferably from 30 to 70% by weight of the total weight of the nonvolatile component therein.

[(B) Ethylenic Unsaturated Bond-Having Compound]

The ethylenic unsaturated bond-having compound (B) for use in the invention is an addition-polymerizable compound having at least one ethylenic unsaturated double bond, and is selected from compounds having at least one, preferably at least two ethylenic unsaturated bonds. The compound group is well known in the industrial field of the art, and any one belonging to it may be used in the invention with no specific limitation. For example, the compounds in the group have various chemical morphologies of monomers, prepolymers, or that is, dimers, trimers and oligomers, as well as their mixtures and copolymers. Examples of the monomers and their copolymers are unsaturated carboxylic acids (e.g., acrylic acid, methacrylic acid, itaconic acid, crotonic acid, isocrotonic acid, maleic acid) and their esters, and amides. Preferred for use herein are esters of unsaturated carboxylic acids and aliphatic polyalcohols, and amides of unsaturated carboxylic acids and aliphatic polyamines. Also preferred for use herein are addition-reaction products of unsaturated carboxylates or amides having a nucleophilic substituent such as hydroxyl, amino or mercapto group and monofunctional or polyfunctional isocyanates or epoxides; and dehydrating condensation products thereof with monofunctional or polyfunctional carboxylic acids. In addition, also preferred are addition-reaction products of unsaturated carboxylates or amides having an electrophilic substituent such as isocyanate or epoxy group and monofunctional or polyfunctional alcohols, amines or thiols; and substitution-reaction products of unsaturated carboxylates or amides having a removable substituent such as halogen or tosyloxy group and monofunctional or polyfunctional alcohols, amines or thiols. As other examples, the above-mentioned unsaturated carboxylic acids may be replaced with unsaturated phosphonic acids, styrenes or vinyl ethers, and the compounds of those groups are also usable herein.

Specific examples of monomers usable herein, esters of aliphatic polyalcohols with unsaturated carboxylic acids are mentioned below. Acrylates include ethylene glycol diacrylate, triethylene glycol diacrylate, 1,3-butanediol diacrylate, tetramethylene glycol diacrylate, propylene glycol diacrylate, neopentylglycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, and polyester acrylate oligomers.

Methacrylates include tetramethylene glycol dimethacrylate, triethylene glycol dimethacrylate, neopentylglycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]-dimethylmethane, and bis[p-(methacryloxyethoxy)phenyl]dimethylmethane.

Itaconates include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate. Crotonates include ethylene glycol dicrotonate, tetramethylene glycol dicrotonate, pentaerythritol dicrotonate, and sorbitol tetracrotonate. Isocrotonates include ethylene glycol diisocrotonate, pentaerythritol diisocrotonate, and sorbitol tetraisocrotonate. Maleates include ethylene glycol dimaleate, triethylene glycol dimaleate, pentaerythritol dimaleate, and sorbitol tetramaleate.

Preferred examples of other esters are aliphatic alcohol esters as in JP-B 46-27926 and 51-47334, and JP-A 57-196231; those having an aromatic skeleton as in JP-A 59-5240, 59-5241 and 2-226149; and those having an amino group as in JP-A1-165613. Mixtures of the above-mentioned ester monomers may also be used herein.

Specific examples of monomers, amides of aliphatic, polyamines with unsaturated carboxylic acids, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, and xylylene bismethacrylamide. Other preferred examples of amide monomers are those having a cyclohexylene structure as in JP-B 54-21716.

In addition, urethane-based addition-polymerizable compounds produced through addition reaction of isocyanate and hydroxyl group are also preferred for use herein. For example, they include vinylurethane compounds having at least two polymerizable vinyl groups in one molecule, which are produced through addition reaction of a polyisocyanate compound having at least two isocyanate groups in one molecule with a vinyl monomer having a hydroxyl group of the following formula, such as those described in JP-B 48-41708.

$$CH_2=C(R^4)COOCH_2CH(R^5)OH$$

wherein, $R^4$ and $R^5$ each represent H or $CH_3$.

Also, urethane acrylates as in JP-A 51-37193, and JP-B 2-32293 and 2-19765; and ethyleneoxide skeleton-having urethane compounds as in JP-B 58-49860, 56-17654, 62-39417 and 62-39418 are also preferred for use herein. Further, addition-polymerizable compounds having an amino structure or a sulfido structure in the molecule, as in JP-A 63-277653, 63-260909 and 1-105238, provide rapidly-processable image-recording materials.

Other examples also usable herein are polyfunctional acrylates and methacrylates such as polyester acrylates, and epoxy acrylates prepared through reaction of epoxy resins and (meth)acrylic acids. In addition, further mentioned are specific unsaturated compounds described in JP-B 46-43946, 1-40337, 1-40336; and vinylphosphonic acid compounds as in JP-A 2-25493. In some cases, perfluoroalkyl-containing structures as in JP-A 61-22048 are preferred. Further, photocurable monomers and oligomers as described in *Nippon Secchaku Kyokai-Shi*, Vol. 20, No. 7, pages 300 to 308 (1984) can be used.

In addition, compounds having at least two styrenic double bonds in the molecule are also preferably used herein. Concretely, they include compounds having at least two functional groups of formula (D) or (E) in the molecule. Specific examples of the compounds are mentioned below.

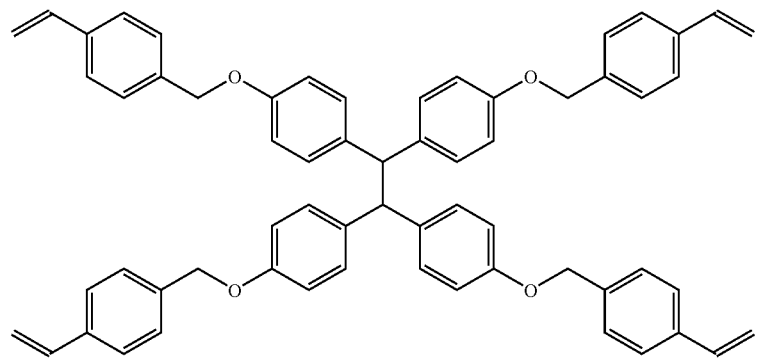

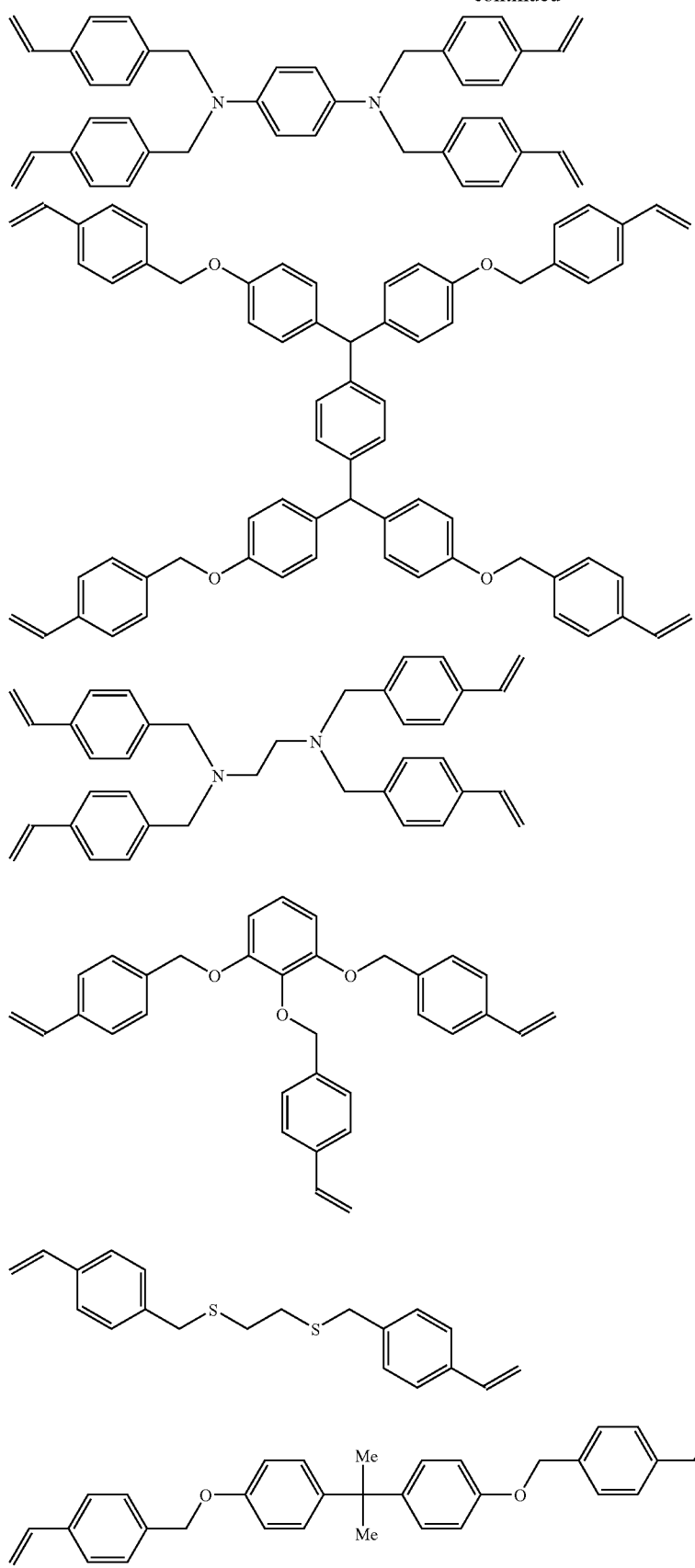
-continued

-continued

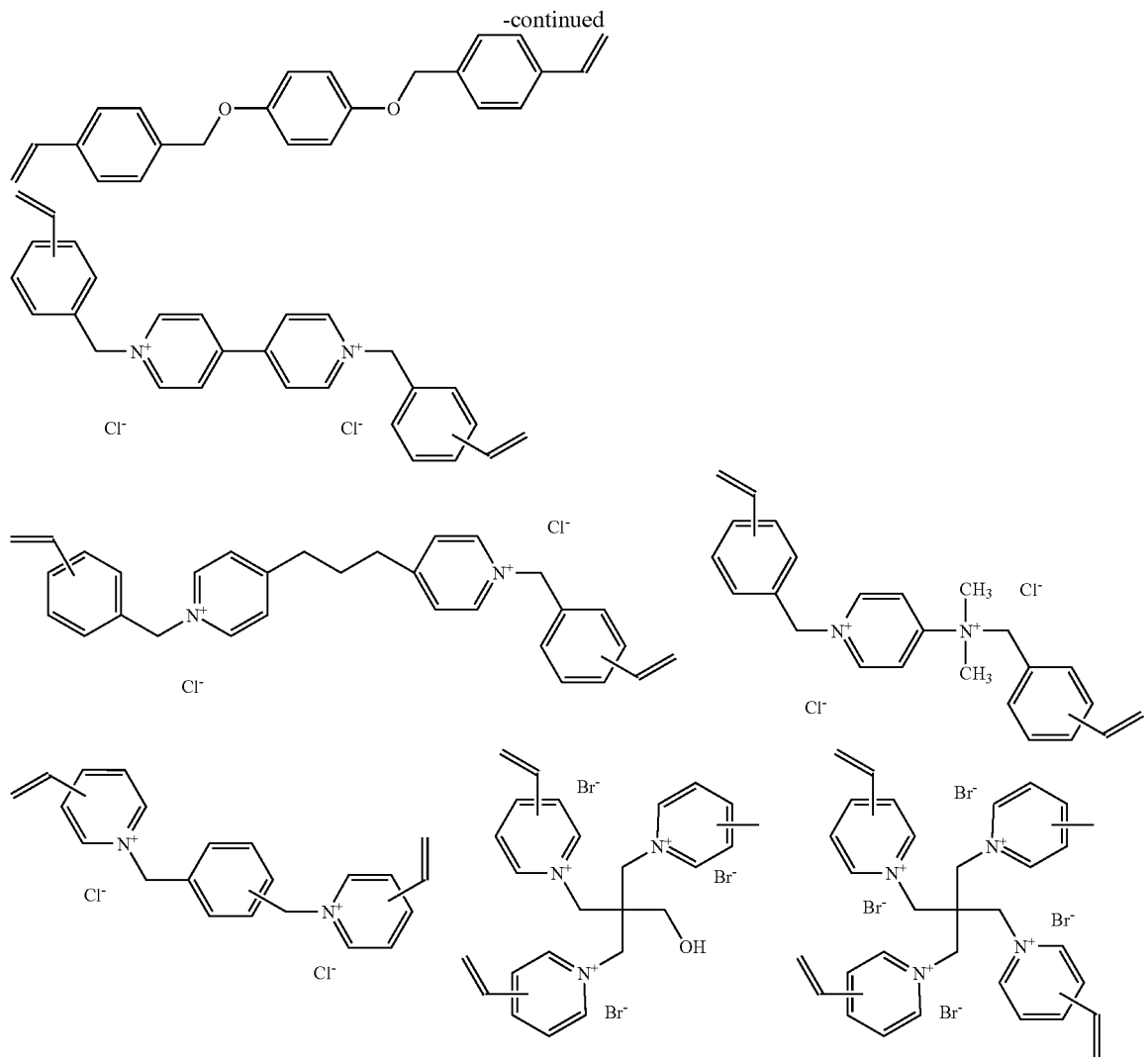

The details regarding the structure of the addition-polymerizable compound, ethylenic-unsaturated bond-having compound (B), the mode of using it as to whether it is used alone or as combined with any other, and the amount thereof to be used may be determined in any desired manner depending on the performance design of the final polymerizable composition of the invention. For example, when the polymerizable composition of the invention is used in the recording layer of negative image-forming materials, then the compound (B) may be selected from the following viewpoint. In point of the photosensitivity thereof, the unsaturated group content of the compound per molecule is preferably larger. In many cases, bifunctional or more polyfunctional compounds are preferred. For increasing the strength of the image area, or that is, the cured film containing it, trifunctional or more polyfunctional compounds are preferred. Further, compounds that differ in point of the number of the functional groups therein and of the type of the polymerizable group therein (for example, acrylates, methacrylates, styrene compounds, vinyl ether compounds) may be combined to thereby control both the photosensitivity of the compound and the mechanical strength of the processed materials. Compounds having a large molecular weight and compounds having a high degree of hydrophobicity are good in point of the photosensitivity and the film strength, but are often unfavorable since their developability is not good and they may form depositions in developer. In addition, the compatibility of the component with other components (e.g., components (A), component (C), dye) in the image-recording layer of negative image-recording materials and the dispersibility thereof in those components are also important factors in selecting and using the addition-polymerizable compound for the component (B). For example, using low-purity compounds or combining two or more different types of compounds may improve the compatibility of the compounds with such other components.

In particular, when the polymerizable composition of the invention is used in the recording layer of lithographic printing plate precursors, then a specific structure may be selected for the compound (B) for the purpose of increasing the adhesiveness of the recording layer to the support and the overcoat layer mentioned below of the plate precursors. The blend ratio of the addition-polymerizable compound in the recording layer will be preferably larger for higher sensitivity of the layer. If too large, however, it may cause unfavorable phase separation or cause some problems in the process of producing the precursor owing to the stickiness of the recording layer (for example, the component of the recording layer may transfer or adhere to others to cause process failure), or the excess compound will precipitate in developer. From these viewpoints, the amount of the component (B), addition-polymerizable compound in the recording layer is preferably from 5 to 80% by mass, more preferably from 25 to 75% by mass relative to the nonvolatile component of the layer. Either singly or as combined, one or more compounds may be used for the component (B) in the layer.

When the polymerizable composition of the invention is applied to lithographic printing plate precursors in that manner, then the structure, the blend ratio and the amount of the addition-polymerizable compound for the component (B) may be suitably determined depending on various factors such as the degree of polymerization retardation by oxygen, the resolution, the fogging resistance, the refractivity change and the surface stickiness. As the case may be, multi-layer constitutions and coating methods of undercoating or overcoating may apply to the plate precursors.

[(C) Compound of Generating Radical by Light or Heat]

The compound (C) of generating a radical by light or heat (hereinafter referred to as radical generator) is for initiating and promoting the curing reaction of the ethylenic unsaturated bond-having compound (B) in the composition of the invention. The radical generator (C) is a compound which, when exposed to light or heat, decomposes under heat to form a radical. When the radical generator of the type is combined with the sensitizing dye (D) mentioned below and when this is irradiated with laser for exposure, then the sensitizing dye (D) may absorb the laser light to generate heat, and the compound may generate a radical by the light or heat. The combination enables high-sensitivity image formation.

Preferred examples of the radical generator for the component (C) include (a) an aromatic ketone, (b) an onium salt compound, (c) an organic peroxide, (d) a thio compound, (e) a hexaarylbiimidazole compound, (f) a ketoxime ester compound, (g) a borate compound, (h) an azinium compound, (i) a metallocene compound, (j) an active ester compound, and (k) a compound having a carbon-halogen bond. Specific examples of (a) to (k) are mentioned below, to which, however, the invention should not be limited.

(a) Aromatic Ketone;

Preferred examples of the aromatic ketone (a) include compounds having a benzophenone skeleton or a thioxantone skeleton as described in J. P. Fouassier and J. F. Rabek, *Radiation Curing in Polymer Science and Technology*, pages 77 to 117 (1993).

More preferred examples of the aromatic ketone (a) include α-thiobenzophenone compounds as in JP-B 47-6416; benzoin ether compounds as in JP-B-47-3981; α-substituted benzoin compounds as in JP-B 47-22326; benzoin derivatives as in JP-B 47-23664; aroylphosphonates as in JP-A 57-30704; dialkoxybenzophenones as in JP-B 60-26483; benzoin ethers as in JP-B 60-26403, JP-A 62-81345; α-aminobenzophenones as in U.S. Pat. No. 4,318,791, EP 0284561A1; p-di(dimethylaminobenzoyl) benzenes as in JP-A 2-211452; thio-substituted aromatic ketones as in JP-A 61-194062; acylphosphine sulfides as in JP-B 2-9597; acylphosphines as in JP-B 2-9596; thioxanthones as in JP-B 63-61950; and coumarins as in JP-B 59-42864.

(b) Onium Salt Compound:

The onium salt compound (b) includes iodonium salts, diazonium salts and sulfonium salts. In the invention, the onium salt compound functions not as an acid generator but as a radical generator. Preferred examples of the onium salt compound for use in the invention are those of the following formulae (III) to (V).

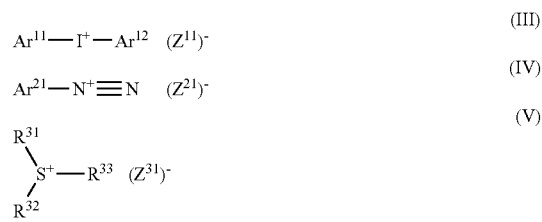

In formula (III), $Ar^{11}$ and $Ar^{12}$ each independently represent an optionally-substituted aryl group having up to 20 carbon atoms. Preferred examples of the substituent for the substituted aryl group include a halogen atom, a nitro group, an alkyl group having up to 12 carbon atoms, an alkoxy group having up to 12 carbon atoms, and an aryloxy group having up to 12 carbon atoms. $Z^{11-}$ represents a counter ion selected from a halide ion, a perchlorate ion, a tetrafluoroborate ion, a hexafluorophosphate ion, a carboxylate ion and a sulfonate ion, preferably a perchlorate ion, a hexafluorophosphate ion, a carboxylate ion or an arylsulfonate ion.

In formula (IV), $Ar^{21}$ represents an optionally-substituted aryl group having up to 20 carbon atoms. Preferred examples of the substituent for the substituted aryl group include a halogen atom, a nitro group, an alkyl group having up to 12 carbon atoms, an alkoxy group having up to 12 carbon atoms, an aryloxy group having up to 12 carbon atoms, an alkylamino group having up to 12 carbon atoms, a dialkylamino group having up to 12 carbon atoms, an arylamino group having up to 12 carbon atoms, and a diarylamino group having up to 12 carbon atoms. $Z^{21-}$ represents a counter ion, having the same meaning as that of $Z^{11-}$.

In formula (V), R31, R32 and R33 may be the same or different, each representing an optionally-substituted hydrocarbon group having up to 20 carbon atoms. Preferred examples of the substituent include a halogen atom, a nitro group, an alkyl group having up to 12 carbon atoms, an alkoxy group having up to 12 carbon atoms, and an aryloxy group having up to 12 carbon atoms. $Z^{31-}$ represents a counter ion, having the same meaning as that of $Z^{11-}$.

Specific examples of the onium salt compound preferred for the compound (C) of generating a radical by light or heat (radical generator) for use in the invention are, for example, as in JP-A2001-133696. Preferred examples for use herein, onium salt compounds of formula (III) ([OI-1] to [OI-10]) onium salt compounds of formula (IV) ([ON-1] to [ON-5], and onium salt compounds of formula (V) ([OS-1] to [OS-10] are mentioned below, to which, however, the invention should not be limited.

[OI-1] 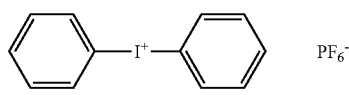
[OI-2] 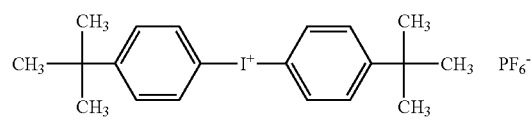
[OI-3] 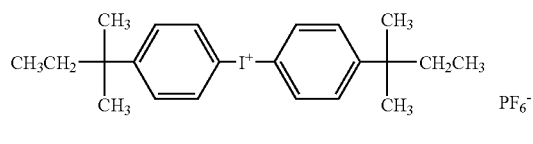
[OI-4] 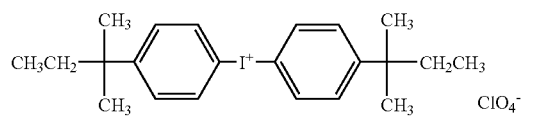
[OI-5] 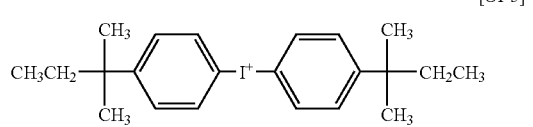
[OI-6] 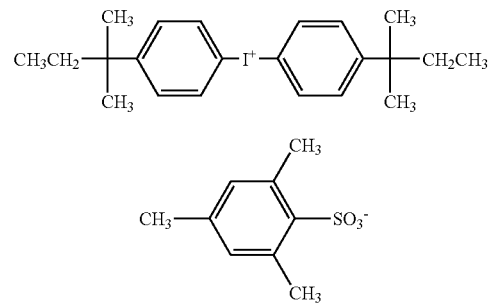
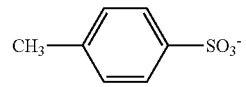
[OI-7] 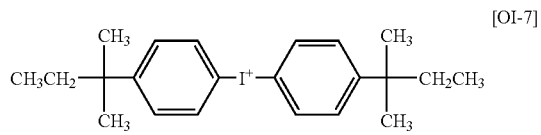
[OI-8] 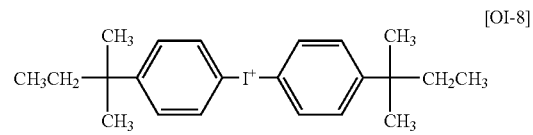
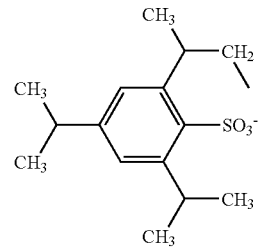
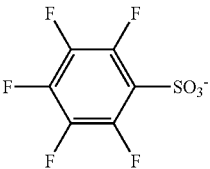
[OI-9] 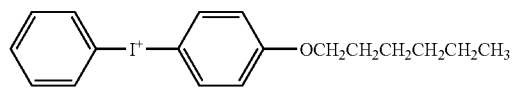
[OI-10] 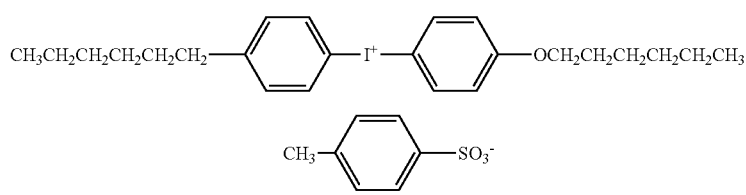
[ON-1] 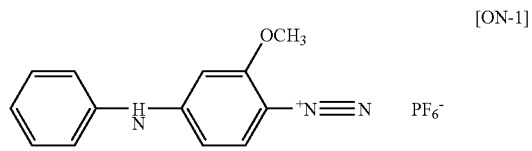
[ON-2] 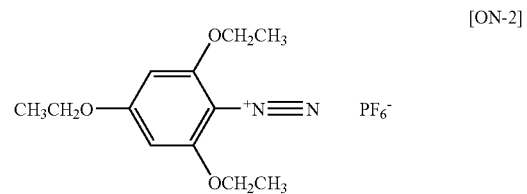

-continued
[ON-3]
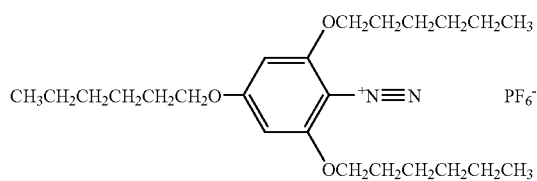
[ON-4]
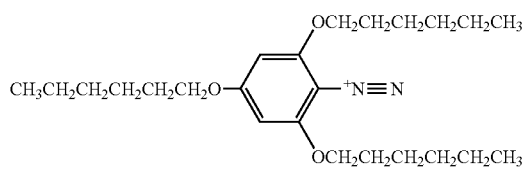
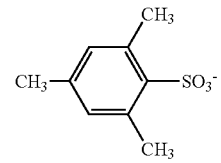
[ON-5]
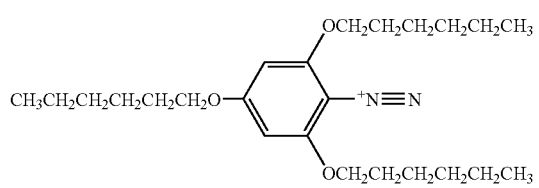
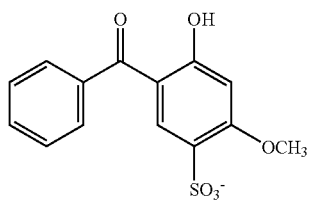
[OS-1]
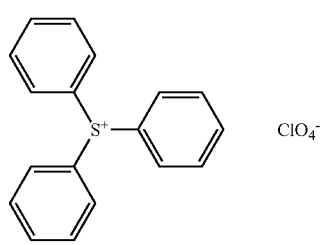
[OS-2]
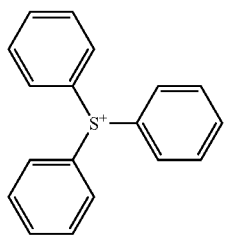
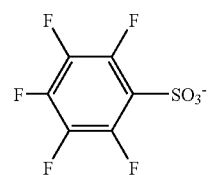
[OS-3]
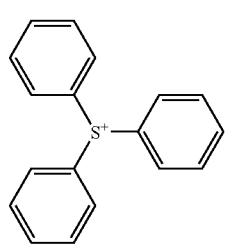
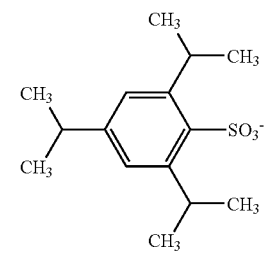
[OS-4]
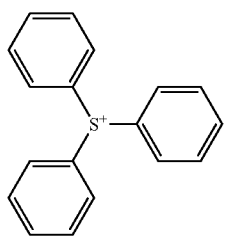
[OS-5]
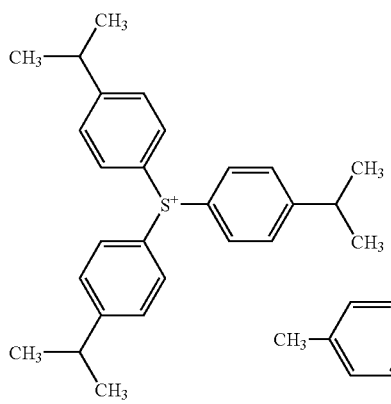
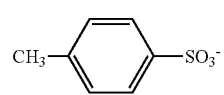

-continued

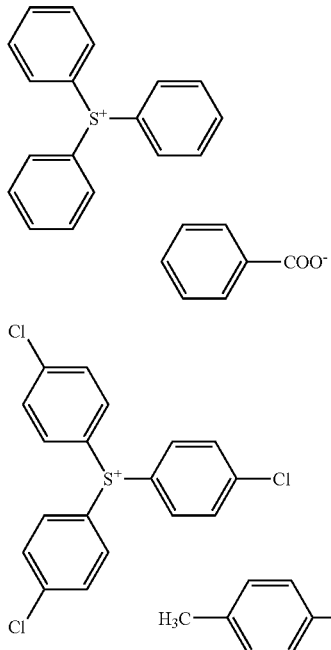
[OS-6]

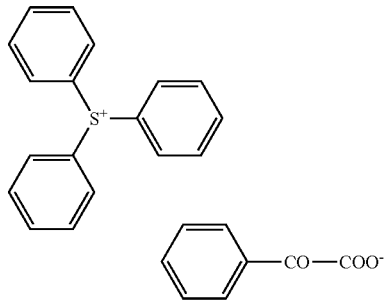
[OS-7]

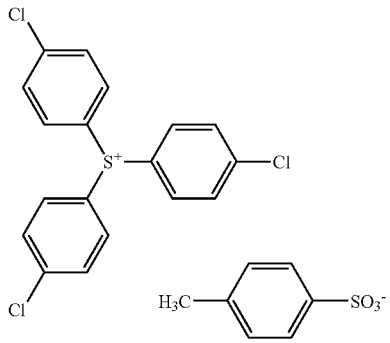
[OS-8]

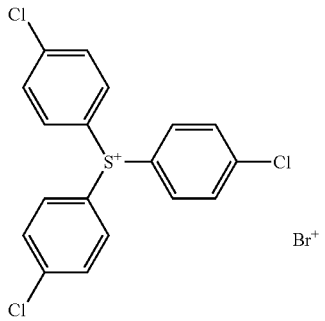
[OS-9]

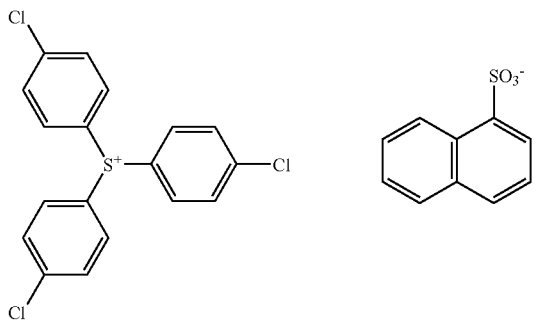
[OS-10]

It is desirable that the onium salt compounds preferred for use in the invention have a maximum absorption wavelength of 400 nm or less, more preferably 360 nm or less. Using the compounds that have an absorption wavelength in the UV range makes it possible to handle the polymerizable composition of the invention under white light.

(c) Organic Peroxide:

The organic peroxide (c) includes almost all organic compounds having at least one oxygen-oxygen bond in the molecule thereof. Specific examples of the organic peroxide include methyl ethyl ketone peroxide, cyclohexanone peroxide, 3,3,5-trimethylcyclohexanone peroxide, methylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butylhydroperoxide, cumene hydroperoxide, diisopropylbenzene hydroperoxide, paramenthane hydroperoxide, 2,5-dimethylhexane-2,5-dihydroperoxide, 1,1,3,3-tetramethylbutyl hydroperoxide, di-tert-butyl peroxide, tert-butylcumyl peroxide, dicumyl peroxide, bis(tert-butylperoxyisopropyl)benzene, 2,5-dimethyl-2,5-di(tert-butylperoxy)hexane, 2,5-xanoyl peroxide, succinic peroxide, benzoyl peroxide, 2,4-dichlorobenzoyl peroxide, metatoluoyl peroxide, diisopropylperoxy dicarbonate, di-2-ethylhexylperoxy dicarbonate, di-2-ethoxyethylperoxy dicarbonate, dimethoxyisopropylperoxy dicarbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy-3,5,5-trimethyl hexanoate, tert-butylperoxy laurate, tertiary carbonate, 3,3',4,4'-tetra(tert-butylperoxycarbonyl)benzophenone, 3,3',4,4'-tetra(tert-amylperoxycarbonyl)benzophenone, 3,3',4,4'-tetra(tert-hexylperoxycarbonyl)benzophenone, 3,3',4,4'-tetra(tert-octylperoxycarbonyl)benzophenone, 3,3',4,41-tetra(cumylperoxycarbonyl)benzophenone, 3,3',4,4'-tetra(p-isopropylcumylperoxycarbonyl)-benzophenone, carbonyl di(tert-butylperoxydihydrogen diphthalate), and carbonyl di(tert-hexylperoxydihydrogen diphthalate).

Of those, preferred are peroxides such as 3,3',4,4'-tetra(tert-butylperoxycarbonyl)benzophenone, 3,3',4,4'-tetra(tert-amylperoxycarbonyl)benzophenone, 3,3',4,4'-tetra(tert-hexylperoxycarbonyl)benzophenone, 3,3',4,4'-tetra(tert-octylperoxycarbonyl)benzophenone, 3,3',4,4'-tetra(cumylperoxycarbonyl)benzophenone, 3,3',4,4'-tetra(p-isopropylcumylperoxycarbonyl)-benzophenone and di-tert-butyldiperoxy isophthalate.

(d) Thio Compound:

The thio compound (d) includes compounds represented by the following formula (15):

In formula (15), $R^{26}$ represents an alkyl group, an aryl group or a substituted aryl group; $R^{27}$ represents a hydrogen atom or an alkyl group; or $R^{26}$ and $R^{27}$ combine with each other and together represent a non-metallic atomic group necessary for forming a 5-membered, 6-membered or 7-membered ring which may contain a hetero atom selected from an oxygen atom, a sulfur atom and a nitrogen atom.

The alkyl group in formula (15) is preferably that having from 1 to 4 carbon atoms. The aryl group is preferably that having from 6 to 10 carbon atoms, for example, phenyl and naphthyl groups. The substituted aryl group includes the above-described aryl group substituted with, for example, a halogen atom, e.g., chlorine, an alkyl group, e.g., methyl, or an alkoxy group, e.g., methoxy or ethoxy. $R^{27}$ preferably represents an alkyl group having from 1 to 4 carbon atoms. Specific examples of the thio compound represented by formula (15) include the following compounds:

| No. | $R^{26}$ | $R^{27}$ |
| --- | --- | --- |
| 1 | —H | —H |
| 2 | —H | —CH$_3$ |
| 3 | —CH$_3$ | —H |
| 4 | —CH$_3$ | —CH$_3$ |
| 5 | —C$_6$H$_5$ | —C$_2$H$_5$ |
| 6 | —C$_6$H$_5$ | —C$_4$H$_9$ |
| 7 | —C$_6$H$_4$Cl | —CH$_3$ |
| 8 | —C$_6$H$_4$Cl | —C$_4$H$_9$ |
| 9 | —C$_6$H$_4$—CH$_3$ | —C$_4$H$_9$ |
| 10 | —C$_6$H$_4$—OCH$_3$ | —CH$_3$ |
| 11 | —C$_6$H$_4$—OCH$_3$ | —C$_2$H$_5$ |
| 12 | —C$_6$H$_4$—OC$_2$H$_5$ | —CH$_3$ |
| 13 | —C$_6$H$_4$—OC$_2$H$_5$ | —C$_2$H$_5$ |
| 14 | —C$_6$H$_4$—OCH$_3$ | —C$_4$H$_9$ |
| 15 | —(CH$_2$)$_2$— | |
| 16 | —(CH$_2$)$_2$—S— | |
| 17 | —CH(CH$_3$)—CH$_2$—S— | |
| 18 | —CH$_2$—CH(CH$_3$)—S— | |
| 19 | —C(CH$_3$)$_2$—CH$_2$—S— | |
| 20 | —CH$_2$—C(CH$_3$)$_2$—S— | |
| 21 | —(CH$_2$)$_2$—O— | |
| 22 | —CH(CH$_3$)—CH$_2$—O— | |
| 23 | —C(CH$_3$)$_2$—CH$_2$—O— | |
| 24 | —CH=CH—N(CH$_3$)— | |
| 25 | —(CH$_2$)$_3$—S— | |
| 26 | —(CH$_2$)$_2$—CH(CH$_3$)—S— | |
| 27 | —(CH$_2$)$_3$—O— | |
| 28 | —(CH$_2$)$_5$— | |
| 29 | —C$_6$H$_4$—O— | |
| 30 | —N=C(SCH$_3$)—S— | |
| 31 | —C$_6$H$_4$—NH— | |
| 32 | 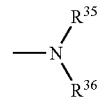 | |

(e) Hexaarylbiimidazole Compound:

The hexaarylbiimidazole compound (e) includes lophine dimers as described in JP-B 45-37377 and 44-86516, specifically, for example, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)-biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4'5,5'-tetraphenylbiimidazole, and 2,2'-bis(o-trifluoromethylphenyl)-4,4',5,5'-tetraphenylbiimidazole.

(f) Ketoxime Ester Compound:

The ketoxime ester compound (f) includes, for example, 3-benzoyloxyiminobutan-2-one, 3-acetoxyiminobutan-2-one, 3-propyonyloxyiminobutan-2-one, 2-acetoxyimino-pentan-3-one, 2-acetoxyimino-1-phenylpropan-1-one, 2-benzoyloxyimino-1-phenylpropan-1-one, 3-p-toluene-sulfonyloxyiminobutan-2-one, and 2-ethoxycazbonyloxy-imino-1-phenylpropan-1-one.

(g) Borate Compound:

The borate compound (g) includes compounds represented by the following formula (16):

In formula (16), $R^{28}$, $R^{29}$, $R^{30}$ and $R^{31}$, which may be the same or different, each represent a substituted or unsubstituted alkyl group, a substituted or unsubstituted aryl group, a substituted or unsubstituted alkenyl group, a substituted or unsubstituted alkynyl group, or a substituted or unsubstituted heterocyclic group, or at least two of $R^{28}$, $R^{29}$, $R^{30}$ and $R^{31}$ may combine with each other to form a cyclic structure, provided that at least one of $R^{28}$, $R^{29}$, $R^{30}$ and $R^{31}$ represents a substituted or unsubstituted alkyl group; and $(Z^5)^+$ represents an alkali metal cation or a quaternary ammonium cation.

The alkyl group represented by $R^{28}$ to $R^{31}$ includes a straight chain, branched or cyclic alkyl group, and preferably has from 1 to 18 carbon atoms. Specific examples thereof include methyl, ethyl, propyl, isopropyl, butyl, pentyl, hexyl, octyl, stearyl, cyclobutyl, cyclopentyl and cyclohexyl groups. The substituted alkyl group includes the above-described alkyl group substituted with any of a halogen atom (e.g., chlorine or bromine), a cyano group, a nitro group, an aryl group (e.g., phenyl), a hydroxy group, —COOR$^{32}$ (wherein R$^{32}$ represents a hydrogen atom, an alkyl group having from 1 to 14 carbon atoms, or an aryl group) —OCOR$^{33}$ or —OR$^{34}$ (wherein R$^{33}$ and R$^{34}$ each represent an alkyl group having from 1 to 14 carbon atoms, or an aryl group) or —OR$^{30}$ (wherein R$^{30}$ represents an alkyl group having from 1 to 14 carbon atoms or an aryl group), and a group of the following formula;

$$-N\begin{matrix} R^{35} \\ R^{36} \end{matrix}$$

wherein $R^{35}$ and $R^{36}$ each independently represent a hydrogen atom, an alkyl group having from 1 to 14 carbon atoms, or an aryl group.

The aryl group represented by $R^{28}$ to $R^{31}$ includes an aryl group having from one to three rings, for example, phenyl or naphthyl. The substituted aryl group includes the above-described aryl group substituted with the substituent described for the substituted alkyl group above or an alkyl group having from 1 to 14 carbon atoms. The alkenyl group represented by $R^{28}$ to $R^{31}$ includes a straight chain, branched or cyclic alkenyl group having from 2 to 18 carbon atoms. In the substituted alkenyl group, the substituent includes the substituents described for the substituted alkyl group above. The alkynyl group represented by $R^{28}$ to $R^{31}$ includes a straight chain, branched or cyclic alkynyl group having from 2 to 28 carbon atoms. In the substituted alkynyl group, the substituent includes the substituents described for the substituted alkyl group above. The heterocyclic group represented by $R^{28}$ to $R^{31}$ includes a 5-membered or more heterocyclic group, preferably a 5-membered, 6-membered or 7-membered heterocyclic group, containing at least one hetero atom selected from a nitrogen atom, a sulfur atom and an oxygen atom. The heterocyclic group may have a condensed ring. In the substituted heterocyclic group, the substituent includes the substituents described for the substituted aryl group above. Specific examples of the compound represented by formula (16) include compounds described in U.S. Pat. Nos. 3,567,453 and 4,343,891, European Patents 109,772 and 109,773.

(h) Azinium Compound;

The azinium compound (h) includes compounds having an N—O bond as described in JP-A-63-138345, JP-A-63-142345, JP-A-63-142346, JP-A-63-143537 and JP-B-46-42363.

(i) Metallocene Compound:

The metallocene compound (i) includes titanocene compounds as described in JP-A-59-152396, JP-A-61-151197, JP-A-63-41484, JP-A-2-249 and JP-A-2-4705, and iron-arene complexes as described in JP-A-1-304453 and JP-A-1-152109.

(j) Active Ester Compounds:

The active ester compound (j) includes imidosulfonate compounds as described in JP-B-62-6223, and active sulfonates as described in JP-B-63-14340 and JP-A-59-174831.

(k) Compound Having Carbon-Halogen Bond:

Preferred examples of the compound having a carbon-halogen bond (k) include compounds of the following formulae (17) to (23):

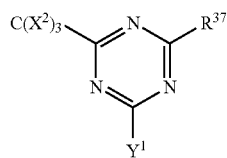

(17)

In formula (17), $X^2$ represents a halogen atom; $Y^1$ represents —$C(X^2)_3$, —$NH_2$, —$NHR^{38}$, —$N(R^{38})_2$ or —$OR^{39}$; $R^3$ represents an alkyl group, a substituted alkyl group, an aryl group, or a substituted aryl group; and $R^{37}$ represents —$C(X^2)_3$, an alkyl group, a substituted alkyl group, an aryl group, a substituted aryl group, or a substituted alkenyl group.

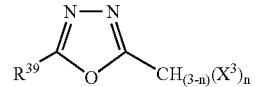

(18)

In formula (18), $R^{39}$ represents an alkyl group, a substituted alkyl group, an alkenyl group, a substituted alkenyl group, an aryl group, a substituted aryl group, a halogen atom, an alkoxy group, a substituted alkoxy group, a nitro group, or a cyano group; $X^3$ represents a halogen atom; and n represents an integer of from 1 to 3.

$$R^{40}\text{-}Z^6\text{-}CH_{(2-m)}(X^3)_m R^{41} \quad (19)$$

In formula (19), $R^{40}$ represents an aryl group or a substituted aryl group; $R^{41}$ represents

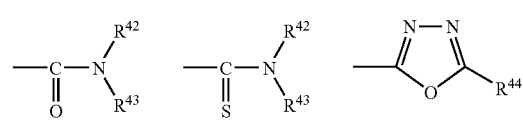

or a halogen atom; $Z^6$ represents —C(=O)—, —C(=S)— or —$SO_2$—

$R^{42}$ and $R^{43}$ each represent an alkyl group, a substituted alkyl group, an alkenyl group, a substituted alkenyl group, an aryl group, or a substituted aryl group; $R^{44}$ has the same meaning as defined for $R^{38}$ in formula (17); $X^3$ represents a halogen atom; and m represents 1 or 2.

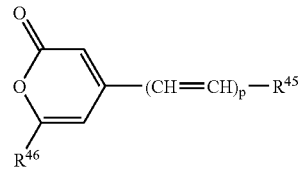

(20)

In formula (20), $R^{45}$ represents an optionally-substituted aryl or heterocyclic group; $R^{46}$ represents a trihaloalkyl or trihaloalkenyl group having from 1 to 3 carbon atoms; and p represents 1, 2 or 3.

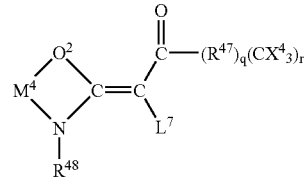

(21)

Formula (21) indicates carbonylmethylene heterocyclic compounds having a trihalogenomethyl group, in which $L^7$ represents a hydrogen atom or a group represented by formula —CO—$R^{47})_q(C(X^4)_3)_r$; $Q^2$ represents a sulfur atom, a selenium atom, an oxygen atom, a dialkylmethylene group, an alken-1,2-ylene group, a 1,2-phenylene group, or —N—R; $M^4$ represents a substituted or unsubstituted alkylene or alkenylene group, or a 1,2-arylene group; $R^{48}$ represents an alkyl group, an aralkyl group, or an alkoxy-alkyl group; R$^{47}$ represents a divalent carbocyclic or heterocyclic aromatic group; X$^4$ represents a chlorine atom, a bromine atom or an iodine atom; and q=1 and r=1, or q=1 and r=1 or 2.

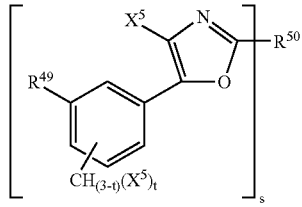

(22)

Formula (22) indicates 4-halogeno-5-(halogenomethylphenyl)oxazole derivatives, in which X$^5$ represents a halogen atom, t represents an integer of from 1 to 3; s represents an integer of from 1 to 4; R$^{49}$ represents a hydrogen atom or —CH$_{3-t}$X$^5_t$; and R$^{50}$ represents an optionally-substituted, s-valent unsaturated organic residue.

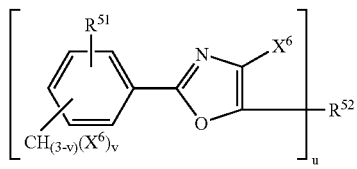

(23)

Formula (23) indicates 2-(halogenomethylphenyl)-4-halogeno-oxazole derivatives, in which X$^6$ represents a halogen atom, v represents an integer of from 1 to 3; u represents an integer of from 1 to 4; R$^{51}$ represents a hydrogen atom or —CH$_{3-v}$X$^6_v$; and R$^{52}$ represents an optionally-substituted, u-valent unsaturated organic residue.

Specific examples of the compound having a carbon-halogen bond include compounds as described in Wakabayashi et al., *Bull. Chem. Soc. Japan*, Vol. 42, page 2924 (1969). In addition, they include compounds as described in British Patent 1,388,492, for example, 2-styryl-4,6-bis (trichloromethyl)-S-triazine, 2-(p-methylstyryl)-4,6-bis (trichloromethyl)-S-triazine, 2-(p-methoxylstyryl)-4,6-bis (trichloromethyl)-S-triazine, and 2-(p-methoxylstyryl)-4-amino-6-trichloromethyl-S-triazine; and compounds as described in JP-A-53-133428 and German Patent 3,337,024.

In addition, further mentioned are compounds as described in F. C. Schaefer et al., *J. Org. Chem.*, Vol. 29, page 1527 (1964); and compounds as described in JP-A-62-58241.

Further mentioned are compounds as described in JP-A-5-281728.

Still further mentioned are compounds which can be easily synthesized by one skilled in the art according to synthesis methods as described in M. P. Hutt, E. F. Elslager and L. M. Herbel, *Journal of Heterocyclic Chemistry*, Vol. 7, No. 3, page 511, f.f. (1970).

More preferred examples of the radical generator for use in the invention include the aromatic ketone (a), the onium salt compound (b), the organic peroxide (c), the hexaarylbiimidazole compound (e), the metallocene compound (i) and the compound having a carbon-halogen bond (k) as described above. Still more preferred examples thereof include aromatic iodonium salts, aromatic diazonium salts, titanocene compounds and trihalomethyl-S-triazine compounds of formula (17).

Oxime ester compounds preferred for the compound (C) of generating a radical by light or heat for use in the invention are described. Preferred examples of oxime ester compounds for use herein are represented by the following formula (i):

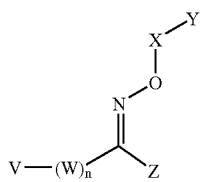

(i)

In formula (i), X represents a carbonyl group, a sulfone group, or a sulfoxide group; Y represents a cyclic or straight chain alkyl, alkenyl or alkynyl group having from 1 to 12 carbon atoms, an aryl group having from 6 to 18 carbon atoms, or a heterocyclic group. The aryl group includes aromatic hydrocarbon compounds such as a benzene ring, a naphthalene ring, an anthracene ring, a phenanthrene ring, a pyrene group, and a triphenylene group. The heterocyclic group includes aromatic compounds having at least one hetero atom of nitrogen, sulfur and oxygen atoms in the cyclic structure thereof, for example, a pyrrole group, a furan group, a thiophene group, a selenophene group, a pyrazole group, an imidazole group, a triazole group, a tetrazole group, an oxazole group, a thiazole group, an indole group, a benzofuran group, a benzimidazole group, a benzoxazole group, a benzothiazole group, a pyridine group, a pyrimidine group, a pyrazine group, a triazine group, a quinoline group, a carbazole group, an acridine group, a phenoxazine group, and a phenothiazine group. These substituents for Y may be further substituted with any of a halogen atom, a hydroxyl group, a nitrile group, a nitro group, a carboxyl group, an aldehyde group, an alkyl group, a thiol group, an aryl group, an alkenyl group, an alkynyl group, an ether group, an ester group, an urea group, an amino group, an amido group, a sulfido group, a disulfido group, a sulfoxide group, a sulfo group, a sulfone group, a hydrazine group, a carbonyl group, an imino group, a halogen atom, a hydroxyl group, a nitrile group, a nitro group, a carboxyl group, a carbonyl group, an urethane group, an alkyl group, a thiol group, an aryl group, a phosphoroso group, a phospho group, or a carbonyl-ether group.

In formula (i), Z has the same meaning as Y, representing a nitrile group, a halogen atom, a hydrogen atom or an amino group. These substituents for Z may be further substituted with any of a halogen atom, a hydroxyl group, a nitrile group, a nitro group, a carboxyl group, an aldehyde group, an alkyl group, a thiol group, an aryl group, an alkenyl group, an alkynyl group, an ether group, an ester group, an urea group, an amino group, an amido group, a sulfido group, a disulfido group, a sulfoxide group, a sulfo group, a sulfone group, a hydrazine group, a carbonyl group, an imino group, a halogen atom, a hydroxyl group, a nitrile group, a nitro group, a carboxyl group, a carbonyl group, an urethane group, an alkyl group, a thiol group, an aryl group, a phosphoroso group, a phospho group, or a carbonyl-ether group.

In formula (i), W represents a divalent organic group, for example, a methylene group, a carbonyl group, a sulfoxide group, a sulfone group, or an imino group. The methylene group and the imino group may be substituted with any of an alkyl group, an aryl group, an ester group, a nitrite group, a carbonyl-ether group, a sulfo group, a sulfo-ether group, or an ether group. n indicates an integer of 0 or 1.

In formula (i), V represents a cyclic or straight chain alkyl, alkenyl or alkynyl group having from 1 to 12 carbon atoms, an aryl group having from 6 to 18 carbon atoms, an alkoxy group, or an aryloxy group. The aryl group includes aromatic hydrocarbon compounds such as a benzene ring, a naphthalene ring, an anthracene ring, a phenanthrene ring, a pyrene group, and a triphenylene group; and hetero atom-containing aromatic compounds such as a pyrrole group, a furan group, a thiophene group, a selenophene group, a pyrazole group, an imidazole group, a triazole group, a tetrazole group, an oxazole group, a thiazole group, an indole group, a benzofuran group, a benzimidazole group, a benzoxazole group, a benzothiazole group, a pyridine group, a pyrimidine group, a pyrazine group, a triazine group, a quinoline group, a carbazole group, an acridine group, a phenoxazine group, and a phenothiazine group. These substituents for V may be further substituted with any of a halogen atom, a hydroxyl group, a nitrile group, a nitro group, a carboxyl group, an aldehyde group, an alkyl group, a thiol group, an aryl group, an alkenyl group, an alkynyl group, an ether group, an ester group, an urea group, an amino group, an amido group, a sulfido group, a disulfido group, a sulfoxide group, a sulfo group, a sulfone group, a hydrazine group, a carbonyl group, an imino group, a halogen atom, a hydroxyl group, a nitrile group, a nitro group, a carboxyl group, a carbonyl group, an urethane group, an alkyl group, a thiol group, an aryl group, a phosphoroso group, a phospho group, or a carbonyl-ether group.

V and Z may bond to each other to form a ring.

In the oxime ester compounds of formula (i), it is desirable that X is a carbonyl group, Y is an aryl or benzoyl group, Z is an alkyl or aryl group, W is a carbonyl group, and V is an aryl group in view of the sensitivity of the compounds. More preferably, the aryl group for V has a thioether substituent.

Regarding the structure thereof, the N—O bond in formulas (i) may form either an E-form or a Z-form.

Other oxime ester compounds favorable for the invention are described in *Progress in Organic Coatings*, 13 (1985), 123–150; *J. C. S. Perkin II* (1979), 1653–1660; *Journal of Photopolymer Science and Technology* (1995), 205–232; *J. C. S. Perkin II* (1979), 156–162; JP-A2000-66385; and JP-A2000-80068.

Specific examples of oxime ether compounds favorable for the invention are mentioned below, to which, however, the invention should not be limited.

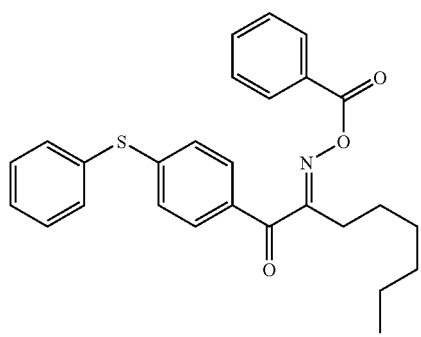

-continued

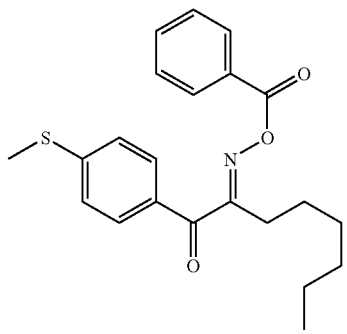

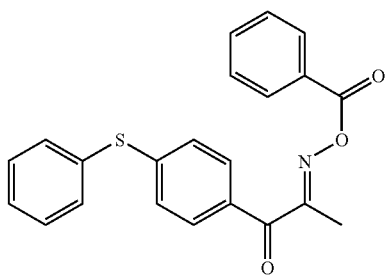

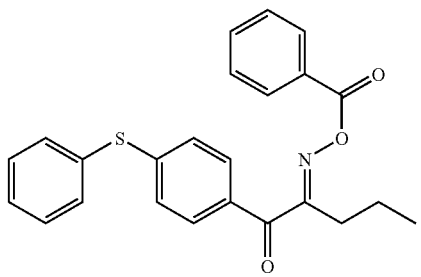

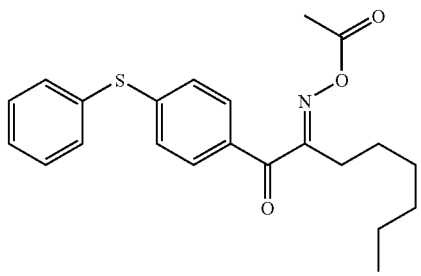

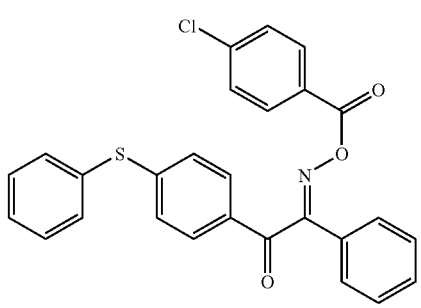

-continued
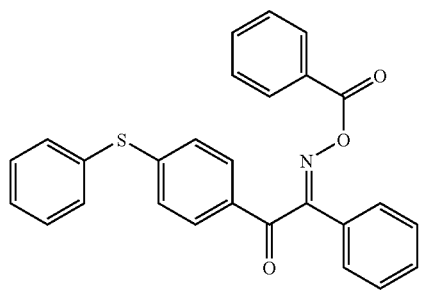
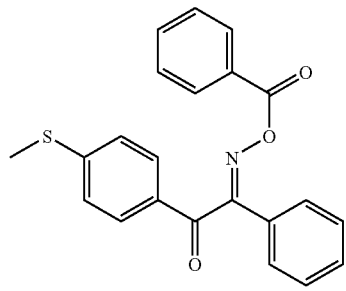
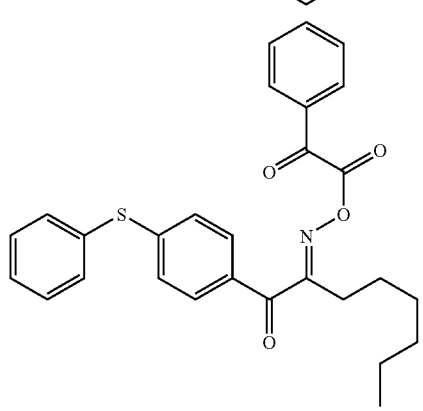
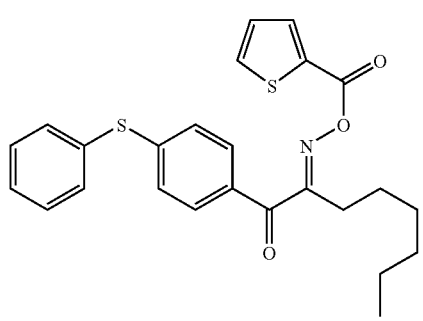
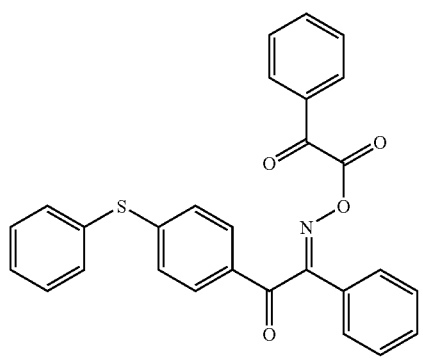
-continued
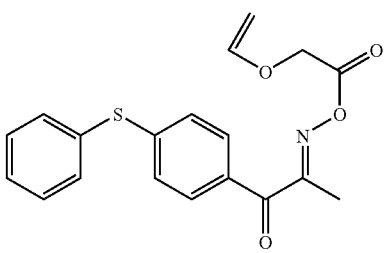
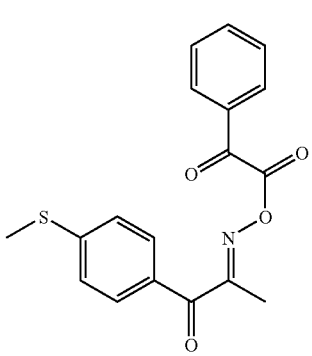
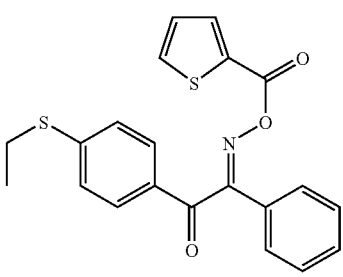
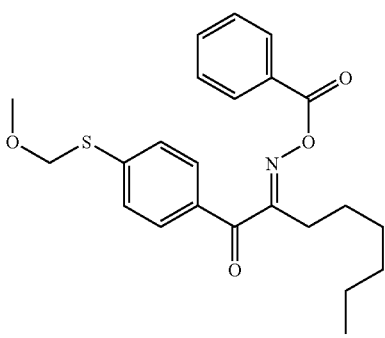
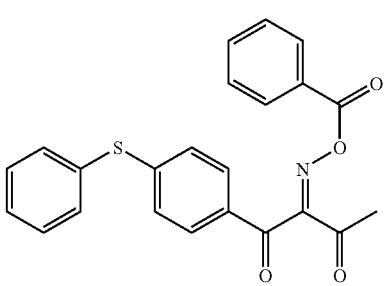

The amount of the compound (C) of generating a radical by light or heat to be in the polymerizable composition of the invention may be, for example, when the composition is used in the recording layer of negative image-recording materials, from 0.1 to 50 by mass, preferably from 0.5 to 30% by mass, more preferably from 1 to 20% by mass relative to the total solid content of the image-recording layer from the viewpoint of the sensitivity of the composition and of the staining resistance thereof in the non-image area in prints. Either singly or as combined, one or more different types of the compounds (C) may be used. The compound (C) may be combined with the other components of the composition to be in one layer, or may be added to an additional layer that differ from the layer that contain the other components.

[(D) Sensitizing Dye]

A sensitizing dye that absorbs light having a predetermined wavelength is preferably added to the polymerizable composition of the invention. When the composition is exposed to light which the sensitizing dye therein may absorb, then the radical generator (C) generates a radical and the polymerization of the component (B) is thereby promoted. For the sensitizing dye (D), usable are known spectral-sensitizing dyes or dyestuffs, as well as dyes or pigments that absorb light to interact with the radical initiator. Depending on the wavelength of the light that the sensitizing dye absorbs, the polymerizable composition of the invention is sensitive to any of UV light, visible light or IR light having different wavelengths. For example, when an IR absorbent is used for the sensitizing dye (D), then the polymerizable composition is sensitive to IR light having a wavelength of from 760 nm to 1200 nm.

(Spectral-Sensitizing Dye or Dyestuff)

Preferred examples of the spectral-sensitizing dye or dyestuff for the sensitizing dye (D) for use in the invention include multi-nuclear aromatic compounds (for example, pyrene, perylene, triphenylene), xanthenes (for example, Fluoresceine, Eosine, Erythrosine, Rhodamine B, Rose Bengale), cyanines (for example, thiacarbocyanine, oxacarbocyanine), merocyanines (for example, merocyanine, carbomerocyanine), thiazines (for example, Thionine, Methylene Blue, Toluidine Blue), acridines (for example, Acridine Orange, chloroflavine, acriflavine), phthalocyanines (for example, phthalocyanine, metallo-phthalocyanine), porphyrins (for example, tetraphenyl porphyrin, center metal-substituted porphyrin), chlorophylls (for example, chlorophyll, chlorophyllin, center metal-substituted chlorophyll), metal complexes (for example, the following compound), anthraquinones (for example, anthraquinone), and aquariums (for example, aquarium).

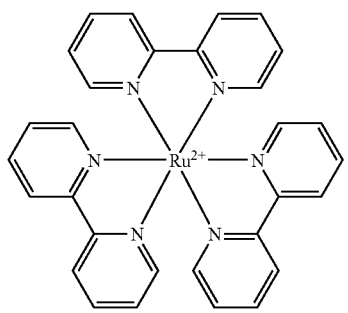

More preferred examples of the spectral sensitizing dye or dyestuff for use herein are mentioned below.

Styryl dyes as in JP-B 37-13034; cation dyes as in JP-A 62-143044; quinoxalinium salts as in JP-B 59-24147; new methylene blue compounds as in JP-A 64-33104; anthraquinones as in JP-A 64-56767; benzoxanthene dyes as in JP-A 2-1714; acridines as in JP-A 2-226148, 2-226149; pyrylium salts as in JP-B 40-28499; cyanines as in JP-B 46-42363; benzofuran dyes as in JP-A2-63053; conjugated ketone dyes as in JP-A 2-85858, 2-216154; dyes as in JP-A 57-10605; azocinnamylidene derivatives as in JP-B 2-30321; cyanine dyes as in JP-A 1-287105; xanthene dyes as in JP-A 62-31844, 62-31848, 62-143043; aminostyryl ketones as in JP-B 59-26325; dyes as in JP-A 2-179643; merocyanine dyes as in JP-A 2-244050; merocyanine dyes as in JP-B 59-28326; merocyanine dyes as in JP-A 59-89303; merocyanine dyes as in Japanese Patent Application No. 6-269047; and benzopyran dyes as in Japanese Patent Application No. 7-164583.

(IR Absorbent)

In addition, the following IR (infrared) absorbents (dyes or pigments) are also favorably used for the sensitizing dye (D).

Commercially-available dyes such as those known, for example, in *Dyestuff Handbook* (edited by the Organic Synthetic Chemical Society of Japan, 1960) maybe used herein. Concretely mentioned are azo dyes, metal complex salt azo dyes, pyrazolonazo dyes, naphthoquinone dyes, anthraquinone dyes, phthalocyanine dyes, carbonium dyes, quinonimine dyes, methine dyes, cyanine dyes, squalilium-dyes, pyrylium dyes, and metal thiolate complex dyes.

Preferred for use herein are, for example, cyanine dyes as in JP-A 58-125246, 59-84356, 59-202829, 60-78787; methine dyes as in JP-A58-173696, 58-181690, 58-194595; naphthoquinone dyes as in JP-A 58-112793, 58-224793, 59-48187, 59-73996, 60-52940, 60-63744; squalilium dyes as in JP-A 58-112792; and cyanine dyes as in British Patent 434,875.

In addition, also preferred for use herein are near-IR absorbing sensitizers as in U.S. Pat. No. 5,156,938; aryl-benzo(thio)pyrylium salts as in U.S. Pat. No. 3,881,924; trimethinethiapyrylium salts as in JP-A 57-142645 (U.S. Pat. No. 4,327,169); pyrylium compounds as in JP-A 58-181051, 58-220143, 59-41363, 59-84248, 59-84249, 59-146063, 59-146061; cyanine dyes as in JP-A 59-216146; pentamethinethiopyrylium salts as in U.S. Pat. No. 4,283,475; and pyrylium compounds as in JP-B 5-13514, 5-19702. Other preferred examples of dyes for use herein are near-IR absorbent dyes of formulae (I) and (II) described in U.S. Pat. No. 4,756,993.

Still other preferred examples of IR-absorbent dyes for use in the invention are specific indolenine-cyanine dyes as in Japanese Patent Application Nos. 2001-6326 and 2001-237840, for example, those mentioned below.

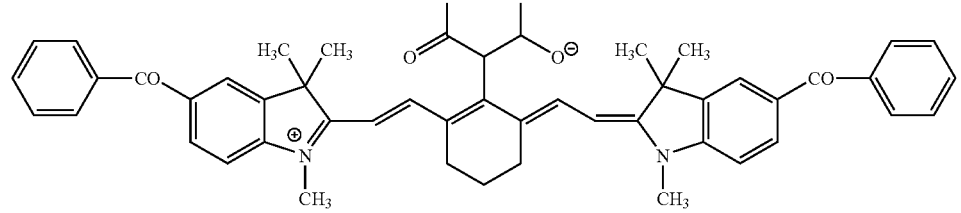

-continued

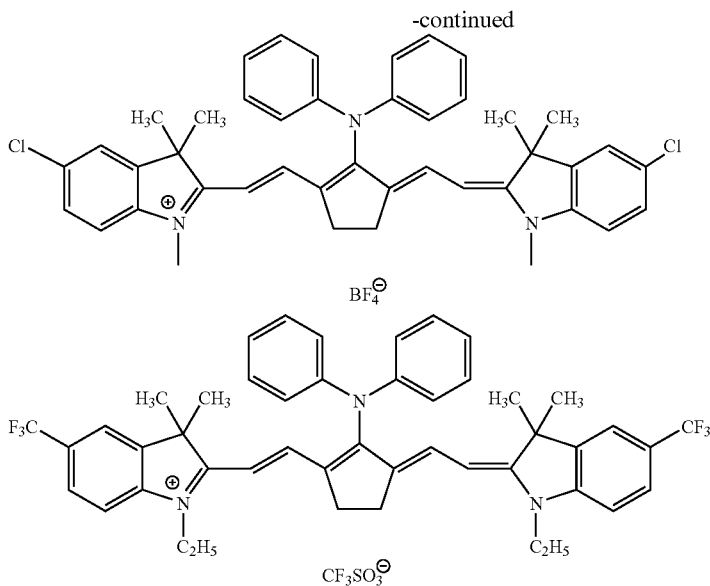

Of those dyes, especially preferred for use in the invention are cyanine dyes, squalilium dyes, pyrylium salts, nickel-thiolate complexes, and indolenine-cyanine dyes. More preferred are cyanine dyes and indolenine-cyanine dyes; and even more preferred are cyanine dyes of the following formula (a).

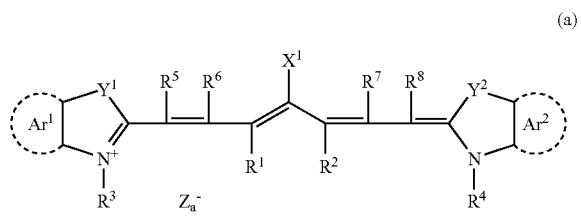

(a)

In formula (a), $X^1$ represents a hydrogen atom, a halogen atom, —$NPh_2$, $X^2$-$L^1$ or a group mentioned below. $X^2$ represents an oxygen atom, a nitrogen atom, or a sulfur atom; $L^1$ represents a hydrocarbon group having from 1 to 12 carbon atoms, a hetero atom-containing aromatic group, a hetero atom-containing hydrocarbon group having from 1 to 12 carbon atoms. The hetero atom as referred to herein includes N, S, O, halogen atoms, and Se. $Xa^-$ has the same meaning as $Za^-$ mentioned below. $R^a$ represents a hydrogen atom, or a substituent selected from an alkyl group, an aryl group, a substituted or unsubstituted amino group, or a halogen atom.

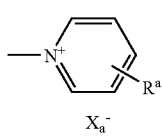

$R^1$ and $R^2$ each independently represent a hydrocarbon group having from 1 to 12 carbon atoms. In view of the storage stability of the coating liquid for recording layer, it is desirable that $R^1$ and $R^2$ are independently a hydrocarbon group having 2 or more carbon atoms, more preferably $R^1$ and $R^2$ bond to each other to form a 5-membered or 6-membered ring.

$Ar^1$ and $Ar^2$ may be the same or different, each representing an optionally-substituted aromatic hydrocarbon group. Preferred examples of the aromatic hydrocarbon group are a benzene ring and a naphthalene ring. Preferred examples of the substituent for the group include a hydrocarbon group having up to 12 carbon atoms, a halogen atom, and an alkoxy group having up to 12 carbon atoms. $Y^1$ and $Y^2$ may be the same or different, each representing a sulfur atom, or a dialkylmethylene group having up to 12 carbon atoms. $R^3$ and $R_4$ may be the same or different, each representing an optionally-substituted hydrocarbon group having up to 20 carbon atoms. Preferred examples of the substituent for the group include an alkoxy group having up to 12 carbon atoms, a carboxyl group, and a sulfo group. $R^5$, $R^6$, $R^7$ and $R^8$ may be the same or different, each representing a hydrogen atom, or a hydrocarbon group having up to 12 carbon atoms. In view of the easy availability of the starting materials for the compounds, they are preferably hydrogen atoms. $Za^-$ represents a counter anion. However, when the cyanine dye of formula (a) has an anionic substituent in its structure and therefore does not require charge neutralization, then $Za^-$ may be omitted. In view of the storage stability of the coating liquid for recording layer, $Za^-$ is preferably a halide ion, a perchlorate ion, a tetrafluoroborate ion, hexafluorophosphate ion, or sulfonate ion, more preferably a perchlorate ion, a hexafluorophosphate ion, or an arylsulfonate ion.

Preferred examples of the cyanine dyes of formula (a) favorable for ase in the invention are described in paragraphs [0017] to [0019] in JP-A2001-133969; paragraphs [0012] to [0038] in JP-A 2002-40638; and paragraphs [0012] to [0023] in JP-A 2002-23360.

Pigments usable in the invention are, for example, commercially-available pigments and pigments described in *Color Index (C.I.)*; *Newest Pigment Handbook* (edited by the Pigment Technology. Association of Japan, 1977); *Newest Pigment Application Technology* (CMC Publishing, 1986); *Printing Ink Technology* (CMC Publishing, 1984).

Various types of pigments are usable herein, including, for example, black pigments, yellow pigments, orange pigments, brown pigments, red pigments, purple pigments, blue pigments, green pigments, fluorescent pigments, metal powder pigments, and polymer-bonding dyes. Specific examples of the pigments include insoluble azo pigments, azo lake pigments, condensed azo pigments, chelate azo pigments, phthalocyanine pigments, anthraquinone pigments, perylene pigments, perinone pigments, thioindigo pigments, quinacridone pigments, dioxazine pigments, isoindolinone pigments, quinophthalone pigments, Reichardt's dyes, azine pigments, nitroso pigments, nitro pigments, natural pigments, fluorescent pigments, inorganic pigments, and carbon black of the pigments, carbon black is preferably used.

The pigment may be used without surface treatment or the pigment subjected to the surface treatment may be used. Methods of the surface treatment include applying a resin or wax on the surface of pigment, applying a surface active agent to the surface of pigment, and bonding a reactive substance (e.g., silane coupling agent, epoxy compound, polyisocyanate) to the surface of pigment. The methods of surface treatment are described in *Properties and Applications of Metal Soap* (Miyuki Shobo); *Printing Ink Technology* (CMC Publishing, 1984), and *Newest Pigment Application Technology* (CKC Publishing, 1986).

Preferably, the particle size of the pigment is from 0.01 μm to 10 μm, more preferably from 0.05 μm to 1 μm, even more preferably from 0.1 μm to 1 μm, from the viewpoint of the dispersibility of the pigment into coating liquid and of the uniformity of the recording layer formed.

Known dispersing techniques used in production of ink and toner can be utilized for dispersing the pigment. A dispersing machine, for example, an ultrasonic dispersing device, a sand mill, an attritor, a pearl mill, a super mill, a ball mill, an impeller, a disperser, a KD mill, a colloid mill, Dynatron, a three-roll mill or a pressure kneader can be used for pigment dispersion. Details thereof are described in *Newest Pigment Application Technology* (CMC Publishing, 1986).

When the polymerizable composition of the invention is used in the recording layer of negative image-recording materials, then the sensitizing dye (D) for promoting the curing reaction of the polymerizable composition may be directly added to the recording layer along with the other components thereto, but may be added to an additional layer formed adjacent to the recording layer to attain the same effect as in the former.

In particular, when the polymerizable composition of the invention is used in the recording layer of lithographic printing plate precursors, then the recording layer preferably has an optical density of from 0.1 to 3.0 at an absorption maximum falling within a wavelength range of from 300 nm to 1200 nm in view of the sensitivity thereof. Since the optical density is determined depending on the amount of the sensitizing dye added to the recording layer and the thickness of the layer, the predetermined optical density of the recording layer can be attained by controlling the two conditions.

The optical density of the recording layer can be measured in any known manner. For example, employable is a method comprising forming, on a transparent or white support, a recording layer having a thickness suitably determined within a range of dried coating amount necessary for lithographic printing plates followed by measuring the optical density thereof with a transmission optical densitometer; or a method comprising forming a recording layer on a reflective support of aluminium or the like followed by measuring the reflection density of the layer.

[Other Components]

In addition to the above-mentioned indispensable components, the polymerizable composition of the invention may contain any other optional component such as polymerization inhibitor, colorant and plasticizer, depending on the use and the production method thereof. Preferred additives to the polymerizable composition especially for use in the recording layer of negative image-recording materials are mentioned below.

(Polymerization Inhibitor)

It is desirable that a small amount of a thermal polymerization inhibitor is added to the polymerizable composition in order to prevent undesirable thermal polymerization of the compound having a polymerizable ethylenic unsaturated double bona during the production and preservation of the composition. Suitable examples of the thermal polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol) and N-nitrosophenylhydroxylamine cerous salt. The amount of the thermal polymerization inhibitor to be added is preferably from about 0.01 to about 5% by mass based on the total components of the composition. Also, if desired, a higher fatty acid derivative, for example, behenic acid or behenic acid amide may be added so as to be maldistributed on the surface of the recording layer during the drying process after the coating of the polymerizable composition in order to prevent the polymerization inhibition due to oxygen. The amount of the higher fatty acid derivative to be added is preferably from about 0.5 to about 10% by mass based on the total components of the composition.

(Colorant)

When the polymerizable composition of the invention is used in the recording layer of lithographic printing plate precursors, the dye or pigment may be added to the composition for the purpose of coloring the recording layer. By the addition of such colorant, a printing plate can be improved in plate inspection properties, for example, visibility after the plate-making or suitability for image density measurement. The colorant to be used is preferably pigment because many dyes cause reduction in the sensitivity of the photopolymerizable recording layer. Specific examples of the colorant include pigments, for example, phthalocyanine pigments, azo pigments, carbon black or titanium oxide, and dyes, for example, Ethyl Violet, Crystal Violet, azo dyes, anthraquinone dyes and cyanine dyes. The amount of the dye or pigment to be added is preferably from about 0.5 to about 5% by mass based on the total components of the composition.

(Other Additives)

Known other additives may be added to the polymerizable composition of the invention. They include, for example, inorganic filler or plasticizer for improving the physical properties of hardened films, and oleosensitizer for improving the ink acceptability of the surface of recording layers, when the polymerizable composition of the invention is used in the recording layer of lithographic printing plates.

Examples of the plasticizer include dioctyl phthalate, didodecyl phthalate, triethylene glycol dicaprylate, dimethyl glycol phthalate, tricresyl phosphate, dioctyl adipate, dibutyl sebacate, and triacetyl glycerin. The amount of the plasticizer to be added may be generally at most 10% by mass based on the total amount of the polymer binder and the addition-polymerizable compound in the composition. Furthermore, in order to improve the film strength (printing durability), UV initiator and thermal crosslinking agent capable of accelerating the effect of heating and/or exposure to light after development may also be added.

Negative image-recording materials where the recording layer contains the polymerizable composition of the invention may be fabricated by dissolving the constitutive components of the recording layer in a suitable organic solvent followed by applying the resulting solution onto a support.

The solvent includes acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol monoethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, and ethyl lactate. The solvents may be used individually or in combination of two or more thereof. The solid concentration in the coating solution is suitably from 2 to 50% by mass.

Since, the coating amount of the image-recording layer on a support has an influence mainly upon the sensitivity of the layer, the developability, the strength of the exposed film and the printing durability, it is desirable to appropriately determine the coating amount thereof depending on the use. When the coating amount is too small, the printing durability may not be sufficient, whereas an excessively large coating amount is disadvantageous, because the sensitivity decreases, the exposure takes a lot of time and the development also requires a longer period of time.

Especially in lithographic printing plate precursors for scanning exposure, to which negative image-recording materials are favorable, the dry coating amount of the recoding layer is preferably from about 0.1 to about 10 g/m$^2$, more preferably from 0.5 to 5 g/m$^2$.

[Support]

Various types of support may be used in negative image-recording materials where the polymerizable composition of the invention is used, with no limitation. Preferably used are hydrophilic supports known in the art and generally used in lithographic printing plate precursors.

The support for use herein is preferably a dimensionally stable plate-like material. Examples thereof include paper, paper laminated with plastics (e.g., polyethylene, polypropylene or polystyrene), a plate of metal (e.g., aluminum, zinc or copper), a film of plastics (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal) and paper or a plastic film laminated with or having deposited thereon the above-described metal. The surface of the support may be subjected to a known appropriate physical or chemical treatment, if desired, for the purpose of, for example, imparting hydrophilicity thereto or increasing the strength thereof.

Paper, a polyester film and an aluminum plate are preferably used. Of the supports, the aluminum plate is particularly preferred because it is dimensionally stable, relatively inexpensive and capable of providing a surface excellent in the hydrophilicity and strength by a surface treatment, if desired. Also, a composite sheet obtained by bonding an aluminum sheet onto a polyethylene terephthalate film as described in JP-B-48-18327 is preferably used.

The aluminum plate suitably used includes a pure aluminum plate or an alloy plate mainly comprising aluminum and containing a trace amount of foreign elements. Also, a plastic film laminated with or having deposited thereon aluminum may be used. In the following description, "aluminium support" is a generic term for the above-mentioned aluminium or aluminium alloy supports. Examples of the foreign element contained in the aluminum alloy include silicon, iron, manganese, copper, magnesium, chromium, zinc, bismuth, nickel and titanium. The foreign element content of the alloy is at most 10% by mass. In the invention, although pure aluminum is particularly suitably used, it is difficult to produce completely pure aluminum in view of the refining technology. Thus, aluminum containing a trace amount of foreign elements can be used. The composition of the aluminum plate for use in the invention is not particularly limited and an aluminum plate conventionally known and used in the art can be appropriately used herein. For example, herein usable are JIS A 1050, JIS A 1100, JIS A 3103, and JIS A 3005.

The aluminum support for use in the invention preferably has a thickness of approximately from 0.1 to 0.6 mm. The thickness may be suitably controlled depending on the use of the negative image-recording materials to which the invention is applied. For example, when the negative image-recording material is used for lithographic printing plate precursors, then the support size may be suitably determined in accordance with the size of the printer to be used, the size of the printing plate to be produced and the users' request. If desired, the aluminium support may be subjected to surface treatment as in the manner mentioned below. Needless-to-say, it may not be subjected to the treatment.

(Surface-Roughening Treatment)

The surface-roughening treatment employable herein include mechanical surface-roughening, chemical etching and electrolytic graining as in JP-A 56-28893. Also employable are electrochemical surface-roughening to be effected in an electrolytic solution of hydrochloric acid or nitric acid; and mechanical surface-roughening such as wire brush graining to be effected by the use of a metal wire applied onto the surface of aluminium, ball graining to be effected by the use of abrasive balls and abrasive agent, or brush graining to be effected by the use of nylon brush and abrasive agent. The surface-roughening methods may be effected individually or as combined. Above all, electrochemical surface-roughing to be effected in an electrolytic solution of hydrochloric acid or nitric acid is preferably used, in which the quantity of electricity to the anode is from 50 C/cm$^2$ to 400 C/cm$^2$. More concretely, it is desirable that to electrolyte aluminium in a mode of alternating current and/or direct current electrolysis, in an electrolytic solution containing from 0.1 to 50% hydrochloric acid or nitric acid, at a temperature falling between 20 and 80° C., for a period of time falling between 1 second and 30 minutes, at a current density falling between 100 C/cm$^2$ and 400 C/cm$^2$.

The aluminium support thus surface-roughened in the manner as above may be chemically etched with acid or alkali. The etchant preferably used for it includes sodium hydroxide, sodium carbonate, sodium aluminate, sodium metasilicate, sodium phosphate, potassium hydroxide, lithium hydroxide. The preferred range of the concentration and the temperature falls between 1 and 50%, and between 20 and 100° C., respectively. The etched support is then desmutted with acid for removing the smut remaining on the etched surface. The acid to be used includes nitric acid, sulfuric acid, phosphoric acid, chromium acid, hydrofluoric acid, borohydrofluoric acid. Preferred embodiments of the desmutting treatment after the electrochemical surface-roughening treatment are a method of contacting the etched support with 15 to 65 mass % sulfuric acid at 50 to 90° C. as in JP-A 53-12739; and an alkali-etching method as in JP-B 48-28123. Thus treated in the manner as above, the center line mean roughness Ra of the treated surface is preferably from 0.2 to 0.5 μm, for which the method and the condition of surface-roughening treatment are not specifically defined.

(Anodic Oxidation)

Preferably, the aluminium support treated in the manner as above is then subjected to anodic oxidation.

Sulfuric acid, phosphoric acid, oxalic acid, or aqueous solution of boric acid/sodium borate may be used either singly or as combined for the essential ingredient of the electrolytic bath for the anodic oxidation. The electrolytic solution may contain the components that are generally in at least Al alloy plates, electrodes, tap water and underground water. In addition, any additional second and third components may also be added to it. The second and third components as referred to herein include, for example, cations such as metal ions of Na, K, Mg, Li, Ca, Ti, Al, V, Cr, Mn, Fe, Co, Ni, Cu, Zn, and ammonium ion; and anions such as nitrate ion, carbonate ion, chloride ion, phosphate ion, fluoride ion, nitrite ion, titanate ion, silicate ion, borate ion. The concentration of the additional components may be from 0 to 1000 ppm or so. The condition for the anodic oxidation is not specifically defined. Preferably, the aluminium support may be processed in a mode of direct current or alternating current electrolysis, in an amount of from 30 to 500 g/liter at a processing liquid temperature falling between 10 and 70° C., and at a current density falling between 0.1 and 40 A/m$^2$. The thickness of the oxide film to be formed may be from 0.5 to 1.5 μm, preferably from 0.5 to 1.0 μm. Preferably, the processing condition is so defined that the diameter of the micropores to be in the oxide film formed through the anodic oxidation on the support could be from 5 to 10 nm, and the pore density could be from $8 \times 10^{15}$ to $2 \times 10^{16}$/m$^2$.

For hydrophilicating the surface of the support, any known method is employable. One preferred treatment is hydrophilication with silicate or polyvinylphosphonic acid. Through the treatment, a hydrophilic film may be formed, having an Si or P content of from 2 to 40 mg/m$^2$, preferably from 4 to 30 mg/m$^2$. The coating amount may be determined through fluorescent X-ray spectrometry.

For example, the hydrophilication may be effected as follows: An aluminium support having an oxide film formed thereon through anodic oxidation is dipped in an aqueous solution that contains from 1 to 30% by mass, preferably from 2 to 15% by mass of an alkali metal silicate or polyvinylphosphonic acid and has a pH at 25° C. of from 10 to 13, for example, at 15 to 80° C. for 0.5 to 120 seconds.

The alkali metal silicate to be used for the hydrophilication includes sodium silicate, potassium silicate, lithium silicate. A hydroxide may be used for increasing the pH of the aqueous solution of alkali metal silicate, and it includes sodium hydroxide, potassium hydroxide, lithium hydroxide. If desired, an alkaline earth metal salt or a Group-IVB metal salt may be added to the processing solution. The alkaline earth metal salt includes nitrates such as calcium nitrate, strontium nitrate, magnesium nitrate, barium nitrate; and other water-soluble salts such as sulfates, chlorides, phosphates, oxalates, borates. The Group-IVB metal salt includes titanium tetrachloride, titanium trichloride, potassium titanium fluoride, potassium titanium oxalate, titanium sulfate, titanium tetraiodide, zirconium oxychloride, zirconium dioxide, zirconium oxychloride, zirconium tetrachloride.

The alkaline earth metal salt and the Group-IVB metal salt may be used either singly or as combined. The preferred range of the amount of the salt to be used may be from 0.01 to 10% by mass, more preferably from 0.05 to 5.0% by mass. In addition, silicate electrodeposition as in U.S. Pat. No. 3,658,662 is also effective. The electro-grained support as in JP-B 46-27481 or JP-A 52-58602 or 52-30503 may be surface-treated in a combined mode of anodic oxidation and hydrophilication as above, for use in the invention.

(Interlayer)

In the negative image-recording materials in which the polymerizable composition of the invention is used in the recording layer, an interlayer (this may be referred to as "undercoat layer") may be provided between the image-recording layer and the support for improving the adhesiveness therebetween and improving the staining resistance of the processed materials. In particular, when the polymerizable composition of the invention is used in lithographic printing plate precursors, the same interlayer may be provided therein. Specific examples of the interlayer are described in JP-B 50-7481: JP-A 54-72104, 59-101651, 60-149491, 60-2232998, 3-56177, 4-282637, 5-16558, 5-246171, 7-159983, 7-314937, 8-202025, 8-320551, 9-34104, 9-236911, 9-269593, 10-69092, 10-115931, 10-161317, 10-260536, 10-282682, 11-84647; Japanese Patent Application Nos. 8-225335, 8-270098, 9-195863, 9-195864, 9-89646, 9-106068, 9-183834, 9-264311, 9-127232, 9-245419, 10-127602, 10-170202, 11-36377, 11-165861, 11-284091, 2000-14697.

(Protective Layer)

When an image-recording material that contains the polymerizable composition in the recording layer thereof is processed to form an image thereon, its exposure to light is generally effected in air. Therefore, it is desirable to provide a protective layer (this may be referred to as "overcoat layer") on the image-recording layer. In particular, when the polymerizable composition is used in lithographic printing plate precursors, the embodiment of forming such a protective layer therein is preferred. The protective layer prevents oxygen and a low molecular substance, e.g., a basic substance present in the air, which inhibit the image formation reaction caused in the recording layer upon exposure, from penetrating into the recording layer and thereby enables the exposure in the air. Accordingly, the protective layer is required to have low permeability to a low molecular substance such as oxygen and preferably further has capabilities of not substantially inhibit the transmission of light used for the exposure, exhibiting excellent adhesion to the recording layer and being easily removed in development after exposure. Investigations on the protective layer have been made as described in detail in U.S. Pat. No. 3,458,311 and JP-A-55-49729.

Examples of the material which can be used in the protective layer include a water-soluble polymer compound having relatively good crystallinity. Specific examples thereof include a water-soluble polymer, for example, polyvinyl alcohol, polyvinyl pyrrolidone, acidic cellulose, gelatin, gum arabic or polyacrylic acid. Particularly, polyvinyl alcohol is preferably used as the main component of the protective layer, because most advantageous results in the fundamental properties such as oxygen inhibiting property and development removability can be obtained. The polyvinyl alcohol for use in the protective layer has necessary oxygen inhibiting property and water solubility, therefore, as long as it contains an unsubstituted vinyl alcohol unit, a part thereof may be substituted with an ester, an ether or an acetal. Similarly, a part of the polymer may have another copolymer component. Examples of the polyvinyl alcohol which can be used include those having a hydrolysis ratio of from 71 to 100 mol % and a molecular weight of from 300 to 2,400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 produced by Kuraray Co., Ltd.

The components of the protective layer (e.g., selection of PVA or use of additives) and the coating amount thereof are determined by taking account of fogging property, adhesive property and scratch resistance, in addition to the oxygen inhibiting property and the development removability. In general, when PVA having a higher hydrolysis ratio (namely, the protective layer has a higher unsubstituted vinyl alcohol unit content) is used and the layer thickness is larger, the oxygen inhibiting property becomes stronger and this is more advantageous in view of sensitivity. However, if the oxygen inhibiting property is extremely increased, undesirable polymerization reaction may be caused during the production or preservation, or undesirable fog or thickening of image line may be generated during image exposure. Further, the adhesive property to the image area and the scratch resistance are also very important in view of handling the plate. Specifically, when a hydrophilic layer comprising a water-soluble polymer is coated on a lipophilic recording layer, the layer is readily peeled off due to insufficient adhesion. As a result, the peeled part may undergo polymerization inhibition by oxygen, therefore causing some defects of film curing insufficiency. To overcome the problem, various proposals have been made to improve the adhesive property between those two layers. For example, in U.S. patent application Ser. Nos. 292,501 and 44,563, there are described techniques of mixing from 20 to 60% by mass of an acrylic emulsion or a water-insoluble vinyl pyrrolidone-vinyl acetate copolymer in a hydrophilic polymer mainly comprising polyvinyl alcohol and applying the mixture to a recording layer, thereby obtaining a sufficiently high adhesive property.

These known techniques can be applied to the protective layer for use in the invention. A coating method of the protective layer is described in detail, for example, in U.S. Pat. No. 3,458,311 and JP-B 55-49729.

The negative image-recording material in which the polymerizable composition of the invention is used in the recording layer is processed for at least exposure and development to record an image thereon. In particular, when the polymerizable composition of the invention is used in lithographic printing plate precursors, they are processed through exposure and development in the manner mentioned below, or processed in different methods, and they are thereby formed into printing plates.

A plate-making method from lithographic printing plate precursors where the polymerizable composition of the invention is used in the recording layer is described in detail hereinunder.

The source of light to which the lithographic printing plate precursor is exposed may be any known one with no limitation. Preferably, the wavelength of the light source falls between 300 nm and 1200 nm. Concretely, various lasers are preferred for the light source. In particular, IR laser having a wavelength of from 780 nm to 1200 nm is especially preferably used.

The exposure mechanism may be any of internal surface drum system, external surface drum system and flat bed system.

Other light sources may also be used for exposure of the lithographic printing plate precursors. For example, they include various mercury lamps of ultrahigh pressure, high pressure, medium pressure or low pressure, chemical lamps, carbon arc lamps, xenon lamps, metal halide lamps, visible or IR laser lamps, fluorescent lamps, tungsten lamps, and sunlight.

After exposed to light, the lithographic printing plate precursors are developed. For the developer, preferred is an aqueous alkali solution having a pH of at most 14, and more preferred is an aqueous alkali solution containing an anionic surfactant and having a pH of from 8 to 12. For example, inorganic alkali agents may be used, and they include sodium, potassium and ammonium tertiary phosphates, sodium, potassium and ammonium secondary phosphates, sodium, potassium and ammonium carbonates, sodium, potassium and ammonium hydrogencarbonates, sodium, potassium and ammonium borates, sodium, ammonium, potassium and lithium hydroxides. In addition, organic alkali agents may also be used, and they include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine. Either singly or as combined, one or more of these alkali agents may be used.

The developer to be used for developing the lithographic printing plate precursors may contain from 1 to 20% by mass, preferably from 3 to 10% by mass of an anionic surfactant. If the amount of the surfactant in the developer is too small, the developability with the developer may worsen; but if too large, it may cause some problems in that the strength such as abrasion resistance of the images formed may lower. The anionic surfactant includes, for example, sodium lauryl alcohol sulfate, ammonium lauryl alcohol sulfate, sodium octyl alcohol sulfate; salts of alkylarylsulfonic acids such as sodium isopropylnaphthalenesulfonate, sodium isobutylnaphthalenesulfonate, sodium salt of polyoxyethylene glycol mononaphthyl ether sulfate, sodium dodecylbenzenesulfonate, sodium metanitrobenzenesulfonate; sulfates with higher alcohols having from 8 to 22 carbon atoms such as secondary sodium alkylsulfates; salts of phosphates with aliphatic alcohols such as sodium cetyl alcohol phosphate; sulfonates of alkylamides such as $C_{17}H_{33}CON(CH_3)CH_2CH_2SO_3Na$; sulfonates of dibasic aliphatic esters such as dioctyl sodiumsulfosuccinate, dihexyl sodiumsulfosuccinate.

If desired, an organic solvent miscible with water, such as benzyl alcohol, may be added to the developer. Suitably, the organic solvent has a solubility in water of at most about 10% by mass, preferably at most 5% by mass. For example, it includes 1-phenylethanol, 2-phenylethanol, 3-phenylpropanol, 1,4-phenylbutanol, 2,2-phenylbutanol, 1,2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol, and 3-methylcyclohexanol. The organic solvent content of the developer is preferably from 1 to 5% by mass of the total mass of the developer in service. The amount of the organic solvent in the developer has close relation to the amount of the surfactant therein. With the increase in the amount of the organic solvent therein, the amount of the anionic surfactant in the developer is preferably increased. This is because, if the amount of the organic solvent in the developer is increased while that of the anionic surfactant is small, then the organic solvent could not dissolve in the developer and therefore good developability could not be ensured.

If desired, the developer may contain any other additive such as defoaming agent and water softener. The water softener includes, for example, $Na_2P_2O_7$, $Na_5P_3O_3$, $Na_3P_3O_9$, $Na_2O_4P(NaO_3P)PO_3Na_2$; polyphosphates such as Calgon (sodium polymethacrylate); aminopolycarboxylic acids (e.g., ethylenediaminetetraacetic acid, and its potassium salt, sodium salt; diethylenetriamine-pentaacetic acid, and its potassium salt, sodium salt; triethylenetetramine-hexaacetic acid, and its potassium salt, sodium salt; hydroxyethylethylenediamine-triacetic acid, and its potassium salt, sodium salt; nitrilotriacetic acid, and its potassium salt, sodium salt; 1,2-diaminocyclohexane-tetraacetic acid, and its potassium salt, sodium salt; 1,3-diamino-2-propanol-tetraacetic acid, and its potassium salt, sodium salt), other polycarboxylic acids (e.g., 2-phosphonobutane-tricarboxylic acid-1,2,4, and its potassium salt, sodium salt: 2-phosphonobutanone-tricarboxylic acid-2,3,4, and its potassium salt, sodium salt); organic phosphonic acids (e.g., 1-phosphonoethane-tricarboxylic acid-1,2,2, and its potassium salt, sodium salt; 1-hydroxyethane-1,1-diphosphonic acid, and its potassium salt, sodium salt; aminotri(methylenephosphonic acid), and its potassium salt, sodium salt). The most preferred amount of the water softener to be in the developer varies, depending on the hardness and the amount of hard water to be used, but in general, it may be from 0.01 to 5% by mass, preferably from 0.01 to 0.5% by mass of the developer.

In case where the lithographic printing plate precursors are developed in an automatic developing machine, the developer used will be fatigued in accordance with the amount of the precursors processed therewith, and a replenisher or a fresh developer may be supplied to the machine for restoring the ability of the processing solution in the machine. In this case, the replenishment is preferably effected according to the method described in U.S. Pat. No. 4,882,246. The developers described in JP-A 50-26601, 58-54341, and JP-B 56-39464, 56-42860, 57-7427 are also preferred.

Thus developed, the lithographic printing plate precursors may be post-processed with washing water, or a rinsing solution containing surfactant, or a desensitizer containing gum arabic or starch derivative, as in JP-A 54-8002, 55-115045, 59-58431. These treatments may be combined in any desired manner for post-processing the lithographic printing plate precursors.

In the plate-making method of processing the lithographic printing plate precursors, if desired, the precursors being processed may be heated on the entire surface thereof before exposure, during exposure, after exposure and during development. The heating produces various advantages in that it promotes the image formation on the recording layer, improves the sensitivity and the printing durability, and stabilizes the sensitivity. For further improving the image strength and the printing durability, it may be effective to treat the entire surface of the developed plates for post-heating or post-exposure thereof.

In general, the heating before development is effected preferably under mild condition at 150° C. or lower. If the temperature is too high, it may cause a problem of undesired curing reaction in the non-image area. However, the heating after development may be effected under extremely severe condition. In general, the heating temperature after development may fall between 200 and 500° C. If the heating temperature after development is too low, it will be ineffective for enhancing the image strength; but if too high, it may cause some problems in that the support may be deteriorated and the image area may be thermally decomposed.

The lithographic printing plate thus obtained through these treatments is set in an offset printer and is driven to give a large number of prints.

Plate cleaners may be used for cleaning the printing plates used for producing prints. For example, PS plate cleaners heretofore well known in the art may be used, and they include, for example, CL-1, CL-2, CP, CN-4, CN, CG-1, PC-1, SR, IC (by Fuji Photo Film).

EXAMPLES

The invention is described more concretely with reference to the following Examples, which, however, are not intended to restrict the scope of the invention.

Production Example 1

Production of Specific Alkali-Soluble Polymer (A), P-2

<Preparation of Starting Monomer M-1>

An acetone solution of methyl 4-aminobenzoate (from Wako Pure Chemicals) (302 g) and sodium acetate (from Wako Pure Chemicals) (164 g) was cooled to 0° C., and methacrylic acid chloride (from Wako Pure Chemicals) (220 g) was dropwise added to it. The solution was filtered, and the resulting filtrate was put into hydrochloric acid (35 wt. % aqueous solution) (8 liters), and filtered. The resulting filtrate was dried in vacuum to obtain a white solid, starting monomer M-1 having the structure mentioned below. M-1 was identified through $^1$H-NMR and IR spectrometry.

Starting Monomer M-1

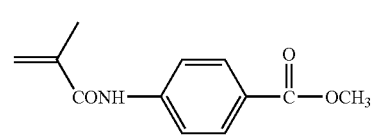

Starting Monomer M-2

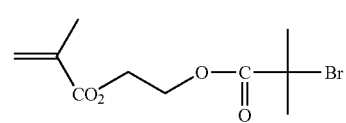

<Production of Polymer (P-2)>

An N,N-dimethylacetamide (156 g) solution of Light Ester. HO-MS (from Kyoeisha Chemical) (22 g), the starting monomer M-1 obtained as in the above (17 g), starting monomer M-2 having the above-mentioned structure (87 g) and dimethyl 2,2'-azobis(2-methylpropionate) (from Wako Pure Chemicals) (0.7 g) was dropwise added to N,N-dimethylacetamide (156 g) in a nitrogen atmosphere at 80° C., taking 2.5 hours. After the addition, this was stirred at 80° C. for 2 hours. After cooled, N,N-dimethylacetamide (446 g), p-methoxyphenol (from Wako Pure Chemicals) (0.5 g) and 1,8-diazabicyclo[5.4.0]-7-undecene (from Wako Pure Chemicals) (155 g) were added to the solution, and stirred at room temperature for 12 hours. Next, methanesulfonic acid (from Wako Pure Chemicals) (98 g) was dropwise added to it at 0° C., and the resulting solution was put into water (8 liters) stirred vigorously, and this was stirred for 30 minutes. The white solid formed was taken out through filtration and dried to obtain a specific alkali-soluble polymer P-2.

The specific alkali-soluble polymer P-2 was identified through gel permeation chromatography, acid value titration (with aqueous 0.1 M sodium hydroxide solution), NMR and IR spectrometry.

Production Example 2

Production of Specific Alkali-Soluble Polymer (A), P-18

<Production of Polymer (P-18)>

An N,N-dimethylacetamide (1267 g) solution of Light Ester HO-MS (from Kyoeisha Chemical) (173 g), N-phenylmethacrylamide (from Tokyo Chemical) (242 g), the starting monomer M-2 having the above-mentioned structure (628 g) methacrylic acid (from Wako Pure Chemicals) (43 g) and dimethyl 2,2'-azobis(2-methylpropionate) (from Wako Pure Chemicals) (6.9 g) was dropwise added to N,N-dimethylacetamide (1267 g) in a nitrogen atmosphere at 80° C., taking 2.5 hours. After the addition, this was stirred at 80° C. for 2 hours. After cooled, N,N-dimethylacetamide (3376 g), p-methoxyphenol (from Wako Pure Chemicals) (5.0 g) and 1,8-diazabicyclo[5.4.0]-7-undecene (from Wako Pure Chemicals) (1332 g) were added to the solution, and stirred at room temperature for 12 hours. Next, methanesulfonic acid (from Wako Pure Chemicals) (841 g) was dropwise added to it at 0° C., and the resulting solution was put into water (70 liters) stirred vigorously, and this was stirred for 30 minutes. The white solid formed was taken out through filtration and dried to obtain a specific alkali-soluble polymer P-18.

The specific alkali-soluble polymer P-18 was identified through gel permeation chromatography, acid value titration (with aqueous 0.1 M sodium hydroxide solution), NMR and IR spectrometry.

Other various specific alkali-soluble polymers (A), and comparative polymers (CO-1) to (CP-8) were produced in the same manner as in Production Example 1, except that the starting compounds were varied. Their structures are shown below.

Examples 1 to 50, Comparative Examples 1 to 14

(Formation of Support)

<Support 1: Aluminium Support Processed For Anodic Oxidation>

An aluminium sheet (1S grade) having a thickness of 0.30 mm was grained with an aqueous suspension of 800-mesh pumice stone, using a #8 nylon brush, and then well washed with water. This was etched by dipping in 10% sodium hydroxide at 70° C. for 60 seconds, and then washed with running water, washed with 20% $HNO_3$ for neutralization, and then washed with water, This was electrolytically surface-roughened with sine wave alternating current applied thereto under a condition of VA=12.7 V, in an aqueous 1% nitric acid solution. The quantity of electricity at the anode was 300 C/dm². The surface roughness of the sheet was measured and was 0.45 µm (as Ra). Next, this was dipped in an aqueous 30% $H_2SO_4$ solution, and desmutted at 55° C. for 2 minutes therein. Then, this was put in an aqueous 20% $H_2SO_4$ solution at 33° C. with a cathode applied to the grained surface thereof, and subjected to anodic oxidation for 50 minutes at a current density of 5 A/dm². The oxide film thus formed on it had a thickness of 2.7 g/m². This is support 1.

<Support 2>

The support 1 was coated with a liquid composition for undercoating surface treatment mentioned below so that the Si content of the coating layer could be about 0.001 g/m², and then dried at 100° C. for 1 minute. This is support 2.

(Liquid Composition for Undercoat)

The following components were mixed and stirred to prepare a liquid composition for undercoat. After about 5 minutes, the mixture generated heat, and this was reacted for 60 minutes as such. Then, this was transferred into a different reactor, and 30,000 parts by mass of methanol was added to it.

| -Liquid Composition for Undercoat- | |
|---|---|
| Unichemical's Phosmer PE | 20 mas. pts. |
| Methanol | 130 mas. pts. |
| Water | 20 mas. pts. |
| Paratoluenesulfonic acid | 5 mas. pts. |
| Tetraethoxysilane | 50 mas. pts. |
| 3-Methacryloxypropyltriethoxysilane | 50 mas. pts. |

The back of the thus-processed support (the face thereof not coated with the undercoating composition) was coated with a back-coating solution mentioned below, using a bar coater, and dried at 100° C. for 1 minutes to form thereon a back-coat layer having a dry coating amount of 70 mg/m².

(Back-Coating Solution)

The following components for sol-gel reaction liquid were mixed and stirred, whereupon it generated heat in about 5 minutes. Then, this was reacted for 60 minutes as such, and a solution A comprising the following components was added to it to give a back-coating solution.

| -Sol-Gel Reaction Liquid- | |
|---|---|
| Tetraethyl silicate | 50 mas.pts. |
| Water | 20 mas.pts. |
| Methanol | 15 mas.pts. |
| Phosphoric acid | 0.05 mas.pts. |
| -Composition of Solution A- | |
| Pyrogallol-formaldehyde condensate resin (molecular weight, 2000) | 4 mas.pts. |
| Dibutyl phthalate | 5 mas.pts. |
| Fluorine-containing surfactant (N-butylperfluoro-octanesulfonamidoethyl acrylate/polyoxyethylene acrylate copolymer: molecular weight, 20,000) | 0.7 mas.pts. |

| | |
|---|---|
| Methanol silica sol (from Nissan Chemical Industry: methanol 30 mas. %) | 50 mas.pts. |
| Methanol | 800 mas.pts. |

(Formation of Recording Layer)

The surface of the thus-processed aluminium support (the face thereof coated with the undercoating composition) was coated with a coating solution for recording layer mentioned below so that the dry coating amount could be 1.5 g/m², and dried at 100° C. for 1 minute to form a recording layer thereon.

(Coating Solution for Recording Layer)

| | |
|---|---|
| Binder polymer (in Examples, this corresponds to component (A)) | (as in Tables 1 to 8) |
| (B) Ethylenic unsaturated bond-having compound | (as in Tables 1 to 8) |
| (C) Compound of generating radical by light or heat | (as in Tables 1 to 8) |
| (D) Sensitizing Dye | (as in Tables 1 to 8) |
| Additive [S] | (as in Tables 1 to 8) |
| Fluorine-containing surfactant (Megafac F-177 from Dainippon Ink Chemical Industry) | 0.03 g |
| Thermal polymerization inhibitor (N-nitrosophenylhydroxylamine aluminium salt) | 0.01 g |
| Pigment dispersion (as mentioned below) | 2.0 g |
| Methyl ethyl ketone | 20 g |
| Propylene glycol monomethyl ether | 20 g |

(Composition of Pigment Dispersion)

| | |
|---|---|
| Pigment Blue 15:6 | 15 mas. pts. |
| Allyl methacrylate/methacrylic acid copolymer (copolymerization ratio, 83/17 by mol) | 10 mas. pts. |
| Cyclohexanone | 15 mas. pts. |
| Methoxypropyl acetate | 20 mas. pts. |
| Propylene glycol monomethyl ether | 40 mas. pts. |

The binder polymers in Examples in the following Tables 1 to 8 are the specific alkali-soluble polymers (A) produced in the above-mentioned Production Examples. These alkali-soluble polymers were tested for storage stability. Concretely, 25 g of the alkali-soluble polymer to be tested was dissolved in 1 liter of an aqueous alkali solution having a pH of 12, then sealed up, and stored in an atmosphere at 25° C. for 60 days. After thus stored, the solution was visually checked for the presence or absence of polymer deposition. The alkali-soluble polymers P-1 to P-32 of the invention gave no deposition after stored for 60 days. On the other hand, the comparative polymers CP-1 to CP-5 gave some deposition confirmed through visual observation.

The compounds used for the binder polymer, the ethylenic unsaturated bond-having compound (B), the compound of generating a radical by light or heat (C) (radical generator in Tables 1 to 8) and the sensitizing dye (D), and their amount are shown in Tables 1 to 8 below.

TABLE 1

| | Polymer Binder (content) | (B) Addition-Polymer-izable Compound (content) | (C) Radical Generator (content) | (D) Sensitiz-ing Dye (content) | Other Additive (content) | Protec-tive layer | Support | Develop-er | Printing Durability | Stain-ing Resis-tance in Non-image Area | Light Source | Develop-ment Sediment |
|---|---|---|---|---|---|---|---|---|---|---|---|---|
| Example 1 | P-1 (1.0 g) | DPHA (1.0 g) | C-1 (0.3 g) | D-2 (0.1 g) | no | yes | 1 | 1 | 95,000 copies | good | 400 | ○ |
| Example 2 | P-2 (1.0 g) | U-2 (0.5 g) | C-2 (0.3 g) | D-2 (0.05 g) | S-1 (0.5 g) | yes | 1 | 1 | 110,000 copies | good | 400 | ○ |
| Example 3 | P-3 (1.2 g) | DPHA (1.0 g) | C-1 (0.2 g) | D-2 (0.1 g) | S-2 (0.5 g) | yes | 1 | 1 | 90,000 copies | good | 400 | ○ |
| Example 4 | P-4 (1.0 g) | DPHA (1.0 g) | C-3 (0.25 g) | D-2 (0.08 g) | S-2 (0.6 g) | yes | 1 | 1 | 101,000 copies | good | 400 | ○ |
| Example 5 | P-5 (1.0 g) | U-2 (1.0 g) | C-2 (0.3 g) | D-2 (0.1 g) | S-2 (0.5 g) | yes | 1 | 1 | 100,000 copies | good | 400 | ○ |
| Example 6 | P-16 (1.0 g) | A-2 (1.0 g) | C-1 (0.2 g) | D-2 (0.1 g) | S-2 (0.5 g) | yes | 1 | 1 | 65,000 copies | good | 400 | ○ |
| Example 7 | P-17 (1.0 g) | A-1 (1.0 g) | C-1 (0.2 g) | D-2 (0.1 g) | S-2 (0.5 g) | yes | 1 | 1 | 65,000 copies | good | 400 | ○ |
| Comp. Ex. 1 | CP-1 (1.0 g) | U-2 (0.5 g) | C-1 (0.3 g) | D-2 (0.5 g) | S-1 (0.5 g) | yes | 1 | 1 | 35,000 copies | good | 400 | x |
| Comp. Ex. 2 | CP-2 (1.2 g) | DPHA (1.0 g) | C-1 (0.2 g) | D-2 (0.1 g) | S-2 (0.5 g) | yes | 1 | 1 | 35,000 copies | stained | 400 | x |

TABLE 2

| | Polymer Binder (content) | (B) Addition-Polymerizable Compound (content) | (C) Radical Generator (content) | (D) Sensitizing Dye (content) | Other Additive (content) | Protective layer | Support | Developer | Printing Durability | Staining Resistance in Non-image Area | Light Source | Development Sediment |
|---|---|---|---|---|---|---|---|---|---|---|---|---|
| Example 8 | P-6 (1.5 g) | U-2 (0.5 g) | C-1 (0.3 g) | D-1 (0.08 g) | no | yes | 1 | 1 | 120,000 copies | good | 532 | ○ |
| Example 9 | P-7 (1.2 g) | U-1 (0.5 g) | C-1 (0.3 g) | D-1 (1.1 g) | S-3 (0.4 g) | yes | 1 | 1 | 95,000 copies | good | 532 | ○ |
| Example 10 | P-8 (1.2 g) | DPHA (1.0 g) | C-1 (0.2 g) | D-1 (1.0 g) | no | yes | 2 | 2 | 90,000 copies | good | 532 | ○ |
| Example 11 | P-9 (1.0 g) | U-2 (1.0 g) | C-2 (0.2 g) | D-1 (1.0 g) | S-4 (0.4 g) | yes | 1 | 1 | 97,000 copies | good | 532 | ○ |
| Example 12 | P-10 (1.0 g) | DPHA (1.0 g) | C-2 (0.2 g) | D-1 (1.0 g) | S-3 (0.4 g) | yes | 2 | 1 | 115,000 copies | good | 532 | ○ |
| Example 13 | P-16 (1.5 g) | A-2 (1.0 g) | C-1 (0.3 g) | D-1 (0.08 g) | S-3 (0.4 g) | yes | 1 | 1 | 60,000 copies | good | 532 | ○ |
| Example 14 | P-17 (1.5 g) | A-2 (1.2 g) | C-1 (0.3 g) | D-1 (0.08 g) | S-3 (0.4 g) | yes | 1 | 1 | 80,000 copies | good | 532 | ○ |
| Comp. Ex. 3 | CP-2 (1.0 g) | DPHA (0.5 g) | C-1 (0.25 g) | D-1 (1.0 g) | no | yes | 2 | 2 | 40,000 copies | good | 532 | x |
| Comp. Ex. 4 | CP-3 (1.2 g) | U-2 (1.0 g) | C-2 (0.2 g) | D-1 (1.0 g) | S-4 (0.4 g) | yes | 1 | 1 | 32,000 copies | good | 532 | x |

TABLE 3

| | Polymer Binder (content) | (B) Addition-Polymerizable Compound (content) | (C) Radical Generator (content) | (D) Sensitizing Dye (content) | Other Additive (content) | Protective layer | Support | Developer | Printing Durability | Staining Resistance in Non-image Area | Light Source | Development Sediment |
|---|---|---|---|---|---|---|---|---|---|---|---|---|
| Example 15 | P-2 (1.6 g) | A-1 (0.25 g) | C-2 (0.2 g) | D-4 (0.08 g) | no | yes | 1 | 1 | 160,000 copies | good | 830 | ○ |
| Example 16 | P-2 (1.2 g) | U-1 (0.5 g) | C-2 (0.15 g) | D-4 (0.08 g) | no | no | 1 | 1 | 89,000 copies | good | 830 | ○ |
| Example 17 | P-6 (1.5 g) | DPHA (0.5 g) | C-2 (0.3 g) | D-4 (0.1 g) | no | yes | 1 | 1 | 140,000 copies | good | 830 | ○ |
| Example 18 | P-6 (1.4 g) | U-2 (1.0 g) | C-2 (0.3 g) | D-4 (0.05 g) | no | no | 1 | 1 | 76,000 copies | good | 830 | ○ |
| Example 19 | P-11 (1.0 g) | DPHA (1.0 g) | C-3 (0.2 g) | D-3 (0.1 g) | no | yes | 2 | 2 | 90,000 copies | good | 830 | ○ |
| Example 20 | P-12 (1.2 g) | U-1 (0.5 g) | C-4 (0.25 g) | D-4 (0.08 g) | no | yes | 1 | 1 | 131,000 copies | good | 830 | ○ |
| Example 21 | P-13 (1.5 g) | DPHA (0.5 g) | C-2 (0.20 g) | D-4 (0.08 g) | no | no | 1 | 1 | 70,000 copies | good | 830 | ○ |
| Example 22 | P-14 (1.2 g) | DPHA (1.0 g) | C-5 (0.15 g) | D-4 (0.08 g) | no | yes | 1 | 1 | 80,000 copies | good | 830 | ○ |
| Example 23 | P-15 (1.4 g) | A-1 (1.0 g) | C-6 (0.2 g) | D-4 (0.08 g) | no | no | 2 | 2 | 72,000 copies | good | 830 | ○ |
| Example 24 | P-16 (1.0 g) | A-1 (0.5 g) | C-2 (0.25 g) | D-4 (0.08 g) | no | yes | 1 | 1 | 70,000 copies | good | 830 | ○ |
| Example 25 | P-16 (1.0 g) | A-2 (1.0 g) | C-2 (0.25 g) | D-4 (0.08 g) | no | no | 1 | 1 | 60,000 copies | good | 830 | ○ |
| Example 26 | P-17 (1.2 g) | A-1 (1.0 g) | C-2 (0.25 g) | D-4 (0.08 g) | no | yes | 1 | 1 | 70,000 copies | good | 830 | ○ |
| Example 27 | P-17 (1.2 g) | A-2 (1.2 g) | C-2 (0.25 g) | D-4 (0.08 g) | no | no | 1 | 1 | 60,000 copies | good | 830 | ○ |

TABLE 4

| | Polymer Binder (content) | (B) Addition-Polymerizable Compound (content) | (C) Radical Generator (content) | (D) Sensitizing Dye (content) | Other Additive (content) | Protective layer | Support | Developer | Printing Durability | Staining Resistance in Non-image Area | Light Source | Development Sediment |
|---|---|---|---|---|---|---|---|---|---|---|---|---|
| Comp. Ex. 5 | CP-1 (1.5 g) | DPHA (0.5 g) | C-3 (0.3 g) | D-4 (0.1 g) | no | yes | 1 | 1 | 50,000 copies | good | 830 | x |
| Comp. Ex. 6 | CP-2 (1.2 g) | U-1 (0.5 g) | C-2 (0.15 g) | D-4 (0.08 g) | no | no | 1 | 1 | 20,000 copies | stained | 830 | x |
| Comp. Ex. 7 | CP-2 (1.0 g) | A-1 (0.5 g) | C-2 (0.25 g) | D-4 (0.08 g) | no | yes | 1 | 1 | 50,000 copies | good | 830 | x |

TABLE 5

| | Polymer Binder (content) | (B) Addition-Polymerizable Compound (content) | (C) Radical Generator (content) | (D) Sensitizing Dye (content) | Other Additive (content) | Protective layer | Support | Developer | Printing Durability | Staining Resistance in Non-image Area | Light Source | Development Sediment |
|---|---|---|---|---|---|---|---|---|---|---|---|---|
| Example 28 | P-18 (1.0 g) | DPHA (1.0 g) | C-2 (0/3 g) | D-2 (0.1 g) | no | yes | 1 | 1 | 95,000 copies | good | 400 | o |
| Example 29 | P-19 (1.0 g) | U-2 (0.5 g) | C-2 (0/3 g) | D-2 (0.05 g) | S-1 (0.5 g) | yes | 1 | 1 | 100,000 copies | good | 400 | o |
| Example 30 | P-20 (1.2 g) | DPHA (1.0 g) | C-3 (0.2 g) | D-2 (0.1 g) | S-2 (0.5 g) | yes | 1 | 1 | 90,000 copies | good | 400 | o |
| Example 31 | P-21 (1.0 g) | DPHA (1.0 g) | C-1 (0.25 g) | D-2 (0.08 g) | S-2 (0.6 g) | yes | 1 | 1 | 90,000 copies | good | 400 | o |
| Example 32 | P-22 (1.0 g) | U-2 (1.0) | C-1 (0.3 g) | D-2 (0.1 g) | S-2 (0.5 g) | yes | 1 | 1 | 95,000 copies | good | 400 | o |
| Example 33 | P-29 (1.0 g) | A-2 (1.0 g) | C-3 (0.2 g) | D-2 (0.1 g) | S-2 (0.5 g) | yes | 1 | 1 | 75,000 copies | good | 400 | o |
| Comp. Ex. 8 | CP-3 (1.0 g) | U-2 (0.5 g) | C-1 (0.3 g) | D-2 (0.5 g) | S-1 (0.5 g) | yes | 1 | 1 | 35,000 copies | stained | 400 | x |
| Comp. Ex. 9 | CP-4 (1.2 g) | DPHA (1.0 g) | C-1 (0.2 g) | D-2 (0.1 g) | S-2 (0.5 g) | yes | 1 | 1 | 35,000 copies | stained | 400 | x |

TABLE 6

| | Polymer Binder (content) | (B) Addition-Polymerizable Compound (content) | (C) Radical Generator (content) | (D) Sensitizing Dye (content) | Other Additive (content) | Protective layer | Support | Developer | Printing Durability | Staining Resistance in Non-image Area | Light Source | Development Sediment |
|---|---|---|---|---|---|---|---|---|---|---|---|---|
| Example 34 | P-23 (1.5 g) | U-2 (0.5 g) | C-2 (0.3 g) | D-1 (0.08 g) | no | yes | 1 | 1 | 70.000 copies | good | 532 | o |
| Example 35 | P-24 (1.2 g) | U-1 (0.5 g) | C-2 (0.3 g) | D-1 (1.1 g) | S-3 (0.4 g) | yes | 1 | 1 | 70,000 copies | good | 532 | o |
| Example 36 | P-25 (1.0 g) | DPHA (1.0 g) | C-2 (0.3 g) | D-1 (1.0 g) | no | yes | 2 | 2 | 70,000 copies | good | 532 | o |
| Example 37 | P-26 (1.0 g) | U-2 (1.0 g) | C-1 (0.2 g) | D-1 (1.0 g) | S-4 (0.4 g) | yes | 1 | 1 | 120,000 copies | good | 532 | o |
| Example 38 | P-27 (1.0 g) | DPHA (1.0 g) | C-1 (0.2 g) | D-1 (1.0 g) | S-3 (0.4 g) | yes | 2 | 1 | 115,000 copies | good | 532 | o |
| Example 39 | P-28 (1.5 g) | A-2 (1.2 g) | C-2 (0.3 g) | D-1 (0.08 g) | S-3 (0.4 g) | yes | 1 | 1 | 80,000 copies | good | 532 | o |
| Comp. Ex. 10 | CP-3 (1.0 g) | DPHA (0.5 g) | C-1 (0.25 g) | D-1 (1.0 g) | no | yes | 2 | 2 | 40,000 copies | good | 532 | x |
| Comp. Ex. 11 | CP-4 (1.0 g) | U-2 (1.0 g) | C-2 (0.2 g) | D-1 (1.0 g) | S-4 (0.4 g) | yes | 1 | 1 | 32,000 copies | good | 532 | x |

TABLE 7

| | Polymer Binder (content) | (B) Addition-Polymerizable Compound (content) | (C) Radical Generator (content) | (D) Sensitizing Dye (content) | Other Additive (content) | Protective layer | Support | Developer | Printing Durability | Staining Resistance in Non-image Area | Light Source | Development Sediment |
|---|---|---|---|---|---|---|---|---|---|---|---|---|
| Example 40 | P-18 (1.0 g) | A-1 (0.5 g) | C-3 (0.25 g) | D-4 (0.08 g) | no | yes | 1 | 1 | 120,000 copies | good | 830 | ○ |
| Example 41 | P-18 (1.2 g) | U-2 (0.5 g) | C-2 (0.15 g) | D-4 (0.08 g) | no | no | 1 | 1 | 70,000 copies | good | 830 | ○ |
| Example 42 | P-19 (1.5 g) | U-1 (0.5 g) | C-2 (0.3 g) | D-4 (0.1 g) | no | yes | 1 | 1 | 100,000 copies | good | 830 | ○ |
| Example 43 | P-19 (1.4 g) | DPHA (1.0 g) | C-2 (0.3 g) | D-4 (0.05 g) | no | no | 1 | 1 | 71,000 copies | good | 830 | ○ |
| Example 44 | P-22 (1/0 g) | A-1 (1.0 g) | C-3 (0.2 g) | D-3 (0.1 g) | no | yes | 2 | 2 | 90,000 copies | good | 830 | ○ |
| Example 45 | P-22 (1.2 g) | A-1 (0.5 g) | C-4 (0.25 g) | D-4 (0.08 g) | no | yes | 1 | 1 | 90,000 copies | good | 830 | ○ |
| Example 46 | P-29 (1.5 g) | A-1 (0.5 g) | C-2 (0.20 g) | D-4 (0.08 g) | no | no | 1 | 1 | 70,000 copies | good | 830 | ○ |
| Example 47 | P-30 (1.2 g) | U-1 (1.0 g) | C-5 (0.15 g) | D-4 (0.08 g) | no | yes | 1 | 1 | 80,000 copies | good | 830 | ○ |
| Example 48 | P-31 (1.4 g) | DPHA (0.5 g) | C-6 (0.2 g) | D-4 (0.08 g) | no | no | 2 | 2 | 72,000 copies | good | 830 | ○ |
| Example 49 | P-32 (1.0 g) | U-1 (0.5 g) | C-2 (0.25 g) | D-4 (0.08 g) | no | yes | 1 | 1 | 70,000 copies | good | 830 | ○ |
| Example 50 | P-28 (1.0 g) | A-2 (1.0 g) | C-2 (0.25 g) | D-4 (0.08 g) | | no | 1 | 1 | 60,000 copies | good | 830 | ○ |

TABLE 8

| | Polymer Binder (content) | (B) Addition-Polymerizable Compound (content) | (C) Radical Generator (content) | (D) Sensitizing Dye (content) | Other Additive (content) | Protective layer | Support | Developer | Printing Durability | Staining Resistance in Non-image Area | Light Source | Development Sediment |
|---|---|---|---|---|---|---|---|---|---|---|---|---|
| Comp. Ex. 12 | CP-3 (1.0 g) | A-1 (0.5 g) | C-3 (0.25 g) | D-4 (0.08 g) | no | yes | 1 | 1 | 50,000 copies | good | 830 | x |
| Comp. Ex. 13 | CP-4 (1.2 g) | U-1 (0.5 g) | C-2 (0.15 g) | D-4 (0.08 g) | no | no | 1 | 1 | 20,000 copies | stained | 830 | x |
| Comp. Ex. 14 | CP-4 (1.0 g) | a-1 (0.5 g) | C-2 (0.25 g) | D-4 (0.08 g) | no | yes | 1 | 1 | 50,000 copies | good | 830 | x |

The structures of the specific alkali-soluble polymers (A) used in Examples [(P-1) to (P-32)], the comparative binder polymers used in Comparative Examples [(CO-1) to (CP-5)], the ethylenic unsaturated bond-having compounds (B) [(DPHA), (U-1), (U-2), (A-1) and (A-2)], the compounds of generating a radical by light or heat (C) [(C-1) to (C-6)], the sensitizing dyes [(D-1) to (D-4)], and the additives [(S-1) to (S-4)] are shown below.

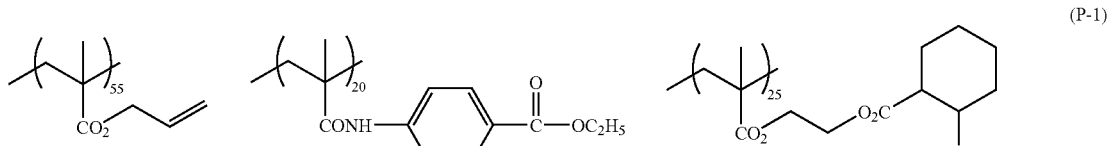

(P-1)

Mw 100,000

-continued
(P-2)
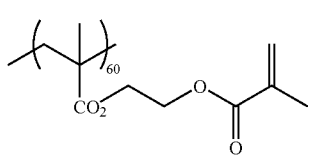 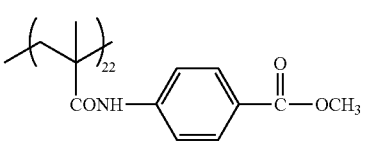 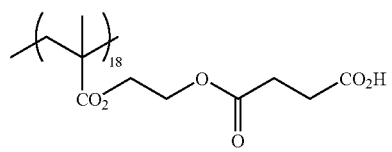
Mw 90,000
(P-3)
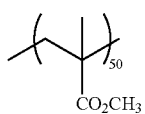 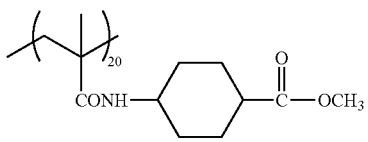 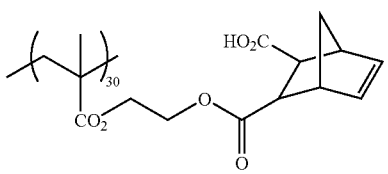
Mw 160,000
(P-4)
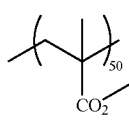 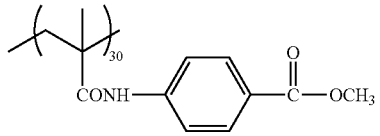 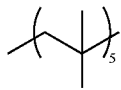
 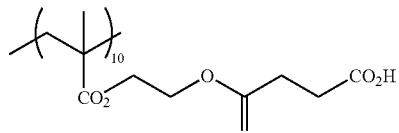
Mw 50,000
(P-5)
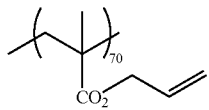 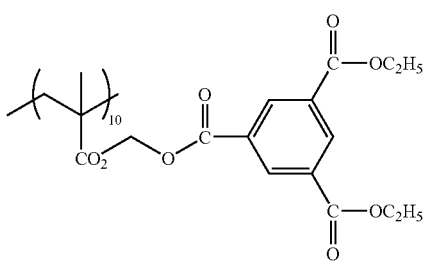
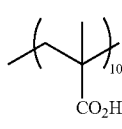 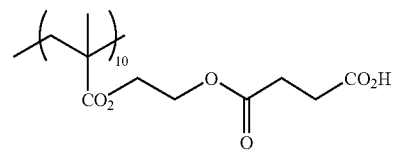
Mw 70,000
(P-6)
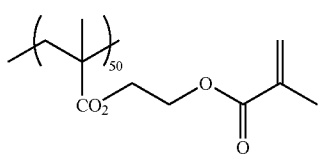 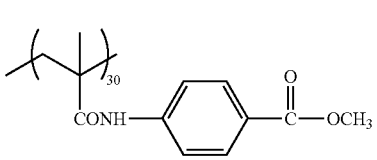

-continued
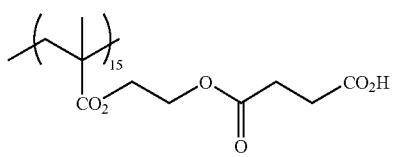 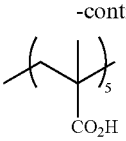
Mw 100,000
(P-7)
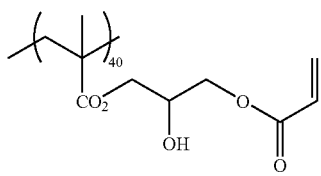 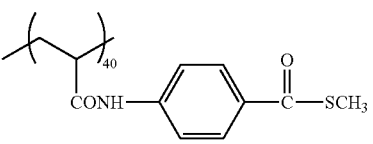
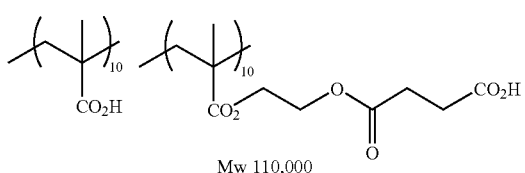
Mw 110,000
(P-8)
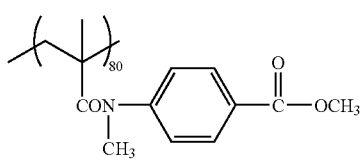 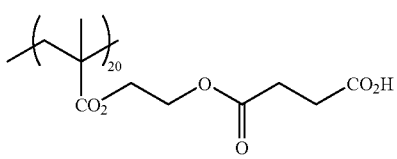
Mw 140,000
(P-9)
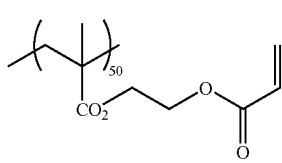 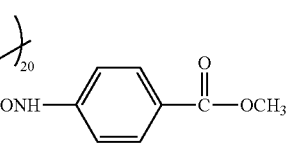
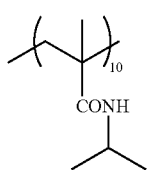 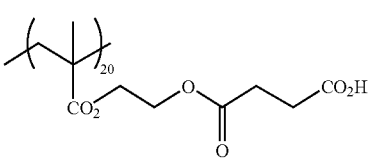
Mw 100,000
(P-10)
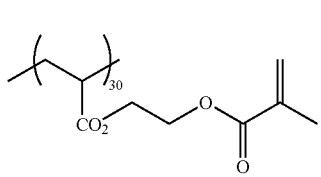 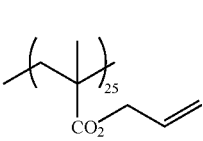 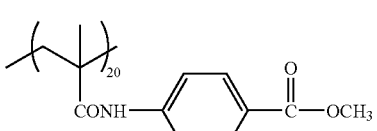
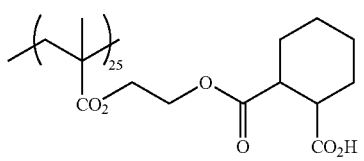
Mw 100,000

-continued
(P-11)
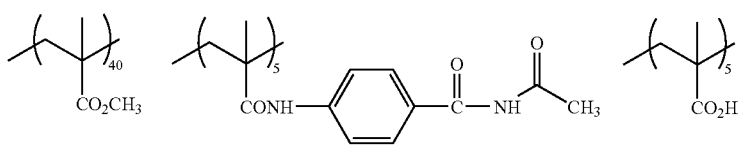
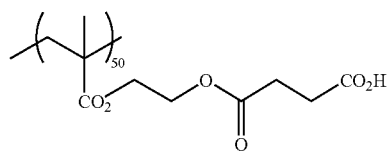
Mw 70,000
(P-12)
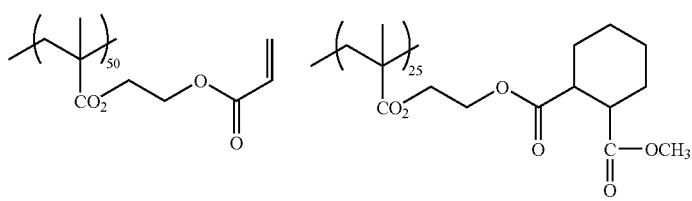
Mw 160,000
(P-13)
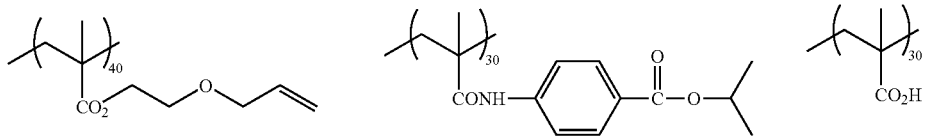
Mw 170,000
(P-14)
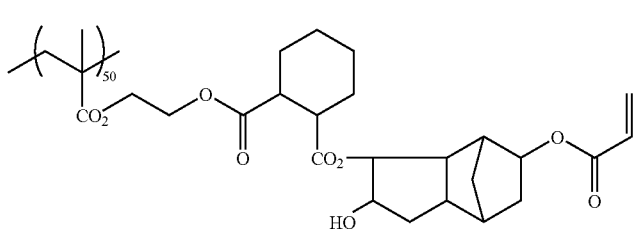
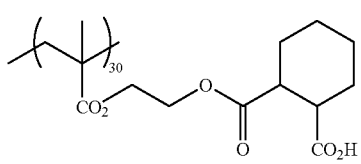
Mw 120,000
(P-15)
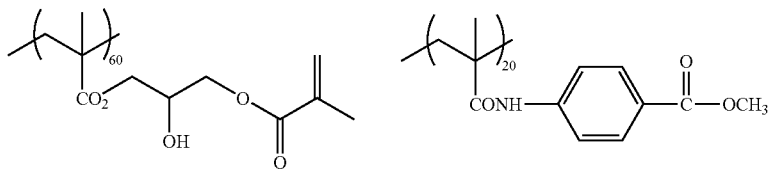

-continued
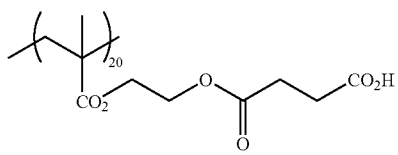
Mw 40,000
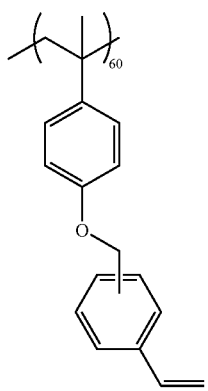
Mw 50,000
(P-16)
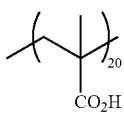
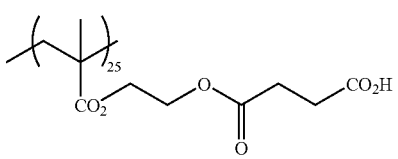
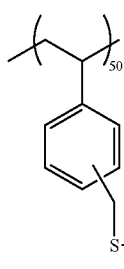
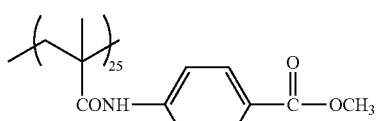
Mw 50,000
(P-17)
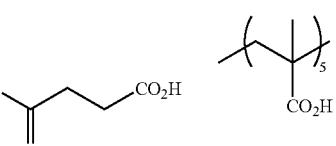
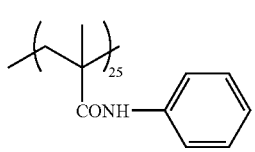
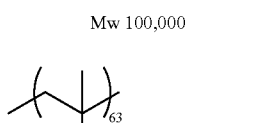
Mw 100,000
(P-18)
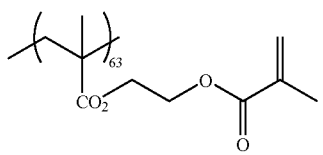
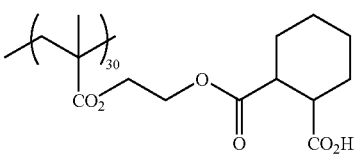
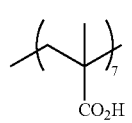
Mw 70,000
(P-19)

-continued
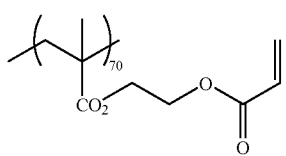 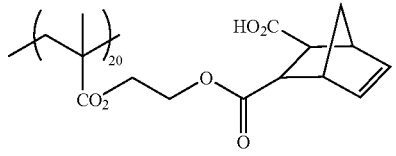
(P-20)
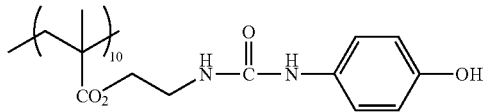
Mw 80,000
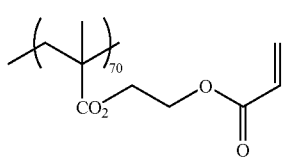 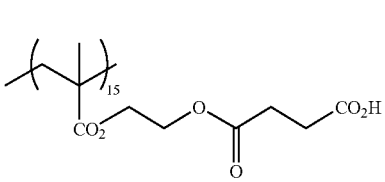 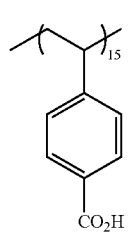
(P-21)
Mw 120,000
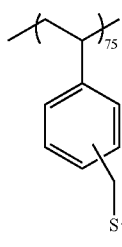 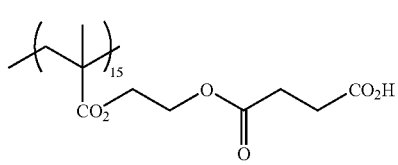
(P-22)
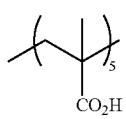 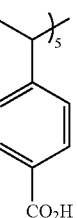
Mw 60,000
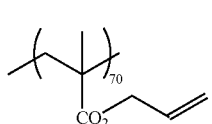 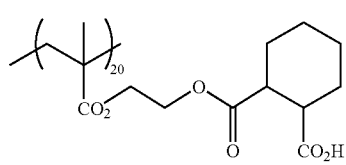 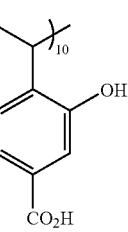
(P-23)
Mw 110,000
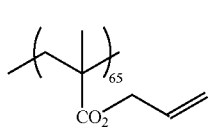 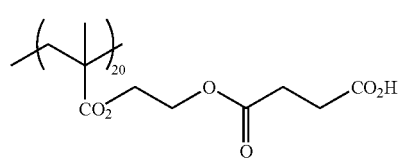
(P-24)

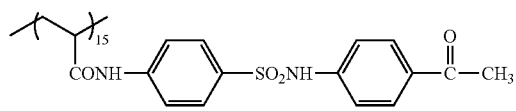
Mw 90,000
(P-25)
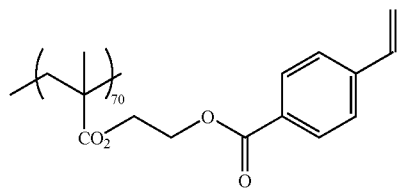
Mw 70,000
(P-26)
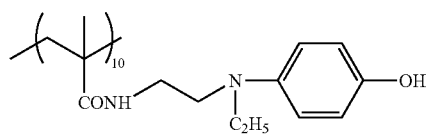
Mw 150,000
(P-27)
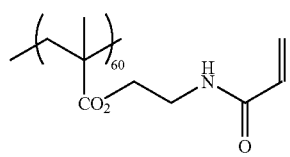 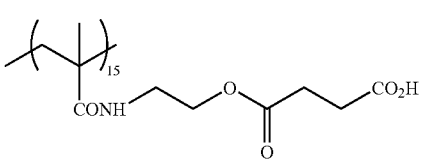 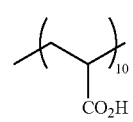 
Mw 60,000
(P-28)
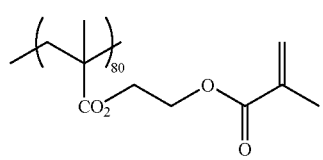 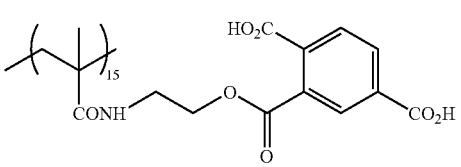 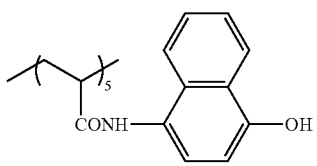
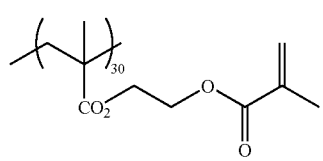 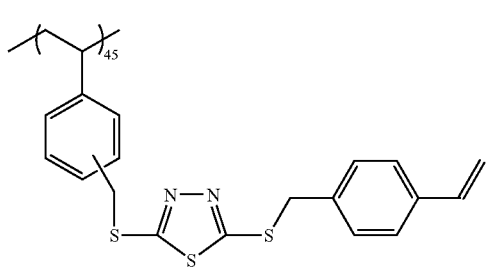
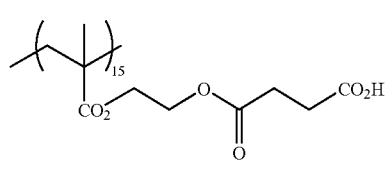 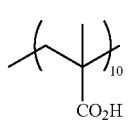
Mw 50,000

-continued
(P-29)
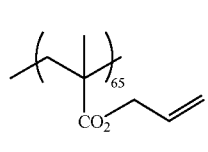 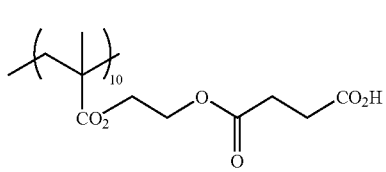 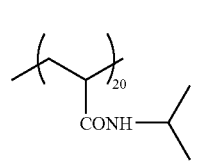 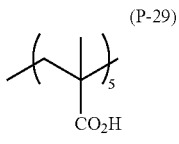
Mw 110,000
(P-30)
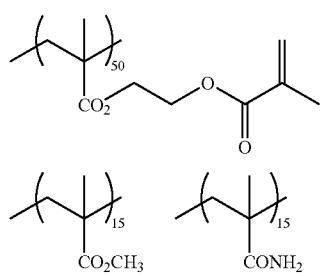 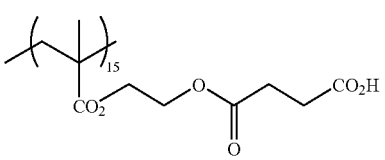
Mw 140,000
(P-31)
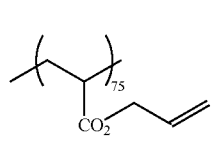 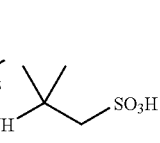 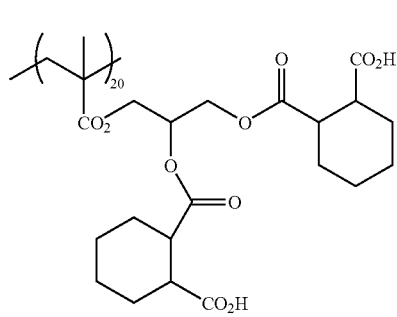
Mw 90,000
(P-32)
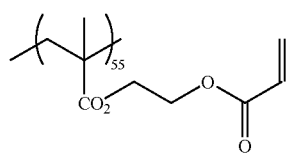 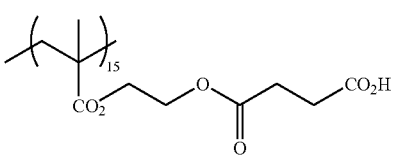
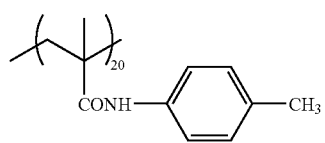 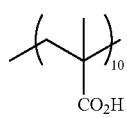
Mw 100,000
(CP-1)
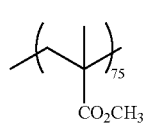 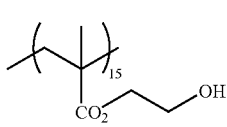 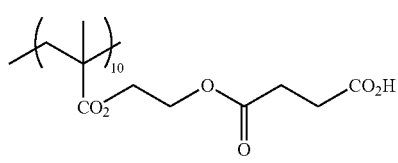
Mw 100,000
(CP-2)
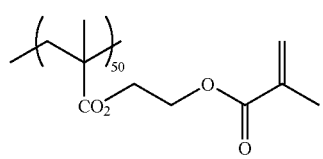 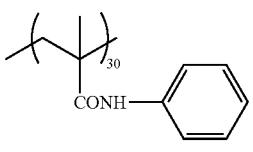 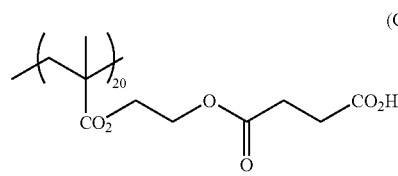
Mw 80,000

-continued
(CP-3)
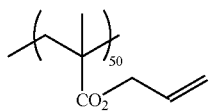 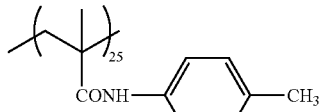 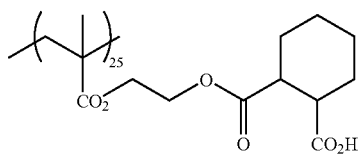
Mw 70,000
(CP-4)
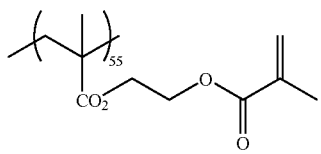 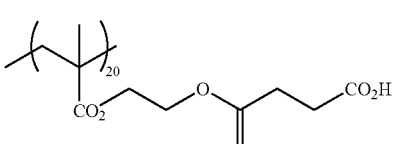 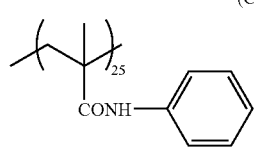
Mw 100,000
(CP-5)
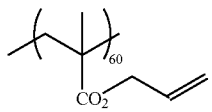 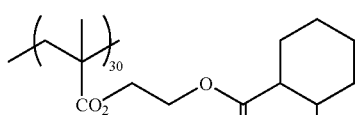 
Mw 100,000
(DPHA)
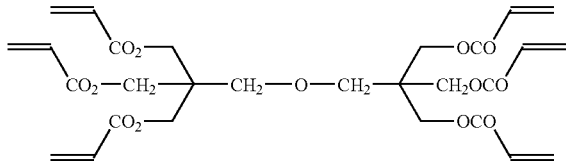
(U-1)
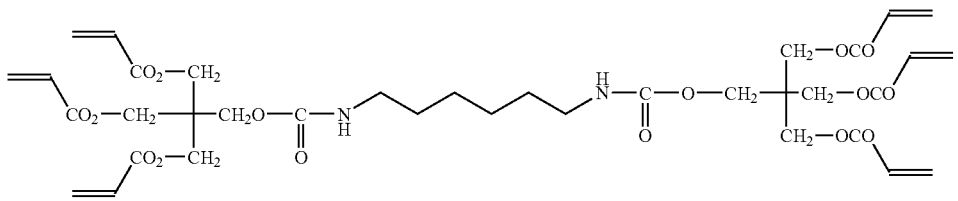
(U-2)
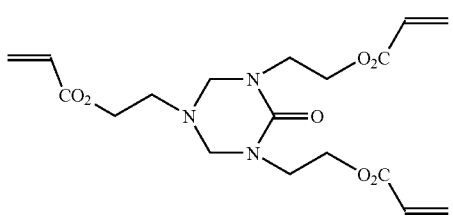
(A-1)
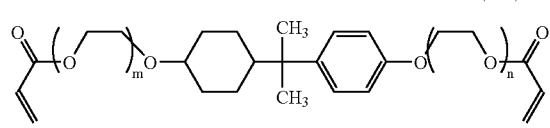
$m + n = 4$
(A-2)
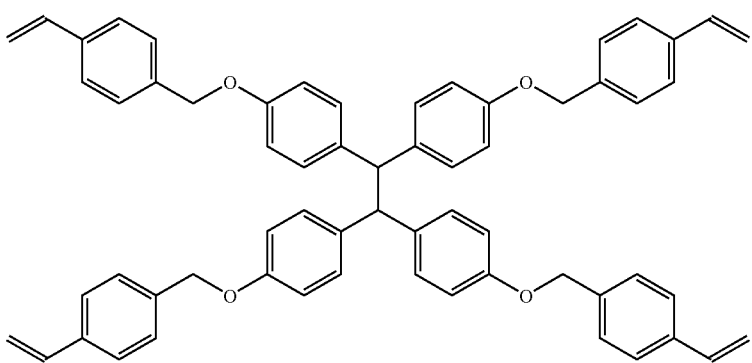

-continued
(D-1)
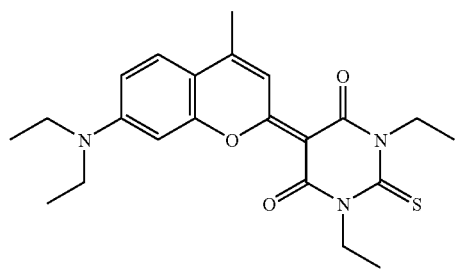
(D-2)
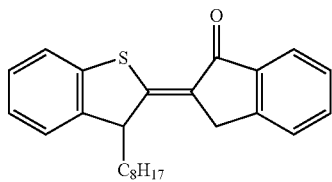
(D-3)
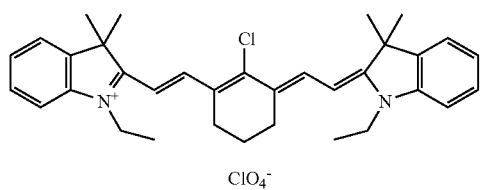
ClO$_4^-$
(D-4)
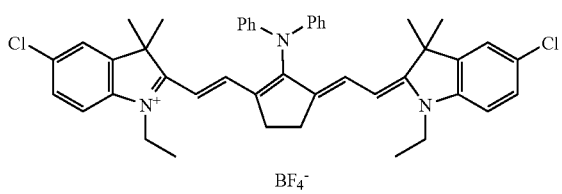
BF$_4^-$
(C-1)
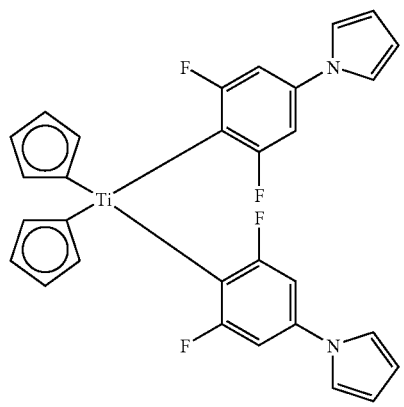
(C-2)
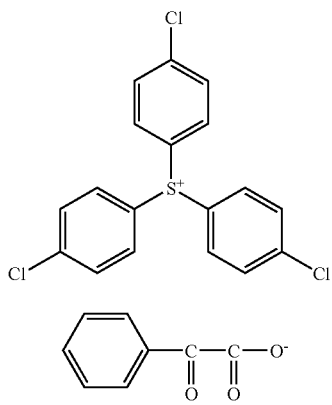
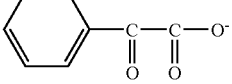
(C-3)
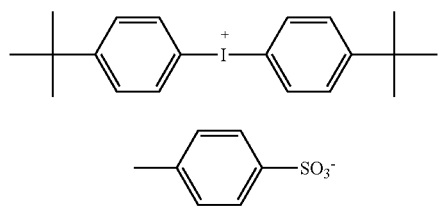
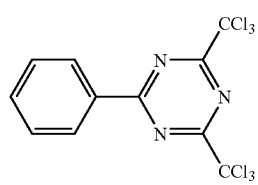
(C-4)
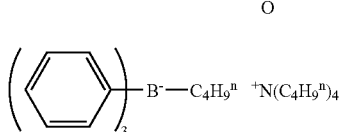
(C-5)
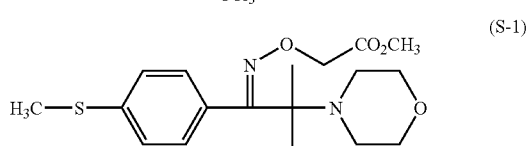
(C-6)
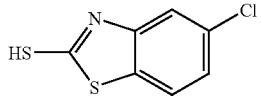
(S-1)
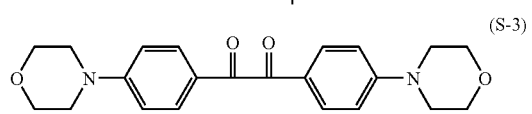
(S-2)
(S-3)
(S-4)
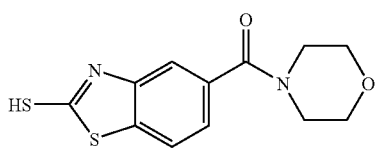

(Formation of Protective Layer)

After the recording layer was formed thereon in the manner as above, a part of the samples (as in Tables 1 to 8) were coated with an aqueous solution of 3 mas. % polyvinyl alcohol (degree of saponification 98 mol %, degree of polymerization 500) so that the dry coating amount could be 2 g/m², and dried at 100° C. for 2 hours to form a protective layer thereon.

The process gave lithographic printing plate precursors of Examples and Comparative Examples.

(Exposure)

Using different light sources corresponding to the wavelength for their exposure, the lithographic printing plate precursors fabricated as above were exposed to light. For example, any of 400 nm semiconductor laser, 532 nm FD-YAG laser and 830 nm semiconductor laser was used, and they were exposed to light in air.

(Development)

After thus exposed, the samples were developed with an automatic processor, Fuji Photo Film's Stablon 900NP. The developer was any of the following developer 1 or 2. The developer bath temperature was 30° C., and the development time was 12 seconds.

The above process gave lithographic printing plates.

<Developer 1>

This is an aqueous alkali solution comprising the following components.

| | |
|---|---|
| Potassium hydroxide | 4 g |
| Potassium hydrogencarbonate | 1 g |
| Potassium carbonate | 2.5 g |
| Sodium sulfite | 1 g |
| Polyethylene glycol mononaphthyl ether | 145 g |
| Sodium dibutylnaphthalenesulfonate | 55 g |
| Tetrasodium ethylenediaminetetraacetate | 8 g |
| Water | 750 g |

<Developer 2>

Fuji Photo Film's DP-4 was diluted to ⅛ with water.

(Printing Durability and Staining Resistance)

Thus obtained, the lithographic printing plate was set in a Lithrone printer (by Komori Corp.), and the printer was driven to give prints. Every print was visually checked, and the number of good prints with good ink density was counted. This indicates the printing durability and the staining resistance of the printing plate tested. The result is given in Tables 1 to 8.

(Development Sediment)

The lithographic printing plate precursors (area, 0.88 m²) were exposed to have a non-image area of 0.75 m². Using a developing machine, Fuji Photo Film's LP-1310 equipped with a protective layer-removing device, the exposed plate precursors were developed with a developer having a pH of 11.90 (30° C.). 1200 samples were continuously developed. The developer used is as in Tables 1 to 8.

After the development, the used developer was visually checked for development sediment therein. "O" indicates that the development gave no sediment; and "x" indicates that the development gave some sediment. The result is given in Tables 1 to 8.

Tables 1 to 8 confirm that the lithographic printing plate precursors of Examples 1 to 50 in which the polymerizable composition of the invention was used in the recording layer had good printing durability and good staining resistance, and they did not produce development sediment while continuously processed. On the other hand, however, the lithographic printing plate precursors of Comparative Examples where alkali-soluble polymers not falling within the scope of the invention were used produced development sediment while processed.

The invention provides a polymerizable composition favorable for image-recording layers of negative lithographic printing plate precursors. It ensures good printing durability in the image area of the printing plates produced, not producing development sediment in developer where the plate precursors are processed. In addition, the invention also provides an alkali-soluble polymer favorable for the polymerizable composition.

The present invention is not limited to the specific above-described embodiments. It is contemplated that numerous modifications may be made to the present invention without departing from the spirit and scope of the invention as defined in the following claims.

This application is based on Japanese Patent application JP 2003-202919, filed Jul. 29, 2003, the entire content of which is hereby incorporated by reference.

What is claimed is:

1. A polymerizable composition comprising:
(A) a polymer, which contains a structural unit having a carboxyl group represented by the following formula (1) at a side chain of the structural unit; and
which comprises a functional group represented by the following formula (2) at a side chain of the polymer, the functional group being capable of changing to an acid group through hydrolysis with alkali:

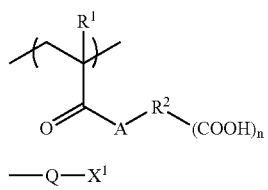

wherein in formula (1), $R^1$ represents a hydrogen atom or a methyl group; $R^2$ represents a (n+1)-valent organic linking group containing an ester group represented by —O(C=O)—; A represents an oxygen atom or —NR³—; $R^3$ represents a hydrogen atom, or a monovalent hydrocarbon group having from 1 to 10 carbon atoms; and n indicates an integer of from 1 to 5; and in formula (2), Q represents a linking group that links $X^1$ to a main chain of the polymer; $X^1$ represents a protective group hydrolyzable with an alkali aQueous solution having a pH of 10 or more; and when the functional group represented by the formula (2) gives -Q-OH after hydrolysis, the -Q-OH is an acid group having a pKa of 10 or less;
(B) a compound having an ethylenic unsaturated bond; and
(C) a compound capable of generating a radical by a light or heat.

2. The polymerizable composition according to claim 1, which further comprises (D) a sensitizing dye.

3. The polymerizable composition according to claim 1, wherein the compound (C) capable of generating a radical by a light or heat is a compound selected from the group consisting of (a) an aromatic ketone, (b) an onium salt compound, (c) an organic peroxide, (d) a thio compound, (e) a hexaarylbiimidazole compound, (t) a ketoxime ester compound, (g) a borate compound, (h) an azinium compound, (i) a metallocene compound, (j) an active ester compound, and (k) a compound having a carbon-halogen bond.

4. A negative image-recording material, which has an image recording layer comprising the polymerizable composition according to claim 1.

5. The negative image-recording material according to claim 4, wherein the image recording layer has a protective layer comprising a water-soluble polymer compound on the image-recording material.

6. A process for image forming, comprising:
performing an imagewise exposure by using an infrared beam having a wavelength of 300 to 1200 nm on the image-recording material according to claim 4; and
performing a developing treatment with an aqueous alkali solution.

7. A polymerizable composition comprising:
(A) a polymer, which contains a structural unit having a carboxyl group represented by the following formula (1) at a side chain of the structural unit, and which comprises an acid group represented by the following formula (4) having an acid dissociation constant (pKa) of from 0 to 11 at a side chain of the polymer:

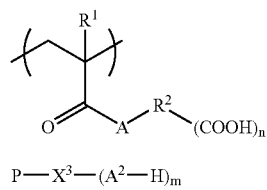

(1)

$$P\text{—}X^3\text{—}(A^2\text{—}H)_m \quad (4)$$

wherein in formula (1), $R^1$ represents a hydrogen atom or a methyl group; $R^2$ represents a (n+1)-valent organic linking group containing an ester group represented by —O(C=O)—; A represents an oxygen atom or —$NR^3$—; $R^3$ represents a hydrogen atom, or a monovalent hydrocarbon group having from 1 to 10 carbon atoms; and n indicates an integer of from 1 to 5; and in formula (4), $X^3$ represents a single bond that directly links to a main chain of the polymer, or a linking group selected from the group consisting of a carboxylic acid ester group (—COO—), an amido group (—CONH—), a hydrocarbon group and an ether group (—O— or —S—); $A^2$-H represents a partial structure that functions as an acid group having an acid dissociation constant (pKa) of from 0 to 11; and m indicates an integer of from 1 to 5, wherein the acid group is a phenol group, a 2-methoxyphenol group, a 2-chiorophenol group, a methyl 2-hydroxybenzoate group, a 4-methyiphenol group, a 1,3-benzenediol group, a 1-naphthol group, a 1,2-benzenediol group or an ethylacetylacetate group;

(B) a compound having an ethylenic unsaturated bond; and (C) a compound capable of generating a radical by a light or heat.

8. The polymerizable composition according to claim 7, which further comprises (D) a sensitizing dye.

9. The polymerizable composition according to claim 7, wherein the compound (C) capable of generating a radical by a light or a heat is a compound selected from the group consisting of (a) an aromatic ketone, (b) an onium salt compound, (c) an organic peroxide, (d) a thio compound, (e) a hexaarylbiimidazole compound, (f) a ketoxime ester compound, (g) a borate compound, (h) an azinium compound, (i) a metallocene compound, (j) an active ester compound, and (k) a compound having a carbon-halogen bond.

10. A negative image-recording material, which has an image recording layer comprising the polymerizable composition according to claim 7.

11. The negative image-recording material according to claim 10, wherein the image recording layer has a protective layer comprising a water-soluble polymer compound on the image-recording material.

12. A process for image forming, comprising:
performing an imagewise exposure by using an infrared beam having a wavelength of 300 to 1200 nm on the image-recording material according to claim 10; and
performing a developing treatment with an aqueous alkali solution.

13. The polymerizable composition according to claim 1, wherein no deposition is formed, when the polymer is dissolved in an alkali aqueous solution having a pH of 10 or more and kept at 25° C. for 60 days.

14. The polymerizable composition according to claim 7, wherein no deposition is formed, when the polymer is dissolved in an alkali aqueous solution having a pH of 10 or more and kept at 25° C. for 60 days.

* * * * *